US012315866B2

(12) United States Patent
Song et al.

(10) Patent No.: US 12,315,866 B2
(45) Date of Patent: May 27, 2025

(54) DISPLAY DEVICE

(71) Applicant: Samsung Display Co., LTD., Yongin-si (KR)

(72) Inventors: Myeong Hun Song, Pyeongtaek-si (KR); Jong Chan Lee, Suwon-si (KR); Hyun Kim, Seoul (KR); Jeong Kook Wang, Hwaseong-si (KR); In Woo Kim, Asan-si (KR); Seung Jin Chu, Cheonan-si (KR); Jeong Su Park, Asan-si (KR); Yong Tae Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 339 days.

(21) Appl. No.: 17/749,964

(22) Filed: May 20, 2022

(65) Prior Publication Data

US 2023/0032275 A1    Feb. 2, 2023

(30) Foreign Application Priority Data

Jul. 27, 2021    (KR) .................. 10-2021-0098283

(51) Int. Cl.
*H01L 33/38*    (2010.01)
*H01L 27/15*    (2006.01)
*H01L 33/62*    (2010.01)

(52) U.S. Cl.
CPC .......... *H01L 33/387* (2013.01); *H01L 27/156* (2013.01); *H01L 33/62* (2013.01)

(58) Field of Classification Search
CPC ..... H01L 33/387; H01L 27/156; H01L 33/62; H01L 2933/0066; H01L 25/0753; H01L 27/124; H01L 27/1248; H01L 33/486

(Continued)

(56) References Cited

U.S. PATENT DOCUMENTS 9,054,060 B2 *   6/2015   Kang ................. H10K 59/131
9,997,576 B2 *   6/2018   Jinbo ................. H10K 59/124
(Continued)

FOREIGN PATENT DOCUMENTS

JP            5730062 B2     6/2015
KR   10-2019-0029831 A     3/2019
(Continued)

OTHER PUBLICATIONS

Korean Notice of Allowance issued in corresponding KR Application No. 10-2021-0098283, dated Jan. 24, 2025, 3 pages.

*Primary Examiner* — Vu A Vu
(74) *Attorney, Agent, or Firm* — Womble Bond Dickinson (US) LLP

(57)    ABSTRACT

A display device includes a substrate, first and second bridge electrodes on the substrate and spaced apart from each other, a first electrode on the first bridge electrode, a second electrode on the second bridge electrode and spaced apart from the first electrode, a first insulating layer on the first electrode and the second electrode, a light emitting element on the first insulating layer, and on the first electrode and the second electrode, a first connection electrode on the first electrode, and contacting the light emitting element and the first bridge electrode, and a second connection electrode on the second electrode, and contacting the light emitting element and the second bridge electrode, wherein the first electrode directly contacts the first bridge electrode, and is separated from the first connection electrode, and wherein the second electrode directly contacts the second bridge electrode, and is separated from the second connection electrode.

21 Claims, 37 Drawing Sheets

(58) Field of Classification Search
USPC .......................................................... 257/79
See application file for complete search history.

(56) References Cited

U.S. PATENT DOCUMENTS

| | | | | |
|---|---|---|---|---|
| 10,319,792 B2* | 6/2019 | Jo | .......................... | G06F 3/0443 |
| 10,886,339 B2* | 1/2021 | Won | ....................... | G06F 3/0412 |
| 10,928,964 B2* | 2/2021 | Kim | ....................... | G06F 3/0412 |
| 11,314,349 B2* | 4/2022 | Lee | ....................... | G09G 3/3233 |
| 11,367,823 B2 | 6/2022 | Kim et al. | | |
| 11,508,796 B2 | 11/2022 | Park et al. | | |
| 11,581,386 B2* | 2/2023 | Shu | ........................ | H05K 1/189 |
| 11,811,012 B2 | 11/2023 | Kim et al. | | |
| 12,062,739 B2 | 8/2024 | Kim et al. | | |
| 2013/0112976 A1* | 5/2013 | Kim | ...................... | H01L 27/124 |
| | | | | 257/66 |
| 2018/0182817 A1 | 6/2018 | Jo et al. | | |
| 2018/0358339 A1 | 12/2018 | Iguchi | | |
| 2020/0067017 A1* | 2/2020 | Seo | ...................... | H10K 50/844 |
| 2022/0115470 A1 | 4/2022 | Kim et al. | | |
| 2022/0406759 A1 | 12/2022 | Kim | | |
| 2024/0063359 A1 | 2/2024 | Kim et al. | | |
| 2024/0128418 A1 | 4/2024 | Tae et al. | | |
| 2024/0363806 A1 | 10/2024 | Kim et al. | | |

FOREIGN PATENT DOCUMENTS

| | | |
|---|---|---|
| KR | 10-2019-0121894 A | 10/2019 |
| KR | 10-2019-0124359 A | 11/2019 |
| KR | 10-2020-0011629 A | 2/2020 |
| KR | 10-2020-0034896 A | 4/2020 |
| KR | 10-2184538 B1 | 11/2020 |
| KR | 10-2020-0140209 | 12/2020 |
| KR | 10-2021-0009486 A | 1/2021 |
| KR | 10-2021-0010733 | 1/2021 |
| KR | 10-2021-0045572 A | 4/2021 |
| KR | 10-2021-0055829 A | 5/2021 |
| KR | 10-2021-0057891 | 5/2021 |
| KR | 10-2021-0059075 | 5/2021 |

* cited by examiner

RME: RME1, RME2
BE_1: BE1_1, BE2_1

DISPLAY DEVICE

CROSS-REFERENCE TO RELATED APPLICATION

This application claims priority to, and the benefit of, Korean Patent Application No. 10-2021-0098283 filed on Jul. 27, 2021 in the Korean Intellectual Property Office, the contents of which in its entirety are herein incorporated by reference.

BACKGROUND

1. Field

The disclosure relates to a display device.

2. Description of the Related Art

Display devices are becoming increasingly important with the development of multimedia. Accordingly, various types of display devices such as organic light emitting displays (OLEDs) and liquid crystal displays (LCDs) are being used.

As a device for displaying an image of a display device, there is a self-luminous display device including a light emitting element. The self-luminous display device may be an organic light emitting display using an organic material as a light emitting material of a light emitting element, or an inorganic light emitting display using an inorganic material as a light emitting material.

SUMMARY

Aspects of the disclosure provide a display device that includes a bridge electrode electrically connecting different electrodes to reduce contact resistance between the electrodes.

However, aspects of the disclosure are not restricted to the one set forth herein. The above and other aspects of the disclosure will become more apparent to one of ordinary skill in the art to which the disclosure pertains by referencing the detailed description of the disclosure given below.

According to some embodiments of the disclosure, a display device includes a substrate, a first bridge electrode and a second bridge electrode on the substrate and spaced apart from each other, a first electrode on the first bridge electrode, a second electrode on the second bridge electrode and spaced apart from the first electrode, a first insulating layer on the first electrode and the second electrode, a light emitting element on the first insulating layer, and on the first electrode and the second electrode, a first connection electrode on the first electrode, and contacting the light emitting element and the first bridge electrode, and a second connection electrode on the second electrode, and contacting the light emitting element and the second bridge electrode, wherein the first electrode directly contacts the first bridge electrode, and is separated from the first connection electrode, and wherein the second electrode directly contacts the second bridge electrode, and is separated from the second connection electrode.

The first electrode may define a first electrode hole exposing an upper surface of the first bridge electrode, wherein the second electrode defines a second electrode hole exposing an upper surface of the second bridge electrode, and wherein the first insulating layer defines a first opening in the first electrode hole to expose the upper surface of the first bridge electrode, and a second opening in the second electrode hole to expose the upper surface of the second bridge electrode.

The display device may further include a second insulating layer on the first insulating layer and the light emitting element and exposing both ends of the light emitting element, and a third insulating layer on the second insulating layer and the second connection electrode, wherein the first connection electrode is on the third insulating layer.

The first connection electrode may directly contact the first bridge electrode exposed through a first contact part within the first opening in a plan view and penetrating the second insulating layer and the third insulating layer, wherein the second connection electrode directly contacts the second bridge electrode exposed through a second contact part in the second opening and penetrating the second insulating layer.

Widths of the first bridge electrode and the second bridge electrode may be greater than widths of the first electrode hole and the second electrode hole, respectively.

The display device may further include a via layer between the substrate and the first and second electrodes.

The display device may further include a voltage line and a conductive pattern on a same layer as the first bridge electrode and the second bridge electrode, wherein the first bridge electrode and the second bridge electrode are between the via layer and the substrate.

The via layer may define a first electrode contact hole exposing the upper surface of the first bridge electrode, and a second electrode contact hole exposing the upper surface of the second bridge electrode, wherein the first electrode hole is in the first electrode contact hole, and wherein the second electrode hole is in the second electrode contact hole.

The first insulating layer may cover a part of the first electrode in the first electrode contact hole, and a part of the second electrode in the second electrode contact hole.

The via layer may define a first contact hole exposing an upper surface of the conductive pattern, and a second contact hole exposing an upper surface of the voltage line, wherein the first electrode directly contacts the conductive pattern through the first contact hole, and wherein the second electrode directly contacts the voltage line through the second contact hole.

The first bridge electrode and the second bridge electrode may be directly on the via layer, wherein the first electrode contacts the first bridge electrode, and wherein the second electrode contacts the second bridge electrode.

The display device may further include a conductive pattern and a voltage line between the substrate and the via layer, wherein the first electrode directly contacts the conductive pattern through a first contact hole exposing an upper surface of the conductive pattern, and wherein the second electrode directly contacts the voltage line through a second contact hole exposing an upper surface of the voltage line.

The light emitting element may be spaced apart from the first bridge electrode and the second bridge electrode in a plan view.

The first electrode and the second electrode may include a main electrode layer including aluminum (Al), and an electrode upper layer on the main electrode layer and including aluminum oxide ($AlO_x$).

According to some embodiments of the disclosure, a display device includes an emission area, a sub-area at a side of the emission area in a first direction, a first electrode and a second electrode extending in the first direction, spaced apart from each other in a second direction, and in the emission area and the sub-area, a first bridge electrode in the sub-area and partially overlapping the first electrode, a second bridge electrode in the sub-area and partially overlapping the second electrode, a first insulating layer on the first electrode and the second electrode in the emission area and the sub-area, light emitting elements on the first electrode and the second electrode in the emission area, a first connection electrode on the first electrode, extending in the first direction, and directly contacting the light emitting elements and the first bridge electrode, and a second connection electrode on the second electrode, extending in the first direction, and directly contacting the light emitting elements and the second bridge electrode, wherein the first electrode directly contacts the first bridge electrode and is spaced apart from the first connection electrode, and wherein the second electrode directly contacts the second bridge electrode and is spaced apart from the second connection electrode.

The first electrode may define a first electrode hole exposing an upper surface of the first bridge electrode, wherein the second electrode defines a second electrode hole exposing an upper surface of the second bridge electrode, and wherein the first insulating layer defines openings respectively within the first electrode hole and the second electrode hole in a plan view.

The display device may further include a second insulating layer on the first insulating layer and the light emitting elements and exposing both ends of each of the light emitting elements, and a third insulating layer on the second insulating layer and the second connection electrode, wherein the second insulating layer and the third insulating layer define a first contact part exposing the upper surface of the first bridge electrode, and wherein the second insulating layer defines a second contact part exposing the upper surface of the second bridge electrode.

The first connection electrode may contact the first bridge electrode through the first contact part, wherein the second connection electrode contacts the second bridge electrode through the second contact part.

The first contact part may be in the first electrode hole, wherein the second contact part is in the second electrode hole.

The display device may further include a bank layer surrounding the emission area and the sub-area, wherein a first contact hole is in an area where the first electrode and the bank layer overlap, and wherein a second contact hole is in an area where the second electrode and the bank layer overlap.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
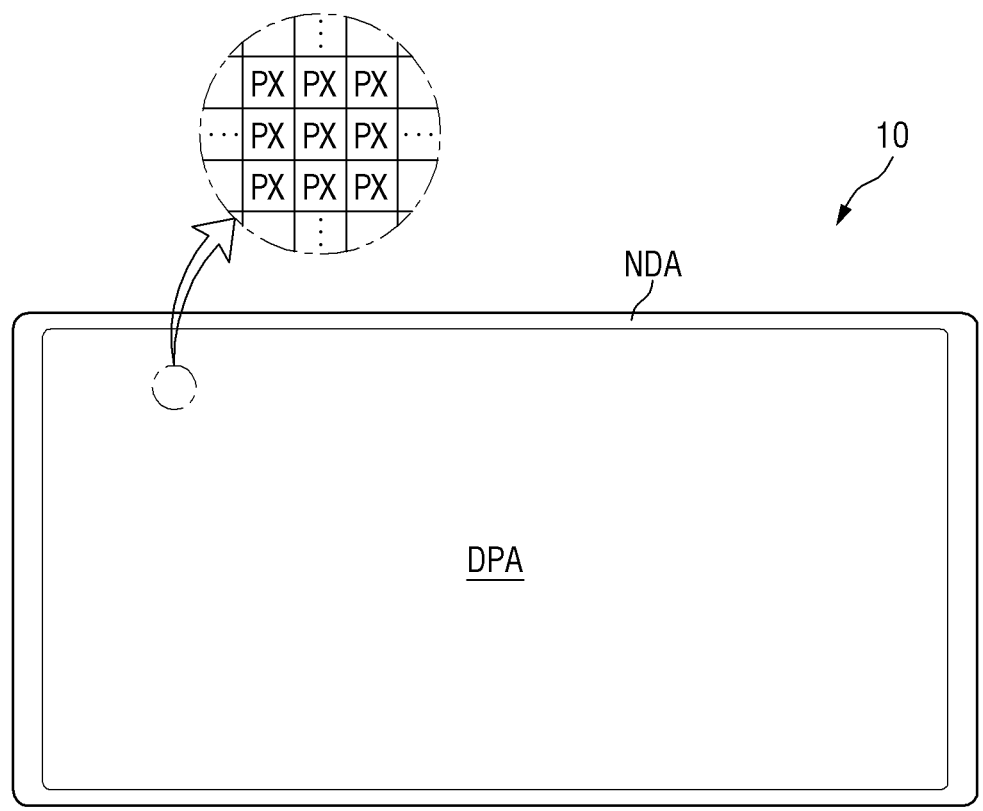
FIG. 1 is a schematic plan view of a display device according to some embodiments.
Figure 1:
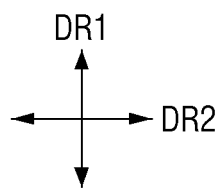

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view of a display device 10 according to some embodiments.

Referring to FIG. 1, the display device 10 displays moving images or still images. The display device 10 may refer to any electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The display device 10 includes a display panel that provides a display screen. Examples of the display panel may include inorganic light emitting diode display panels, organic light emitting display panels, quantum dot light emitting display panels, plasma display panels, and field emission display panels. A case where an inorganic light emitting diode display panel is applied as an example of the display panel will be described below, but the disclosure is not limited to this case, and other display panels can also be applied as long as the same technical spirit is applicable.

The shape of the display device 10 can be variously modified. For example, the display device 10 may have various shapes, such as a horizontally long rectangle, a vertically long rectangle, a square, a quadrangle with rounded corners (vertices), other polygons, and a circle. The shape of a display area DPA of the display device 10 may also be similar to the overall shape of the display device 10. In FIG. 1, the display device 10 shaped like a rectangle that is long in a second direction DR2 is illustrated.

The display device 10 may include the display area DPA and a non-display area NDA. The display area DPA may be an area where a screen can be displayed, and the non-display area NDA may be an area where no screen is displayed. The display area DPA may also be referred to as an active area, and the non-display area NDA may also be referred to as an inactive area. The display area DPA may generally occupy the center of the display device 10.

The display area DPA may include a plurality of pixels PX. The pixels PX may be arranged in a matrix direction. Each of the pixels PX may be rectangular or square in plan view. However, the disclosure is not limited thereto, and each of the pixels PX may also have a rhombus shape having each side inclined with respect to a direction. The pixels PX may be arranged in a stripe type or a PENTILE™ type (e.g., a PENTILE™ matrix structure, a PENTILE™ structure, or an RGBG structure). PENTILE™ is a registered trademark of Samsung Display Co., Ltd., Republic of Korea. In addition, each of the pixels PX may display a corresponding color by including one or more light emitting elements which emit light of a corresponding wavelength band.

The non-display area NDA may be located around the display area DPA. The non-display area NDA may entirely or partially surround the display area DPA. The display area DPA may be rectangular, and the non-display area NDA may be located adjacent to four sides of the display area DPA. The non-display area NDA may form a bezel of the display device 10. In each non-display area NDA, wirings or circuit drivers included in the display device 10 may be located, or external devices may be mounted.

Figure 2:
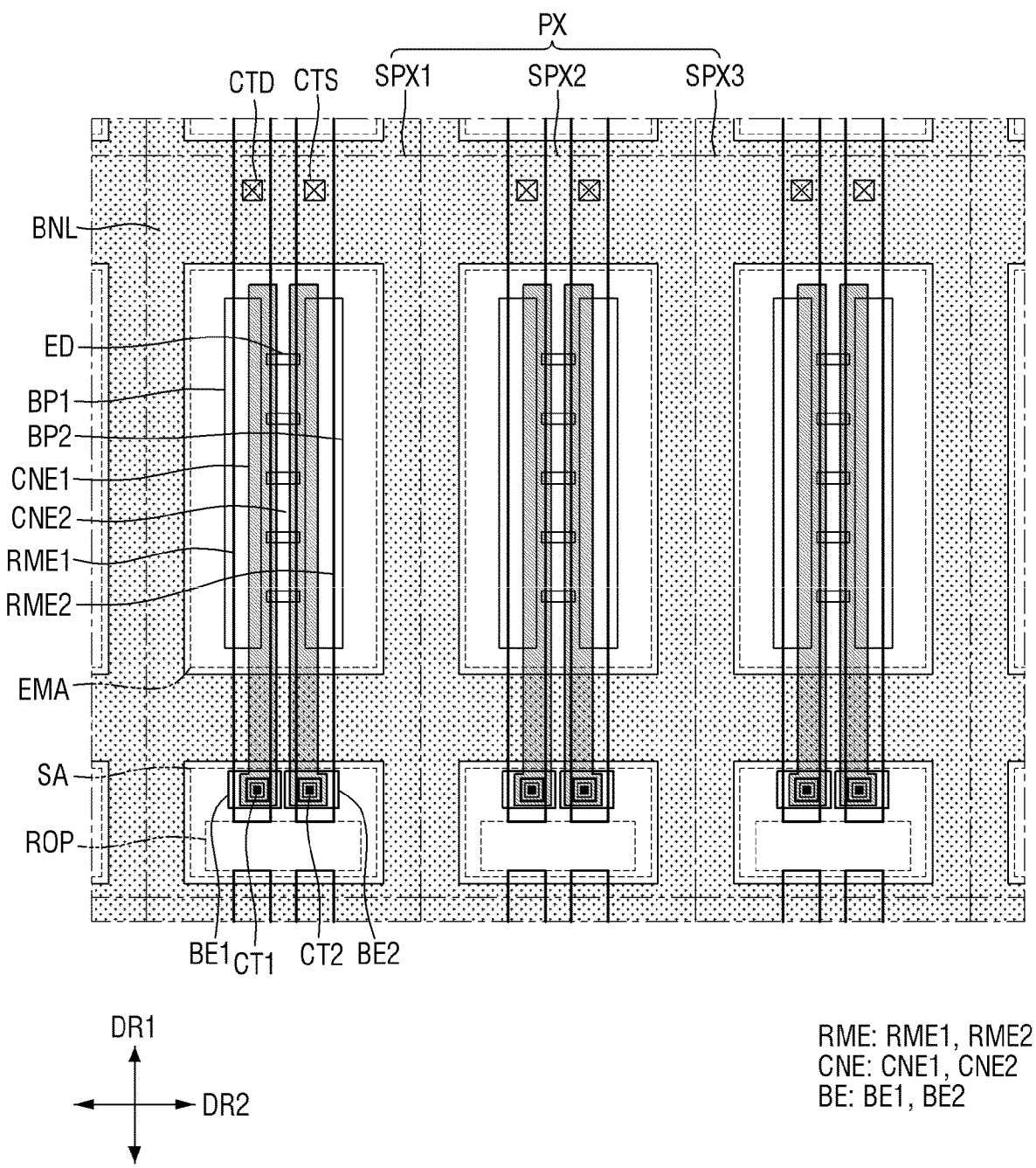
FIG. 2 is a plan view of a pixel of the display device according to the embodiment.

FIG. 2 is a plan view of a pixel PX of the display device 10 according to some embodiments.

Referring to FIG. 2, each of the pixels PX of the display device 10 may include a plurality of subpixels SPXn (e.g., where n is 1 to 3). For example, one pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be blue, the second color may be green, and the third color may be red. However, the disclosure is not limited thereto, and the subpixels SPXn may also emit light of the same color. In some embodiments, the subpixels SPXn may emit blue light. In addition, although one pixel PX includes three subpixels SPXn in the drawing, the disclosure is not limited thereto, and the pixel PX may also include a greater number of subpixels SPXn.

Each subpixel SPXn of the display device 10 may include an emission area EMA and a non-emission area. The emission area EMA may be an area in which light emitting elements ED are located to emit light of a corresponding wavelength band. The non-emission area may be an area in which the light emitting elements ED are not located and from which no light is output because light emitted from the light emitting elements ED does not reach this area.

The emission area may include an area in which the light emitting elements ED are located, and an area that is adjacent to the light emitting elements ED, from which light emitted from the light emitting elements ED is output. However, the disclosure is not limited thereto, and the emission area EMA may also include an area from which light emitted from the light emitting elements ED is output after being reflected or refracted by other members. A plurality of light emitting elements ED may be located in each subpixel SPXn, and an area where the light emitting elements ED are located, along with an area adjacent to this area, may form the emission area.

Although the respective emission areas EMA of the subpixels SPXn have substantially the same area in the drawing, the disclosure is not limited thereto. In some embodiments, the respective emission areas EMA of the subpixels SPXn may have different size according to the color or wavelength band of light emitted from the light emitting elements ED located in the subpixel SPXn.

In addition, each subpixel SPXn may further include a sub-area SA located in the non-emission area. The sub-area SA may be located on a side of the emission area EMA in a first direction DR1, and may be located between the emission areas EMA of subpixels SPXn neighboring in the first direction DR1. For example, a plurality of emission areas EMA and a plurality of sub-areas SA each may be repeatedly arranged in the second direction DR2, but may be alternately arranged in the first direction DR1. However, the disclosure is not limited thereto, and the arrangement of the emission areas EMA and the sub-areas SA in a plurality of pixels PX may also be different from that in FIG. 2.

A bank layer BNL may be located between the sub-areas SA and the emission areas EMA, and a distance between them may vary according to a width of the bank layer BNL. Light may not exit from the sub-area SA because the light emitting elements ED are not located in the sub-area SA, but parts of electrodes RME located in each subpixel SPXn may be located in the sub-area SA. The electrodes RME located in different subpixels SPXn may be separated from each other in a separation part ROP of the sub-area SA.

The bank layer BNL may include parts respectively extending in the first direction DR1 and in the second direction DR2 in plan view to form a grid pattern in the entire display area DPA. The bank layer BNL may be located at the boundary of each subpixel SPXn to separate neighboring subpixels SPXn. In addition, the bank layer BNL may surround the emission area EMA and the sub-area SA located in each subpixel SPXn to separate them from each other.

Figure 3:
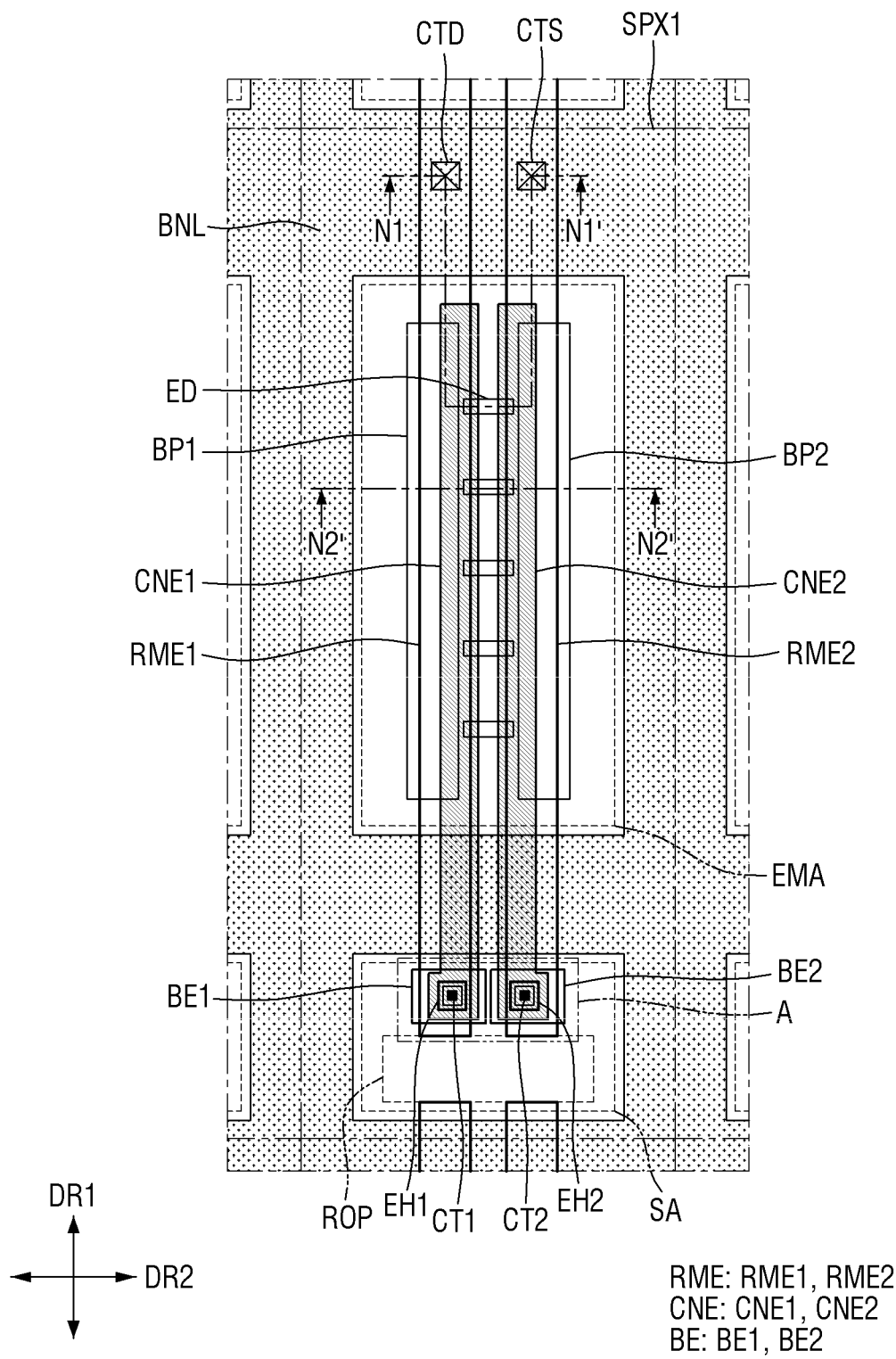
FIG. 3 is a plan view of a first subpixel of FIG. 2.
Figure 4:
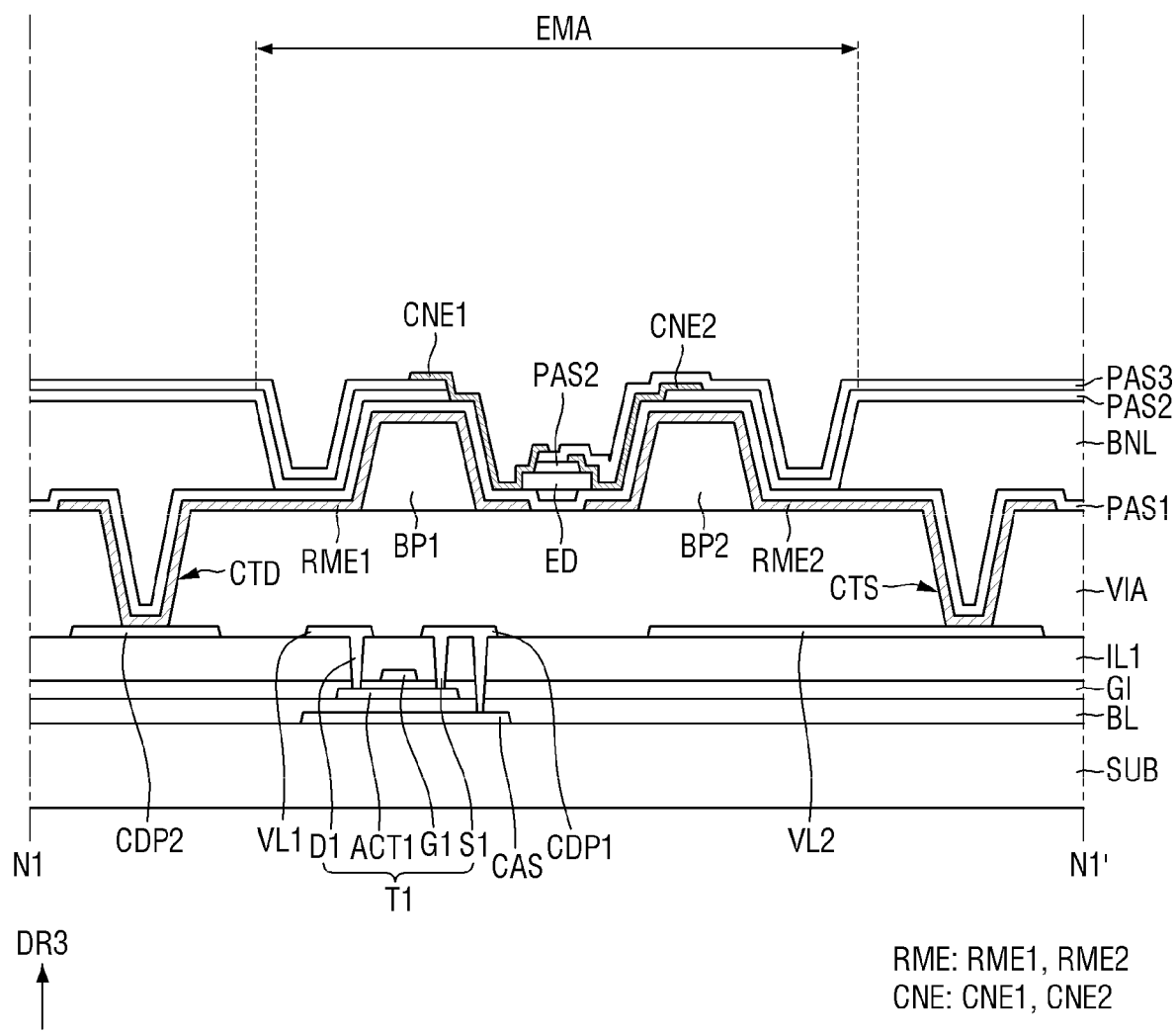
FIG. 4 is a cross-sectional view taken along the line N1-N1' of FIG. 3.
Figure 5:
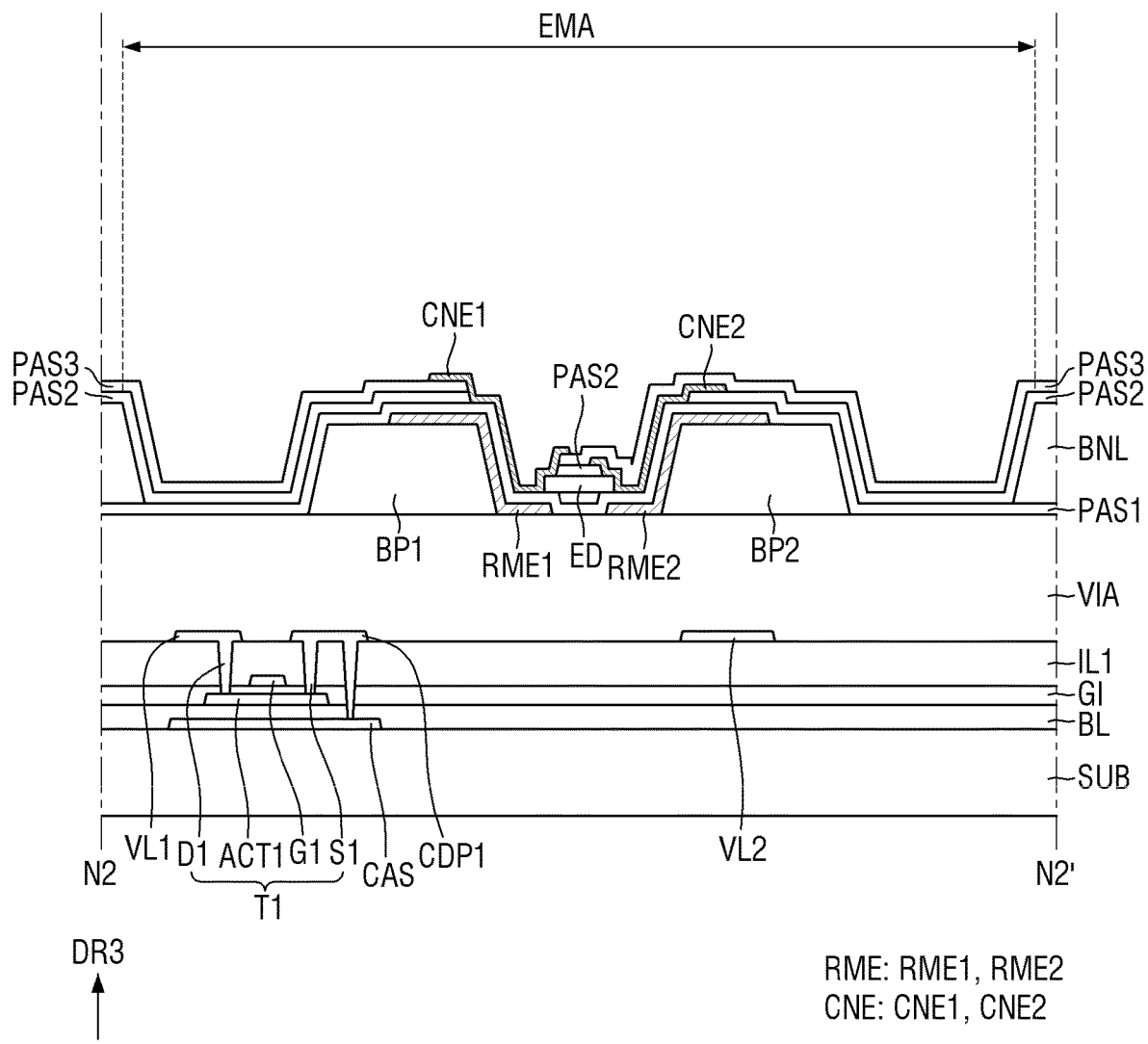
FIG. 5 is a cross-sectional view taken along the line N2-N2' of FIG. 3.

FIG. 3 is a plan view of the first subpixel SPX1 of FIG. 2. FIG. 4 is a cross-sectional view taken along the line N1-N1' of FIG. 3. FIG. 5 is a cross-sectional view taken along the line N2-N2' of FIG. 3. FIG. 4 illustrates a cross section across taken both ends of a light emitting element ED located in the emission area EMA and across contact holes CTD and CTS, and FIG. 5 illustrates a cross section taken across both ends of a light emitting element ED and across electrodes RME in the second direction DR2.

Referring to FIGS. 3 through 5 in conjunction with FIG. 2, the display device 10 may include a first substrate SUB, a semiconductor layer, and a plurality of conductive layers and a plurality of insulating layers located on the first substrate SUB. The semiconductor layer, the conductive layers, and the insulating layers may constitute a circuit layer and a display element layer of the display device 10.

For example, the first substrate SUB may be an insulating substrate. The first substrate SUB may be made of an insulating material, such as glass, quartz, or polymer resin. In addition, the first substrate SUB may be a rigid substrate, but also may be a flexible substrate that can be bent, folded, rolled, etc. The first substrate SUB may include the display area DPA, and the non-display area NDA surrounding the display area DPA. The display area DPA may include the emission area EMA and the sub-area SA, which is a part of the non-emission area.

A first conductive layer may be located on the first substrate SUB. The first conductive layer includes a bottom metal layer CAS, and the bottom metal layer CAS is overlapped by an active layer ACT1 of a first transistor T1. The bottom metal layer CAS may include a light blocking material to reduce or prevent light entering the active layer ACT1 of the first transistor T1. However, the bottom metal layer CAS may also be omitted.

A buffer layer BL may be located on the bottom metal layer CAS and the first substrate SUB. The buffer layer BL may be formed on the first substrate SUB to protect transistors of the pixels PX from moisture introduced through the first substrate SUB, which is vulnerable to moisture penetration, and may perform a surface planarization function.

The semiconductor layer is located on the buffer layer BL. The semiconductor layer may include the active layer ACT1 of the first transistor T1. The active layer ACT1 may be partially overlapped by a gate electrode G1 of a second conductive layer, which will be described later.

The semiconductor layer may include polycrystalline silicon, monocrystalline silicon, an oxide semiconductor, or the like. In some embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although one first transistor T1 is located in each subpixel SPXn of the display device 10 in the drawings, the disclosure is not limited thereto, and the display device 10 may include a greater number of transistors.

A first gate insulating layer GI is located on the semiconductor layer and the buffer layer BL. The first gate insulating layer GI may serve as a gate insulating film of the first transistor T1.

The second conductive layer is located on the first gate insulating layer GI. The second conductive layer may include the gate electrode G1 of the first transistor T1. The gate electrode G1 may overlap a channel region of the active layer ACT1 in a third direction DR3, which is a thickness direction.

A first interlayer insulating layer IL1 is located on the second conductive layer. The first interlayer insulating layer IL1 may function as an insulating film between the second conductive layer and other layers located on the second conductive layer, and may protect the second conductive layer.

A third conductive layer is located on the first interlayer insulating layer IL1. The third conductive layer may include a first voltage line VL1 and a second voltage line VL2 located in the display area DPA, and a plurality of conductive patterns CDP1 and CDP2.

A high potential voltage (or a first power supply voltage) supplied to a first electrode RME1 may be applied to the first voltage line VL1, and a low potential voltage (or a second power supply voltage) supplied to a second electrode RME2 may be applied to the second voltage line VL2. A part of the first voltage line VL1 may contact the active layer ACT1 of the first transistor T1 through a contact hole penetrating the first interlayer insulating layer IL1 and the first gate insulating layer GI. The first voltage line VL1 may serve as a first drain electrode D1 of the first transistor T1. The second voltage line VL2 may be directly connected to the second electrode RME2 to be described later.

A first conductive pattern CDP1 may contact the active layer ACT1 of the first transistor T1 through a contact hole penetrating the first interlayer insulating layer IL1 and the first gate insulating layer GI. In addition, the first conductive pattern CDP1 may contact the bottom metal layer CAS through another contact hole. The first conductive pattern CDP1 may serve as a first source electrode S1 of the first transistor T1.

A second conductive pattern CDP2 may be connected to the first electrode RME1 to be described later. In addition, the second conductive pattern CDP2 may be electrically connected to the first transistor T1 through the first conductive pattern CDP1. In the drawings, the first conductive pattern CDP1 and the second conductive pattern CDP2 are separated from each other. However, in some embodiments, the second conductive pattern CDP2 may be integrated with the first conductive pattern CDP1 to form one pattern. The first transistor T1 may send the first power supply voltage received from the first voltage line VL1 to the first electrode RME1.

Although the first conductive pattern CDP1 and the second conductive pattern CDP2 are formed on the same layer in the drawings, the disclosure is not limited thereto. In some embodiments, the second conductive pattern CDP2 may be formed of a different conductive layer from the first conductive pattern CDP1, for example, the second conductive pattern CDP2 may be formed of a fourth conductive layer located on the third conductive layer with one or more insulating layers interposed between them. In this case, the first voltage line VL1 and the second voltage line VL2 may also be formed of the fourth conductive layer instead of the third conductive layer, and the first voltage line VL1 may be electrically connected to the drain electrode D1 of the first transistor T1 through another conductive pattern.

In addition, as will be described later, the display device 10 according to some embodiments may include a plurality of bridge electrodes BE (BE1 and BE2 in FIG. 7), and the third conductive layer may further include the bridge electrodes BE. The bridge electrodes BE may be respectively connected to the electrodes RME and connection electrodes CNE located thereon, and the electrodes RME and the connection electrodes CNE may be electrically connected to each other through the bridge electrodes BE. However, the bridge electrodes BE may not necessarily be formed of the third conductive layer and, in some embodiments, may be formed of a layer located on the third conductive layer. The bridge electrodes BE will be described in detail later with reference to other drawings.

Each of the buffer layer BL, the first gate insulating layer GI, and the first interlayer insulating layer IL1 described above may be composed of a plurality of inorganic layers stacked alternately. For example, each of the buffer layer BL, the first gate insulating layer GI, and the first interlayer insulating layer IL1 may be a double layer in which inorganic layers including at least any one of silicon oxide ($SiO_x$), silicon nitride ($SiN_x$) and silicon oxynitride ($SiO_xN_y$) are stacked, or may be a multilayer in which the above materials are alternately stacked. However, the disclosure is not limited thereto, and each of the buffer layer BL, the first gate insulating layer GI, and the first interlayer insulating layer IL1 may also be composed of one inorganic layer including any one of the above insulating materials. In addition, in some embodiments, the first interlayer insulating layer IL1 may be made of an organic insulating material such as polyimide (PI).

Each of the second conductive layer and the third conductive layer may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

A via layer VIA is located on the third conductive layer in the display area DPA. The via layer VIA may include an organic insulating material such as polyimide (PI), and may perform a surface planarization function.

Bank patterns BP1 and BP2, a plurality of electrodes RME (RME1 and RME2), the bank layer BNL, a plurality of light emitting elements ED, and a plurality of connection electrodes CNE (CNE1 and CNE2) are located as the display element layer on the via layer VIA. In addition, a plurality of insulating layers PAS1 through PAS3 may be located on the via layer VIA. Alternatively, in some embodiments, the bridge electrodes BE may be located on the via layer VIA.

The bank patterns BP1 and BP2 may be directly located on the via layer VIA in the display area DPA. The bank patterns BP1 and BP2 may extend in the first direction DR1, and may be spaced apart from each other in the second direction DR2. For example, the bank patterns BP1 and BP2 may include a first bank pattern BP1 and a second bank pattern BP2 spaced apart from each other in the emission area EMA of each subpixel SPXn. The first bank pattern BP1 may be located on a left side of the center of the emission area EMA, which is a side in the second direction DR2, and the second bank pattern BP2 may be located on a right side of the center of the emission area EMA, which is the other side in the second direction DR2. The light emitting elements ED may be located between the first bank pattern BP1 and the second bank pattern BP2.

A length of each of the bank patterns BP1 and BP2 extending in the first direction DR1 may be less than a length, in the first direction DR1, of the emission area EMA surrounded by the bank layer BNL. The bank patterns BP1 and BP2 may be located in the emission area EMA of each subpixel SPXn in the entire display area DPA to form island-shaped patterns having a relatively narrow width and extending in one direction. However, the disclosure is not limited thereto, and both sides of each of the bank patterns BP1 and BP2 in the first direction DR1 may also partially overlap parts of the bank layer BNL, which extends in the second direction DR2. Although two bank patterns BP1 and BP2 having the same width are located in each subpixel SPXn in the drawings, the disclosure is not limited thereto. The number and shape of the bank patterns BP1 and BP2 may vary according to the number or arrangement structure of the electrodes RME.

At least a part of each of the bank patterns BP1 and BP2 may protrude from an upper surface of the via layer VIA. The protruding part of each of the bank patterns BP1 and BP2 may have inclined side surfaces, and light emitted from the light emitting elements ED may be reflected upward above the via layer VIA by the electrodes RME located on the bank patterns BP1 and BP2. However, the disclosure is not limited thereto, and each of the bank patterns BP1 and BP2 may also have a semicircular or semielliptical shape having a curved outer surface. The bank patterns BP1 and BP2 may include, but are not limited to, an organic insulating material such as polyimide (PI).

The electrodes RME extend in one direction and are located in each subpixel SPXn. The electrodes RME may extend in the first direction DR1, may be located in the emission area EMA of each subpixel SPXn, and may be spaced apart from each other in the second direction DR2. The electrodes RME may be electrically connected to the light emitting elements ED. Each of the electrodes RME may be connected to the light emitting elements ED through a bridge electrode BE and a connection electrode CNE (CNE1 or CNE2) to be described later, and may send an electrical signal received from a conductive layer located thereunder to the light emitting elements ED.

The display device 10 includes the first electrode RME1 and the second electrode RME2 located in each subpixel SPXn. The first electrode RME1 is located on the left side of the center of the emission area EMA, and the second electrode RME2 is spaced apart from the first electrode RME1 in the second direction DR2 and located on the right side of the center of the emission area EMA. The first electrode RME1 may be located on the first bank pattern BP1, and the second electrode RME2 may be located on the second bank pattern BP2. The first electrode RME1 and the second electrode RME2 may extend beyond the bank layer BNL to lie in a part of the sub-area SA of a corresponding subpixel SPXn. The first electrodes RME1 and the second electrodes RME2 of different subpixels SPXn may be spaced apart from each other by the separation part ROP located in the sub-area SA of any one subpixel SPXn.

The first electrode RME1 and the second electrode RME2 may be located on at least the inclined side surfaces of the bank patterns BP1 and BP2. In some embodiments, a width of each of the electrodes RME measured in the second direction DR2 may be less than a width of each of the bank patterns BP1 and BP2 measured in the second direction DR2. Each of the first electrode RME1 and the second electrode RME2 may cover at least one side surface of a bank pattern BP1 or BP2 to reflect light emitted from the light emitting elements ED. In addition, a distance between the first electrode RME1 and the second electrode RME2 in the second direction DR2 may be less than a distance between the bank patterns BP1 and BP2. At least a part of each of the first electrode RME1 and the second electrode RME2 may be directly located on the via layer VIA so that they lie in the same plane.

The light emitting elements ED may be located between the bank patterns BP1 and BP2 on which the electrodes RME are located. Light emitted from the light emitting elements ED may travel toward the electrodes RME located on the bank patterns BP1 and BP2. Each electrode RME may have a structure in which a part located on a bank pattern BP1 or BP2 can reflect light emitted from the light emitting elements ED.

The electrodes RME may include a conductive material having high reflectivity. For example, each of the electrodes RME may include a metal such as silver (Ag), copper (Cu) or aluminum (Al), may be an alloy including aluminum (Al), nickel (Ni) or lanthanum (La), or may have a structure in which a metal layer such as titanium (Ti) or molybdenum (Mo) and the above alloy are stacked. In some embodiments, each of the electrodes RME may be a double layer or a multilayer in which an alloy including aluminum (Al) and at least one metal layer made of titanium (Ti) or molybdenum (Mo) are stacked.

However, the disclosure is not limited thereto, and each electrode RME may further include a transparent conductive material. For example, each electrode RME may include a material such as ITO, IZO or ITZO. In some embodiments, each electrode RME may have a structure in which a transparent conductive material and a metal layer having high reflectivity are each stacked in one or more layers, or may be formed as a single layer including them. For example, each electrode RME may have a stacked structure of ITO/Ag/ITO, ITO/Ag/IZO, or ITO/Ag/ITZO/IZO. The electrodes RME may be electrically connected to the light emitting elements ED, and may reflect light travelling to the side surfaces of the bank patterns BP1 and BP2 after being emitted from the light emitting elements ED in an upward direction of each subpixel SPXn.

In addition, each of the electrodes RME may directly contact the third conductive layer through a contact hole CTD or CTS penetrating the via layer VIA in a part overlapping the bank layer BNL between the emission area EMA and the sub-area SA. A first contact hole CTD may be formed in an area in which the bank layer BNL and the first electrode RME1 overlap, and a second contact hole CTS may be formed in an area in which the bank layer BNL and the second electrode RME2 overlap. The first electrode RME1 may contact the second conductive pattern CDP2 through the first contact hole CTD penetrating the via layer VIA. The second electrode RME2 may contact the second voltage line VL2 through the second contact hole CTS penetrating the via layer VIA. The first electrode RME1 may be electrically connected to the first transistor T1 through the second conductive pattern CDP2 and the first conductive pattern CDP1 to receive the first power supply voltage, and the second electrode RME2 may be electrically connected to the second voltage line VL2 to receive the second power supply voltage.

A first insulating layer PAS1 may be located in the entire display area DPA and may be located on the via layer VIA and the electrodes RME. The first insulating layer PAS1 may protect the electrodes RME while insulating them from each other. For example, because the first insulating layer PAS1 covers the electrodes RME before the bank layer BNL is formed, it can reduce or prevent the likelihood of the electrodes RME being damaged in the process of forming the bank layer BNL. In addition, the first insulating layer PAS1 may reduce or prevent the likelihood of the light emitting elements ED located thereon directly contacting other members and thus being damaged.

In some embodiments, the first insulating layer PAS1 may be stepped such that a part of an upper surface of the first insulating layer PAS1 is depressed between the electrodes RME spaced apart from each other in the second direction DR2. The light emitting elements ED may be located on the stepped upper surface of the first insulating layer PAS1, and a space may be formed between each of the light emitting elements ED and the first insulating layer PAS1.

The bank layer BNL may be located on the first insulating layer PAS1. The bank layer BNL may include parts extending in the first direction DR1 and the second direction DR2, and may surround each subpixel SPXn. In addition, the bank layer BNL may surround the emission area EMA and the sub-area SA of each subpixel SPXn to separate them, and may surround the outermost periphery of the display area DPA to separate the display area DPA and the non-display area NDA. The bank layer BNL may be entirely located in the display area DPA to form a grid pattern, and areas exposed by the bank layer BNL in the display area DPA may be the emission area EMA and the sub-area SA.

Like the bank patterns BP1 and BP2, the bank layer BNL may have a corresponding height (e.g., a predetermined height). In some embodiments, an upper surface of the bank layer BNL may be at a greater height than those of the bank patterns BP1 and BP2, and a thickness of the bank layer BNL may be equal to or greater than those of the bank patterns BP1 and BP2. The bank layer BNL may prevent ink from overflowing to adjacent subpixels SPXn in an inkjet printing process during a manufacturing process of the display device 10. Like the bank patterns BP1 and BP2, the bank layer BNL may include an organic insulating material such as polyimide.

The light emitting elements ED may be located on the first insulating layer PAS1. The light emitting elements ED may extend in a direction, and the direction in which the light emitting elements ED extend may be substantially parallel to the first substrate SUB. As will be described later, each light emitting element ED may include a plurality of semiconductor layers located along the extending direction, and the semiconductor layers may be sequentially located along a direction that is substantially parallel to an upper surface of the first substrate SUB. However, the disclosure is not limited thereto. When the light emitting elements ED have a different structure in other embodiments, the semiconductor layers may be located in a direction that is substantially perpendicular to the first substrate SUB.

The light emitting elements ED may be located on the electrodes RME, which are spaced apart in the second direction DR2, between the bank patterns BP1 and BP2. A length of each light emitting element ED may be greater than a distance between the electrodes RME spaced apart in the second direction DR2. The light emitting elements ED may be located such that at least one end thereof lies on any one of the different electrodes RME, or such that both ends lie on the different electrodes RME, respectively. The light emitting elements ED may be spaced apart from each other along the first direction DR1 in which each electrode RME extends and may be aligned substantially parallel to each other. However, the disclosure is not limited thereto, and the light emitting elements ED may also be located obliquely to the direction in which each electrode RME extends.

The light emitting elements ED located in different subpixels SPXn may emit light of different wavelength bands depending on the materials that form the semiconductor layers described above. However, the disclosure is not limited thereto, and the light emitting elements ED located in each subpixel SPXn may also emit light of the same color by including the semiconductor layers made of the same material. The light emitting elements ED may be electrically connected to the electrodes RME and the conductive layers under the via layer VIA by contacting the connection electrodes CNE (CNE1 and CNE2), and may emit light of a corresponding wavelength band in response to an electrical signal. Each light emitting element ED may emit light through both ends in its extending direction, and the light may be reflected by the electrodes RME located on the bank patterns BP1 and BP2.

A second insulating layer PAS2 may be located on the light emitting elements ED, the first insulating layer PAS1, and the bank layer BNL. The second insulating layer PAS2 includes a pattern part extending in the first direction DR1 between the bank patterns BP1 and BP2 and located on the light emitting elements ED. The pattern part may partially cover outer surfaces of the light emitting elements ED, and may not cover both sides or both ends of the light emitting elements ED. The pattern part may form a linear or island-shaped pattern in each subpixel SPXn in plan view. The pattern part of the second insulating layer PAS2 may protect the light emitting elements ED while fixing (e.g., holding) the light emitting elements ED during the process of manufacturing the display device 10. In addition, the second insulating layer PAS2 may fill the space between each of the light emitting elements ED and the first insulating layer PAS1 under the light emitting element ED. In addition, a part of the second insulating layer PAS2 may be located on the bank layer BNL and in the sub-areas SA.

The connection electrodes CNE (CNE1 and CNE2) may be located on the electrodes RME and the light emitting elements ED, and may contact the light emitting elements ED. Each of the connection electrodes CNE may contact any one end of each light emitting element ED, and may be electrically connected to any one of the electrodes RME.

A first connection electrode CNE1 may extend in the first direction DR1 and may be located on the first electrode RME1. The first connection electrode CNE1 may partially overlap the first electrode RME1, and may extend from the emission area EMA to the sub-area SA beyond the bank layer BNL. A second connection electrode CNE2 may extend in the first direction DR1, and may be located on the second electrode RME2. The second connection electrode CNE2 may partially overlap the second electrode RME2, and may extend from the emission area EMA to the sub-area SA beyond the bank layer BNL.

A third insulating layer PAS3 is located on the second connection electrode CNE2 and the second insulating layer PAS2. The third insulating layer PAS3 may be entirely located on the second insulating layer PAS2 to cover the second connection electrode CNE2, and the first connection electrode CNE1 may be located on the third insulating layer PAS3. The third insulating layer PAS3 may be entirely located on the via layer VIA except for an area in which the first connection electrode CNE1 is located. The third insulating layer PAS3 may insulate the first connection electrode CNE1 and the second connection electrode CNE2 from each other so that the first connection electrode CNE1 does not directly contact the second connection electrode CNE2.

Although not illustrated in the drawings, another insulating layer may be further located on the third insulating layer PAS3 and the first connection electrode CNE1. The insulating layer may function to protect members located on the first substrate SUB1 from the external environment.

The first insulating layer PAS1, the second insulating layer PAS2, and the third insulating layer PAS3 described above may include an inorganic insulating material or an organic insulating material.

According to some embodiments, in the display device 10, the electrodes RME and the connection electrodes CNE may be electrically connected to each other through the bridge electrodes BE located under them. The connection electrodes CNE are located on the electrodes RME, but may not directly contact the electrodes RME due to insulating layers, for example, due to the first through third insulating layers PAS1 through PAS3 located between them. However, the electrodes RME and the connection electrodes CNE may directly contact the bridge electrodes BE, respectively, and may be electrically connected to each other through the bridge electrodes BE.

Figure 6:
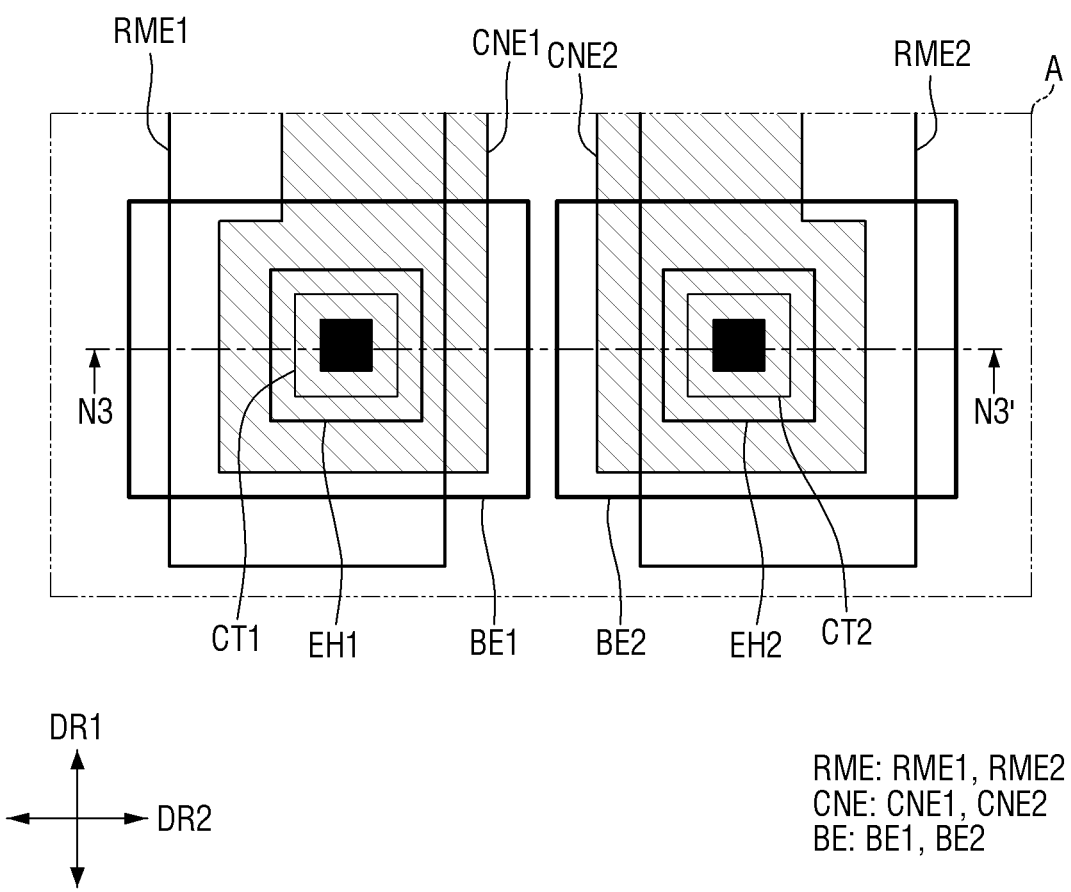
FIG. 6 is an enlarged view of part A of FIG. 3.
Figure 7:
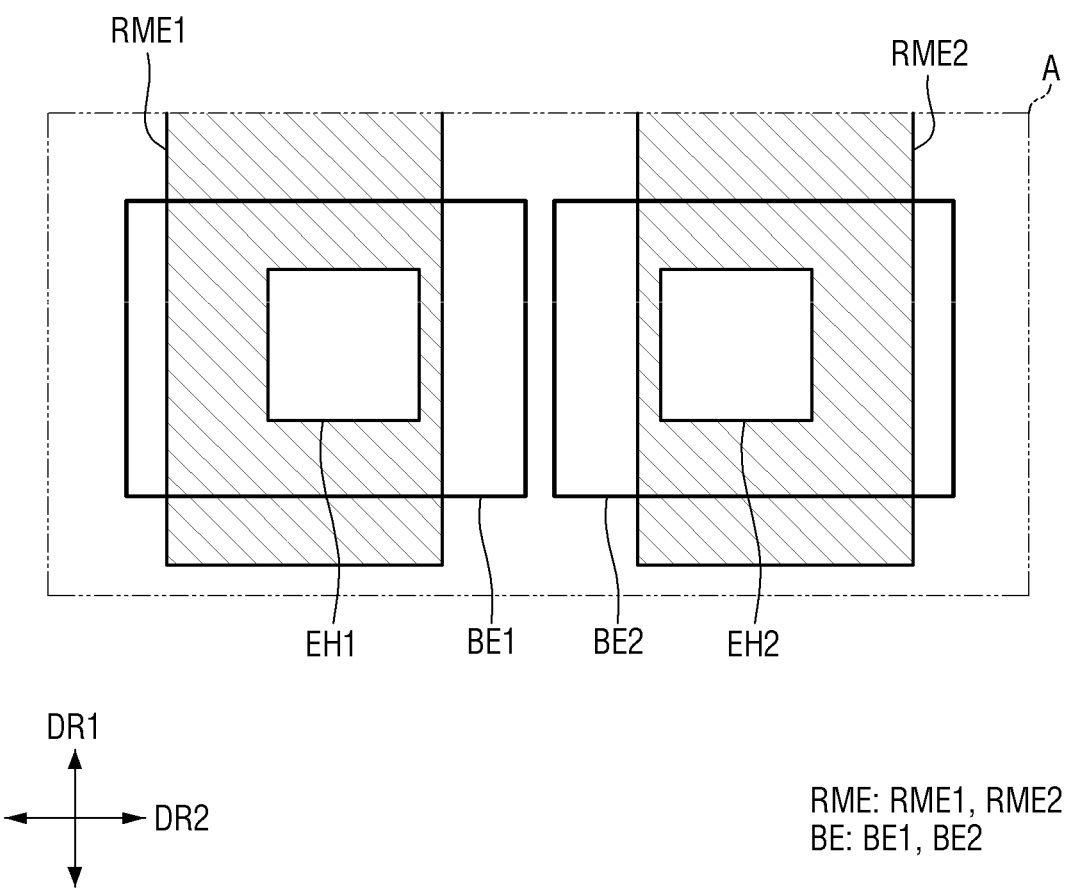
FIG. 7 is a plan view of electrodes and bridge electrodes illustrated in FIG. 6.
Figure 8:
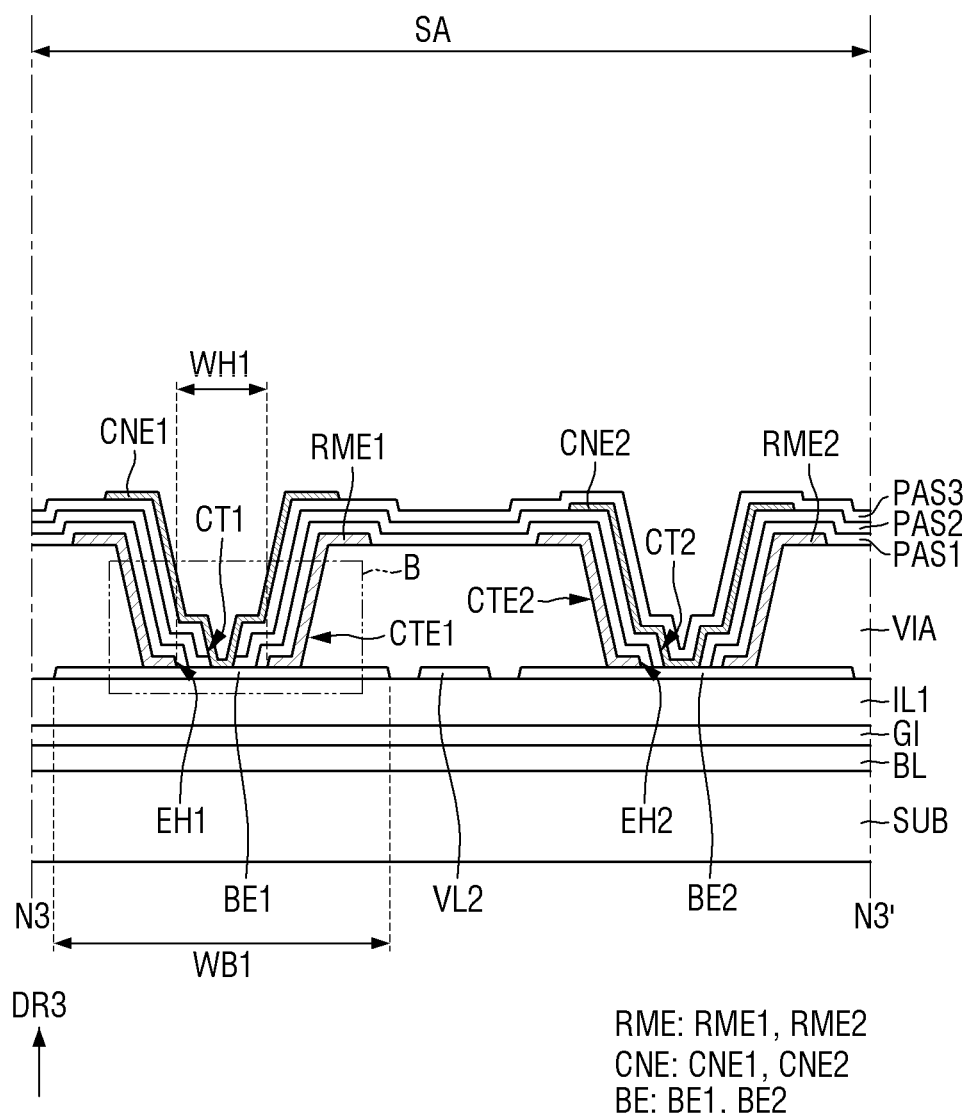
FIG. 8 is a cross-sectional view taken along the line N3-N3' of FIG. 6.

FIG. 6 is an enlarged view of part A of FIG. 3. FIG. 7 is a plan view of the electrodes RME and the bridge electrodes BE illustrated in FIG. 6. FIG. 8 is a cross-sectional view taken along the line N3-N3' of FIG. 6. FIG. 6 is an enlarged view of an area in which a plurality of contact parts CT1 and CT2 and the bridge electrodes BE (BE1 and BE2) are located in the sub-area SA, and FIG. 8 illustrates a cross section taken across the contact parts CT1 and CT2 and the bridge electrodes BE in the second direction DR2.

Referring further to FIGS. 6 through 8 in conjunction with FIGS. 3 through 5, the display device 10 may further include a plurality of bridge electrodes BE (BE1 and BE2) located in the sub-area SA. The bridge electrodes BE may be spaced apart from each other in the second direction DR2 in the sub-area SA, and may be located in a space between the separation part ROP and the bank layer BNL. The sub-area SA may be divided into an upper area and a lower area by the separation part ROP. Each of the bridge electrodes BE may be located in the upper area above the separation part ROP and may overlap, in the thickness direction, an electrode RME and a connection electrode CNE located in the emission area EMA of a corresponding subpixel SPXn.

The bridge electrodes BE may include a first bridge electrode BE1 overlapping the first electrode RME1 in the thickness direction, and a second bridge electrode BE2 overlapping the second electrode RME2 in the thickness direction. The first bridge electrode BE1 and the second bridge electrode BE2 may be spaced apart from each other in the second direction DR2, and may be located in an island-shaped pattern in the sub-area SA. Each of the electrodes RME and the connection electrodes CNE may extend from the emission area EMA to the sub-area SA, and one end in the first direction DR1 may overlap a corresponding bridge electrode BE in the thickness direction.

In some embodiments, the bridge electrodes BE may be located under the via layer VIA and may be formed of the third conductive layer, like the voltage lines VL1 and VL2 and the conductive patterns CDP1 and CDP2. The first voltage line VL1 and the second voltage line VL2 may extend in the first direction DR1, but may bypass the area in which the bridge electrodes BE are located in the sub-area SA. In the drawings, the second voltage line VL2 extends between the first bridge electrode BE1 and the second bridge electrode BE2. The first voltage line VL1 may extend on a left side of the first bridge electrode BE1 (e.g., in FIG. 8). However, the disclosure is not limited thereto. In some embodiments in which the bridge electrodes BE are formed of the third conductive layer, the first voltage line VL1 and the second voltage line VL2 may also extend at different positions.

Other members of the third conductive layer, for example, the conductive patterns CDP1 and CDP2 and the voltage lines VL1 and VL2 are lines which are electrically connected to the first transistor T1 or to which a voltage is applied. On the other hand, the bridge electrodes BE may not be directly connected to circuit elements, and a voltage may not be directly applied to the bridge electrodes BE. However, the bridge electrodes BE are electrodes for electrically connecting the electrodes RME and the connection electrodes CNE located on the via layer VIA. Voltages applied from the circuit elements and the voltage lines VL1 and VL2 may flow from the electrodes RME to the bridge electrodes BE, and then may flow to the light emitting elements ED via the connection electrodes CNE.

According to some embodiments, each of the electrodes RME and the connection electrodes CNE may directly contact any one of the bridge electrodes BE through an electrode contact hole CTE1 or CTE2 or a contact part CT1 or CT2 penetrating the insulating layers PAS1 through PAS3 and the via layer VIA under the electrode.

The first electrode RME1 may directly contact the first bridge electrode BE1 through a first electrode contact hole CTE1 penetrating the via layer VIA in the sub-area SA, and the second electrode RME2 may directly contact the second bridge electrode BE2 through a second electrode contact hole CTE2 penetrating the via layer VIA in the sub-area SA. Each of the electrodes RME may directly contact the third conductive layer through an electrode contact hole CTE1 or CTE2 located in the sub-area SA as well as through a contact hole CTD or CTS located under the bank layer BNL.

Each of the electrodes RME may directly contact a bridge electrode BE through an electrode contact hole CTE1 or CTE2, but may include an electrode hole EH1 or EH2 exposing an upper surface of the bridge electrode BE. The first electrode RME1 may include a first electrode hole EH1 exposing an upper surface of the first bridge electrode BE1, and the second electrode RME2 may include a second electrode hole EH2 exposing an upper surface of the second bridge electrode BE2. The electrode holes EH1 and EH2 may be respectively located on the bridge electrodes BE in the sub-area SA, and may be smaller than the electrodes RME and the bridge electrodes BE (e.g., in a plan view). The electrode holes EH1 and EH2 formed in the electrodes RME may respectively penetrate the electrodes RME, and may partially expose the upper surfaces of the bridge electrodes BE. The exposed upper surfaces of the bridge electrodes BE may directly contact the connection electrodes CNE which will be described later.

The first insulating layer PAS1 may be located in the emission area EMA and the sub-area SA, and may cover upper surfaces of the electrodes RME located in the sub-area SA. The first insulating layer PAS1 may cover parts of the electrodes RME that are located on the electrode contact holes CTE1 and CTE2. The first insulating layer PAS1 may cover parts of the electrodes RME that contact the bridge electrodes BE, and a part of the first insulating layer PAS1 may directly contact the bridge electrodes BE. In addition, the first insulating layer PAS1 may include openings formed to correspond to the electrode holes EH1 and EH2 and to partially expose the upper surfaces of the bridge electrodes BE. The electrode holes EH1 and EH2 of the electrodes RME and the openings of the first insulating layer PAS1 may expose the bridge electrodes BE. Because the openings of the first insulating layer PAS1 are formed to be smaller than the electrode holes EH1 and EH2 in plan view, the first insulating layer PAS1 may completely cover the electrodes RME.

In addition, in some embodiments, the first insulating layer PAS1 may not be located in the separation part ROP in the sub-area SA. The upper surface of the via layer VIA may be exposed in the separation part ROP, and the exposed part may be covered by the third insulating layer PAS3.

The second insulating layer PAS2 and the third insulating layer PAS3 may also be located in the sub-area SA, and may be located on the electrodes RME and the first insulating layer PAS1 located in the sub-area SA. The second insulating layer PAS2 and the third insulating layer PAS3 may cover parts of the electrodes RME that are located on the electrode contact holes CTE1 and CTE2, and the contact parts CT1 and CT2 may be formed in parts corresponding to the electrode holes EH1 and EH2.

A first contact part CT1 may be located in the first electrode contact hole CTE1 and the first electrode hole EH1, and may penetrate the second insulating layer PAS2 and the third insulating layer PAS3 to expose the upper surface of the first bridge electrode BE1. The first connection electrode CNE1 may be located on the first electrode contact hole CTE1, and may directly contact the first bridge electrode BE1 through the first contact part CT1. A second contact part CT2 may be located in the second electrode contact hole CTE2 and the second electrode hole EH2, and may penetrate the second insulating layer PAS2 to expose the upper surface of the second bridge electrode BE2. The second connection electrode CNE2 may be located on the second electrode contact hole CTE2, and may directly contact the second bridge electrode BE2 through the second contact part CT2. The third insulating layer PAS3 may be penetrated by the first contact part CT1, but may cover the second contact part CT2.

The first connection electrode CNE1 may be located on the third insulating layer PAS3, and may be located on the first electrode contact hole CTE1 in the sub-area SA. The first connection electrode CNE1 may directly contact the first bridge electrode BE1 exposed through the first contact part CT1. Similarly, the second connection electrode CNE2 may be located on the second insulating layer PAS2, and may be located on the second electrode contact hole CTE2 in the sub-area SA. The second connection electrode CNE2 may directly contact the second bridge electrode BE2 exposed through the second contact part CT2.

The first electrode RME1 and the first connection electrode CNE1 may be electrically connected to each other by directly contacting the first bridge electrode BE1, and the second electrode RME2 and the second connection electrode CNE2 may be electrically connected to each other by directly contacting the second bridge electrode BE2. An electrical signal transmitted from the first voltage line VL1 may be sent to the first electrode RME1 through the first transistor T1, and then may be sent to the first connection electrode CNE1 and the light emitting elements ED through the first bridge electrode BE1. An electrical signal transmitted from the second voltage line VL2 may be sent to the second electrode RME2, and then may be sent to the second connection electrode CNE2 and the light emitting elements ED through the second bridge electrode BE2. Although the bridge electrodes BE do not overlap the light emitting elements ED in the thickness direction because they are located in the sub-area SA, they can transmit voltages received from the electrodes RME to the connection electrodes CNE.

According to some embodiments, each of the bridge electrodes BE1 and BE2 is formed to be larger than the contact parts CT1 and CT2 penetrating the second insulating layer PAS2 and the third insulating layer PAS3, and to be larger than the electrode holes EH1 and EH2. Therefore, each of the bridge electrodes BE1 and BE2 may concurrently contact a corresponding electrode RME and a corresponding connection electrode CNE. For example, a width WB1 of each bridge electrode BE may be greater than a width WH1 of each of the electrode holes EH1 and EH2. Because the contact parts CT1 and CT2 are respectively located in the electrode holes EH1 and EH2, when the width WB1 of each bridge electrode BE is greater than the width WH1 of each of the electrode holes EH1 and EH2, the bridge electrode BE may concurrently contact the electrode RME and the connection electrode CNE. Although the bridge electrodes BE1 and BE2 are larger than the electrode contact holes CTE1 and CTE2 in the drawings, the disclosure is not limited thereto. The bridge electrodes BE1 and BE2 may also be larger than at least the contact parts CT1 and CT2, and the electrode holes EH1 and EH2 and may be smaller than the electrode contact holes CTE1 and CTE2.

Each of the electrodes RME may be covered by the first insulating layer PAS1 and the second insulating layer PAS2 in an electrode contact hole CTE1 or CTE2 contacting a bridge electrode BE. Because each of the connection electrodes CNE is located on the second insulating layer PAS2, even if the connection electrode CNE directly contacts a bridge electrode BE through a contact part CT1 or CT2 located in an electrode contact hole CTE1 or CTE2, it may not directly contact an electrode RME. According to some embodiments, an electrode RME and a connection electrode CNE may be electrically connected through a bridge electrode BE without directly contacting each other, and an electrical signal transmitted to the electrode RME may be sent to the light emitting elements ED through the bridge electrode BE and the connection electrode CNE.

As described above, each electrode RME of the display device 10 may include aluminum (Al), and the aluminum (Al) may form an oxide (aluminum oxide ($AlO_x$)) on the surface when it comes into contact with air.

Figure 9:
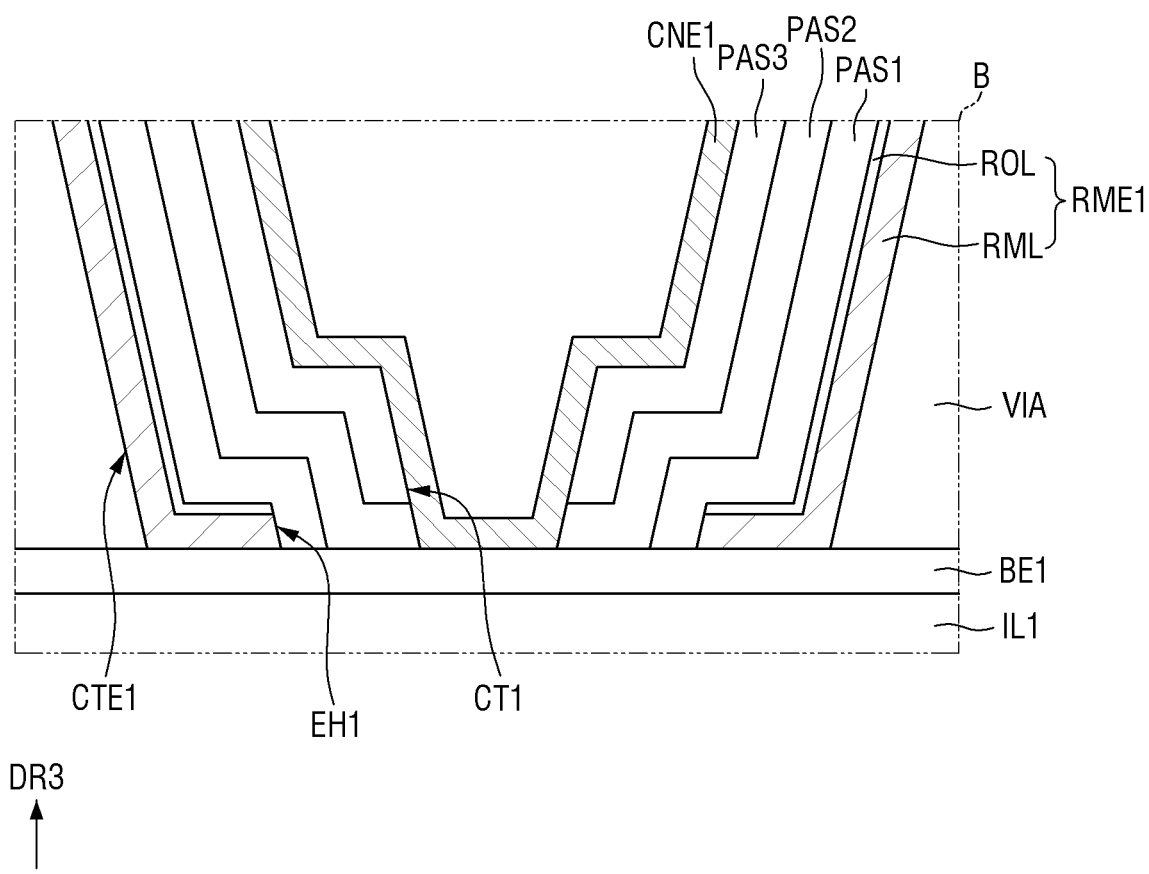
FIG. 9 is an enlarged view of part B of FIG. 8.

FIG. 9 is an enlarged view of part B of FIG. 8.

Referring to FIG. 9, each electrode RME of the display device 10 may include a main electrode layer RML and an electrode upper layer ROL formed on the main electrode layer RML. The electrodes RME may include a metal such as aluminum (Al) as a conductive material having high reflectivity, and this material may easily form an oxide when it comes into contact with air. For example, in some embodiments in which the electrodes RME include aluminum (Al), the main electrode layer RML may be a metal layer including aluminum (Al), and the electrode upper layer ROL may be an oxide layer including aluminum oxide ($AlO_x$).

In the manufacturing process of the display device 10, the electrodes RME may be exposed to air before the first insulating layer PAS1 is formed, and aluminum oxide ($AlO_x$) may be formed on most surfaces. When the connection electrodes CNE located on the electrodes RME directly contact the electrodes RME, they may contact the aluminum oxide ($AlO_x$) formed on the surfaces of the electrodes RME. If the connection electrodes CNE directly contact the electrodes RME so as to be electrically connected to the electrodes RME, they may contact the electrode upper layers ROL including aluminum oxide ($AlO_x$). In this case, contact resistance between the connection electrodes CNE and the electrodes RME may greatly increase.

On the other hand, in the display device 10 according to some embodiments, the electrodes RME are respectively electrically connected to the connection electrodes CNE through the respective bridge electrodes BE located under the electrodes RME. Therefore, the connection electrodes CNE may not contact the aluminum oxide ($AlO_x$) formed on the surfaces of the electrodes RME. Because the electrodes RME are formed after the bridge electrodes BE are formed, parts of the electrodes RME that contact the bridge electrodes BE may be the main electrode layers RML, and contact resistance between them may have a small value. In addition, the bridge electrodes BE, unlike the electrodes RME, may be made of a material not including aluminum (Al), and an oxide may not be formed on the upper surfaces of the bridge electrodes BE. Accordingly, contact resistance in parts where the connection electrodes CNE and the bridge electrodes BE contact each other may also have a small value.

In the display device 10, because the connection electrodes CNE located on the electrodes RME are respectively electrically connected to the electrodes RME through the respective bridge electrodes BE under the respective connection electrodes CNE without directly contacting the electrodes RME, the contact resistance between the electrodes RME and the connection electrodes CNE when the electrodes RME and the connection electrodes CNE contact each other may be reduced. Accordingly, the display device 10 can reduce or prevent the likelihood of pixel dark spots that may otherwise occur due to a large value of contact resistance when the electrodes contact each other.

Figure 10:
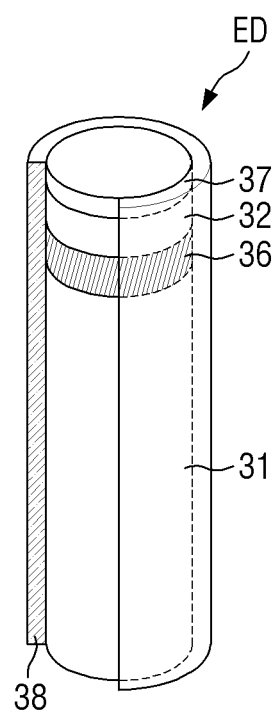
FIG. 10 is a schematic view of a light emitting element according to some embodiments.

FIG. 10 is a schematic view of a light emitting element ED according to some embodiments.

Referring to FIG. 10, the light emitting element ED may be a light emitting diode. For example, the light emitting element ED may be an inorganic light emitting diode having an approximate size of nanometers to micrometers and made of an inorganic material. When an electric field is formed in a corresponding direction between two electrodes facing each other, the light emitting element ED may be aligned between the two electrodes in which polarities are formed.

The light emitting element ED according to some embodiments may extend in one direction. The light emitting element ED may be shaped like a cylinder, a rod, a wire, a tube, or the like. However, the shape of the light emitting element ED is not limited thereto, and the light emitting element ED may also have various shapes including polygonal prisms, such as a cube, a rectangular parallelepiped and a hexagonal prism, and a shape extending in a direction and having a partially inclined outer surface.

The light emitting element ED may include a semiconductor layer doped with impurities of any conductivity type (e.g., a p type or an n type). The semiconductor layer may receive an electrical signal from an external power source, and may emit light in a corresponding wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN, and InN doped with an n-type dopant. The n-type dopant used to dope the first semiconductor layer 31 may be Si, Ge, Sn, or the like.

The second semiconductor layer 32 is located on the first semiconductor layer 31 with the light emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN, and InN doped with a p-type dopant. The p-type dopant used to dope the second semiconductor layer 32 may be Mg, Zn, Ca, Se, Ba, or the like.

Although each of the first semiconductor layer 31 and the second semiconductor layer 32 is composed of one layer in the drawing, the disclosure is not limited thereto. Each of the first semiconductor layer 31 and the second semiconductor layer 32 may also include a greater number of layers, for example, may further include a clad layer or a tensile strain barrier reducing (TSBR) layer depending on the material of the light emitting layer 36.

The light emitting layer 36 is located between the first semiconductor layer 31 and the second semiconductor layer 32. The light emitting layer 36 may include a material having a single or multiple quantum well structure. When the light emitting layer 36 includes a material having a multiple quantum well structure, it may have a structure in which a plurality of quantum layers and a plurality of well layers are alternately stacked. The light emitting layer 36 may emit light through combination of electron-hole pairs according to an electrical signal received through the first semiconductor layer 31 and the second semiconductor layer 32. The light emitting layer 36 may include a material such as AlGaN or AlGaInN. For example, when the light emitting layer 36 has a multiple quantum well structure in which a quantum layer and a well layer are alternately stacked, the quantum layer may include a material such as AlGaN or AlGaInN, and the well layer may include a material such as GaN or AlInN.

The light emitting layer 36 may also have a structure in which a semiconductor material having a large band gap energy and a semiconductor material having a small band gap energy are alternately stacked, or may include different group 3 to group 5 semiconductor materials depending on the wavelength band of light that it emits. Light emitted from the light emitting layer 36 is not limited to light in a blue wavelength band. In some cases, the light emitting layer 36 may emit light in a red or green wavelength band.

The electrode layer 37 may be an ohmic connection electrode. However, the disclosure is not limited thereto, and the electrode layer 37 may also be a Schottky connection electrode. The light emitting element ED may include at least one electrode layer 37. The light emitting element ED may include one or more electrode layers 37. However, the disclosure is not limited thereto, and the electrode layer 37 may also be omitted.

When the light emitting element ED is electrically connected to an electrode or a connection electrode in the display device 10, the electrode layer 37 may reduce the resistance between the light emitting element ED and the electrode or the connection electrode. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO).

The insulating film 38 surrounds outer surfaces of the semiconductor layers and the electrode layer described above. For example, the insulating film 38 may surround an outer surface of at least the light emitting layer 36, but may expose both ends of the light emitting element ED in a longitudinal direction. In addition, an upper surface of the insulating film 38 may also be rounded in cross section in an area adjacent to at least one end of the light emitting element ED.

The insulating film 38 may include a material having insulating properties, such as silicon oxide ($SiO_x$), silicon nitride ($SiN_x$), silicon oxynitride ($SiO_xN_y$), aluminum nitride ($AlN_x$), or aluminum oxide ($AlO_x$). Although the insulating film 38 is illustrated as a single layer in the drawing, the disclosure is not limited thereto. In some embodiments, the insulating film 38 may be formed in a multilayer structure in which a plurality of layers are stacked.

The insulating film 38 may protect the above members. The insulating film 38 may reduce or prevent the likelihood of an electrical short circuit that may occur in the light emitting layer 36 when the light emitting layer 36 directly contacts an electrode through which an electrical signal is transmitted to the light emitting element ED. In addition, the insulating film 38 may reduce or prevent a reduction in luminous efficiency of the light emitting element ED.

In addition, an outer surface of the insulating film 38 may be treated. The light emitting element ED may be sprayed onto electrodes in a state where it is dispersed in an ink (e.g., a predetermined ink), and then may be aligned. Here, the surface of the insulating film 38 may be hydrophobic-treated or hydrophilic-treated so that the light emitting element ED remains separate from other adjacent light emitting elements ED in the ink without agglomerating with them.

A process of manufacturing the display device 10 according to some embodiments will now be described with reference to other drawings.

FIGS. 11 through 23 are cross-sectional views illustrating a process of manufacturing a display device according to some embodiments. FIGS. 11 through 23 are respectively cross-sectional views illustrating structures according to the formation order of each layer in a subpixel SPXn of a display device 10. FIGS. 11, 13, 16, 18, 20, and 22 illustrate the formation order of electrodes RME, light emitting elements ED, and connection electrodes CNE located in an emission area EMA and may correspond to the structure illustrated in FIG. 5. In addition, FIGS. 12, 14, 15, 17, 19, 21, and 23 illustrate the formation order of the electrodes RME and the connection electrodes CNE located in a sub-area SA and may correspond to the structure illustrated in FIG. 8. A process of forming each layer may be performed through a general patterning process. A formation method in each process will be briefly described, and a formation order will be mainly described below.

Figure 11:
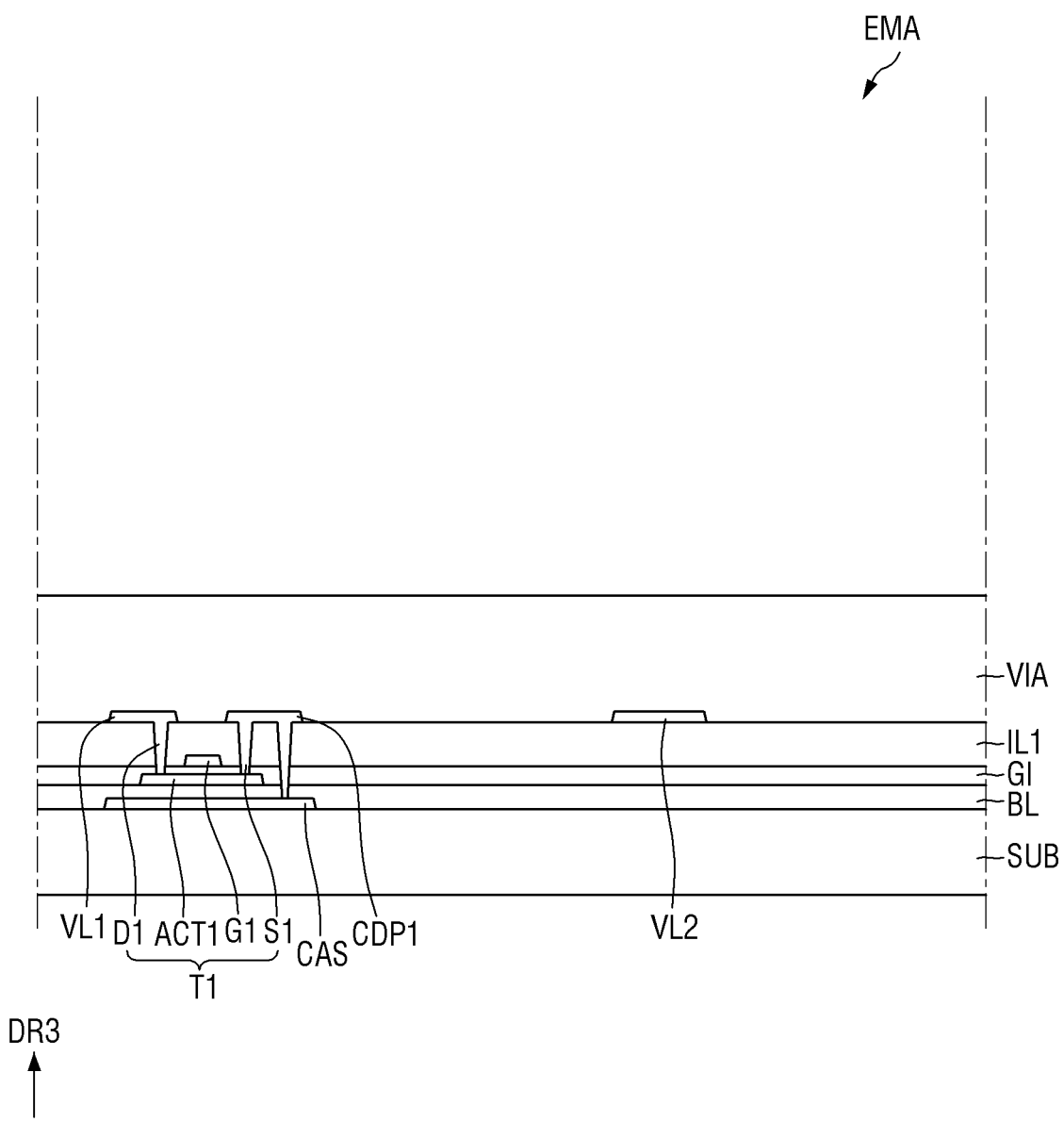
FIGS. 11 through 23 are cross-sectional views illustrating a process of manufacturing a display device according to some embodiments.
Figure 12:
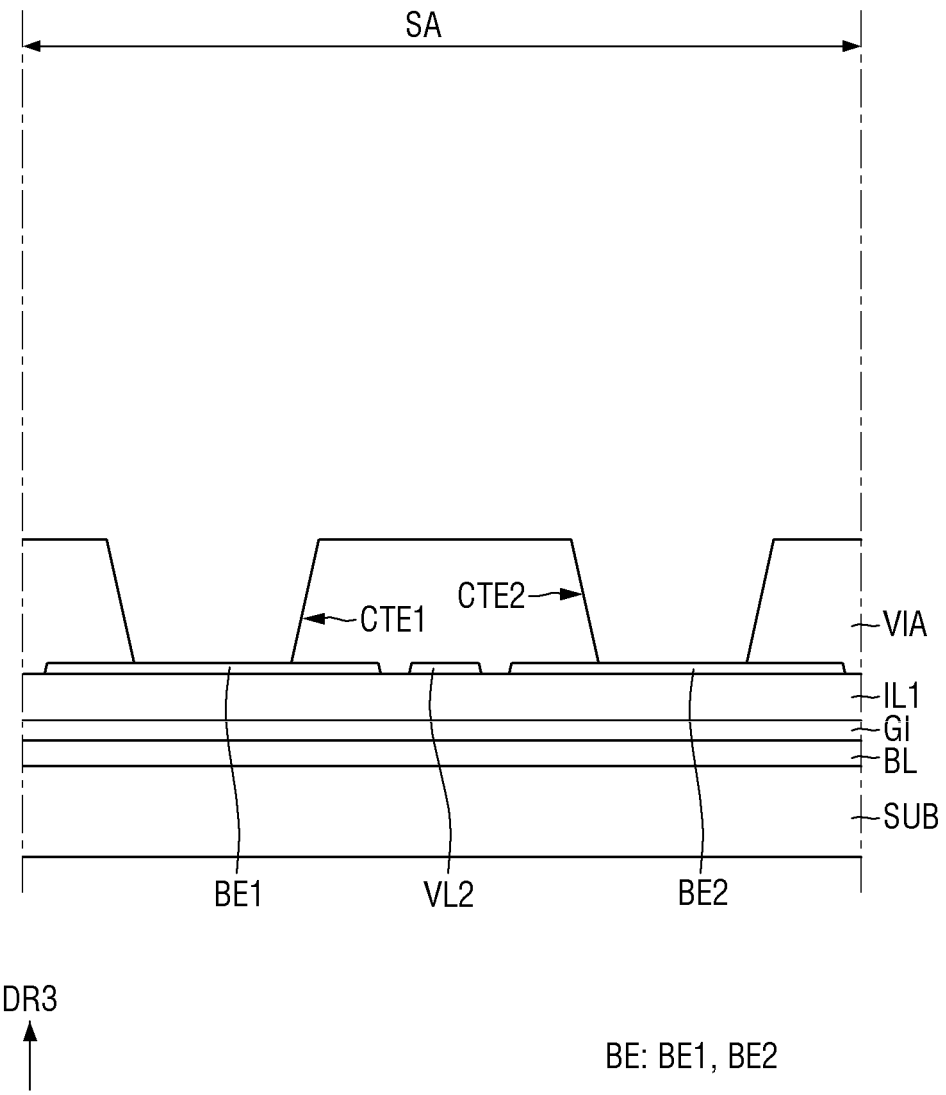

First, referring to FIGS. 11 and 12, a first substrate SUB is prepared, and first through third conductive layers, a buffer layer BL, a first gate insulating layer GI, a first interlayer insulating layer IL1, and a via layer VIA are formed on the first substrate SUB. Each of the first through third conductive layers located on the first substrate SUB may be formed by depositing a material that forms the layer, for example, a metal material, and by then patterning the material using a mask. In addition, each of the buffer layer BL, the first gate insulating layer GI, the first interlayer insulating layer IL1, and the via layer VIA located on the first substrate SUB may be formed by coating a material that forms the layer, for example, an insulating material, or by performing a patterning process using a mask if suitable.

Bridge electrodes BE may be formed of the third conductive layer, and may be located in the sub-area SA. Electrode contact holes CTE1 and CTE2 located in the sub-area SA and exposing upper surfaces of the bridge electrodes BE may be formed in the via layer VIA. Although not illustrated in the drawings, contact holes CTD and CTS may be formed at a boundary between the emission area EMA and the sub-area SA. These structures are the same as those described above, and thus a detailed description thereof will be omitted.

Figure 13:
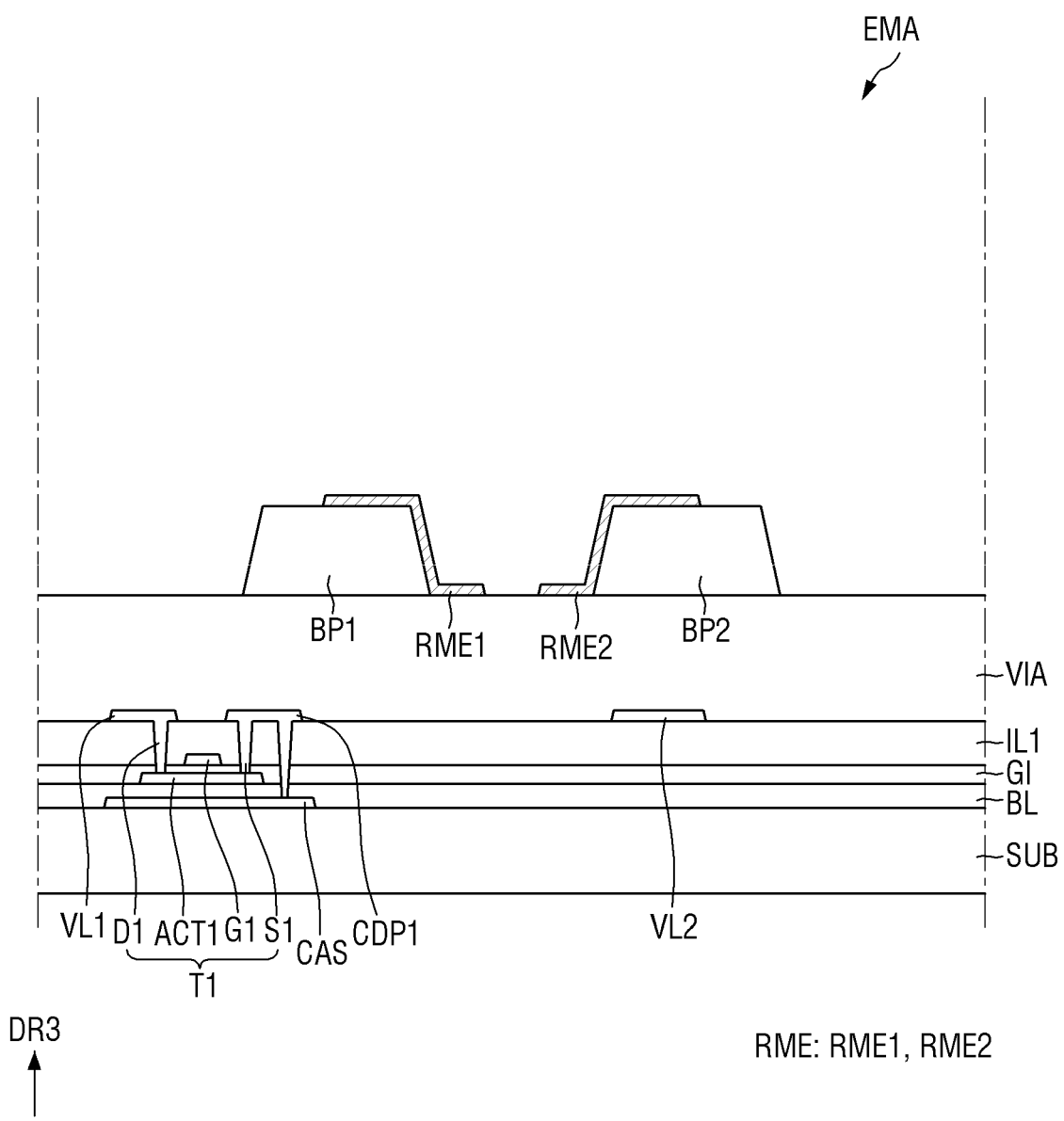
Figure 14:
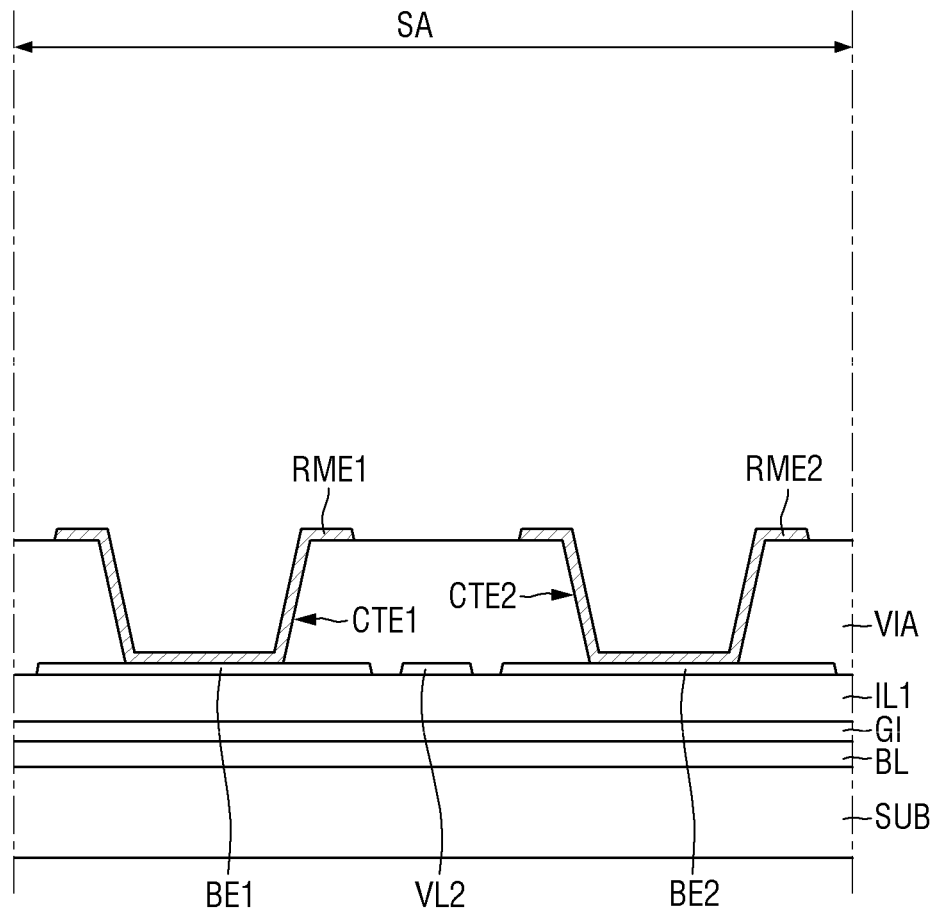
Figure 15:
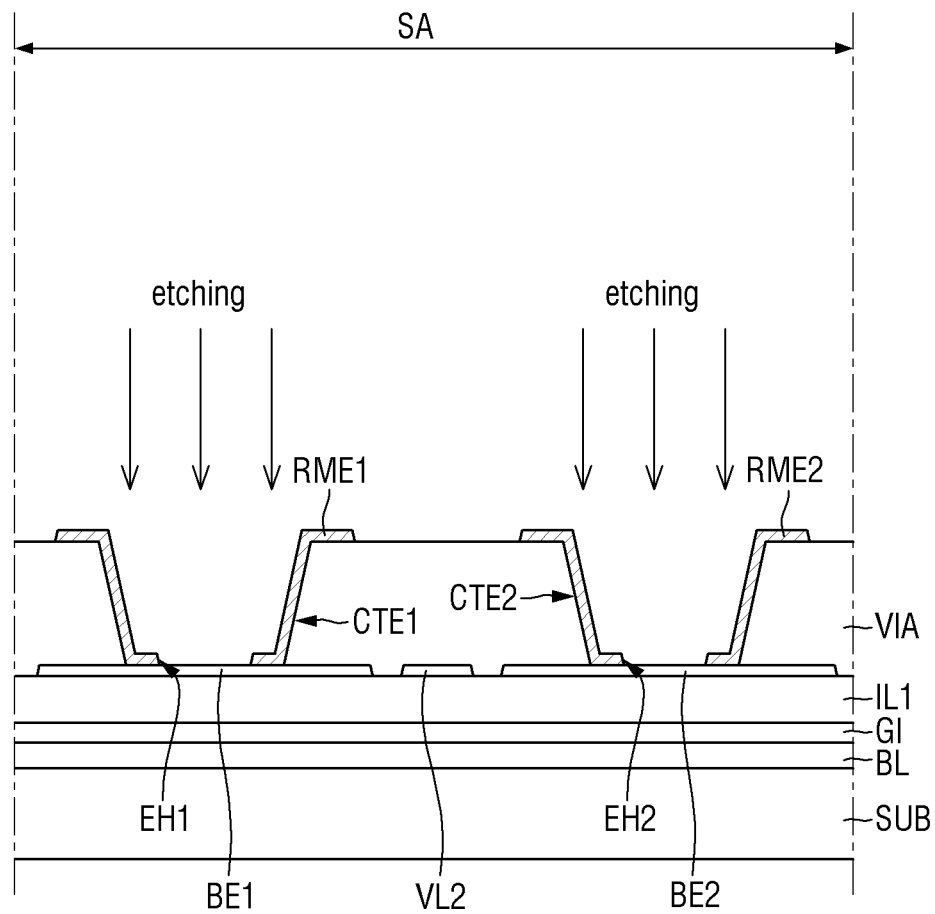

Next, referring to FIGS. 13 through 15, a plurality of bank patterns BP1 and BP2 and a plurality of electrodes RME (RME1 and RME2) are formed on the via layer VIA in a display area DPA. The bank patterns BP1 and BP2 and the electrodes RME may each be formed through deposition or coating and patterning processes. For example, the electrodes RME may be formed by an operation of depositing a metal layer on the entire surface of the via layer VIA and patterning the metal layer, and by an operation of forming electrode holes EH1 and EH2 by partially etching parts of the metal layer that are located in the electrode contact holes CTE1 and CTE2 in the sub-area SA.

As illustrated in FIGS. 13 and 14, when the electrodes RME are formed in the emission area EMA and the sub-area SA through a patterning process, they may be formed to cover the upper surfaces of the bridge electrodes BE exposed by the electrode contact holes CTE1 and CTE2, respectively. A first electrode RME1 may contact a first bridge electrode BE1 through a first electrode contact hole CTE1 and may cover an exposed upper surface of the first bridge electrode BE1, and a second electrode RME2 may contact a second bridge electrode BE2 through a second electrode contact hole CTE2 and may cover an exposed upper surface of the second bridge electrode BE2.

Next, as illustrated in FIG. 15, a process of forming the electrode holes EH1 and EH2 by partially removing parts of the electrodes RME that are located in the electrode contact holes CTE1 and CTE2 is performed in the sub-area SA. The electrode holes EH1 and EH2 may be smaller than the electrode contact holes CTE1 and CTE2, respectively, and parts of the electrodes RME may remain on the bridge electrodes BE in the electrode contact holes CTE1 and CTE2, respectively. A first electrode hole EH1 may penetrate a part of the first electrode RME1 to expose a part of the upper surface of the first bridge electrode BE1, and a second electrode hole EH2 may penetrate a part of the second electrode RME2 to expose a part of the upper surface of the second bridge electrode BE2.

Figure 16:
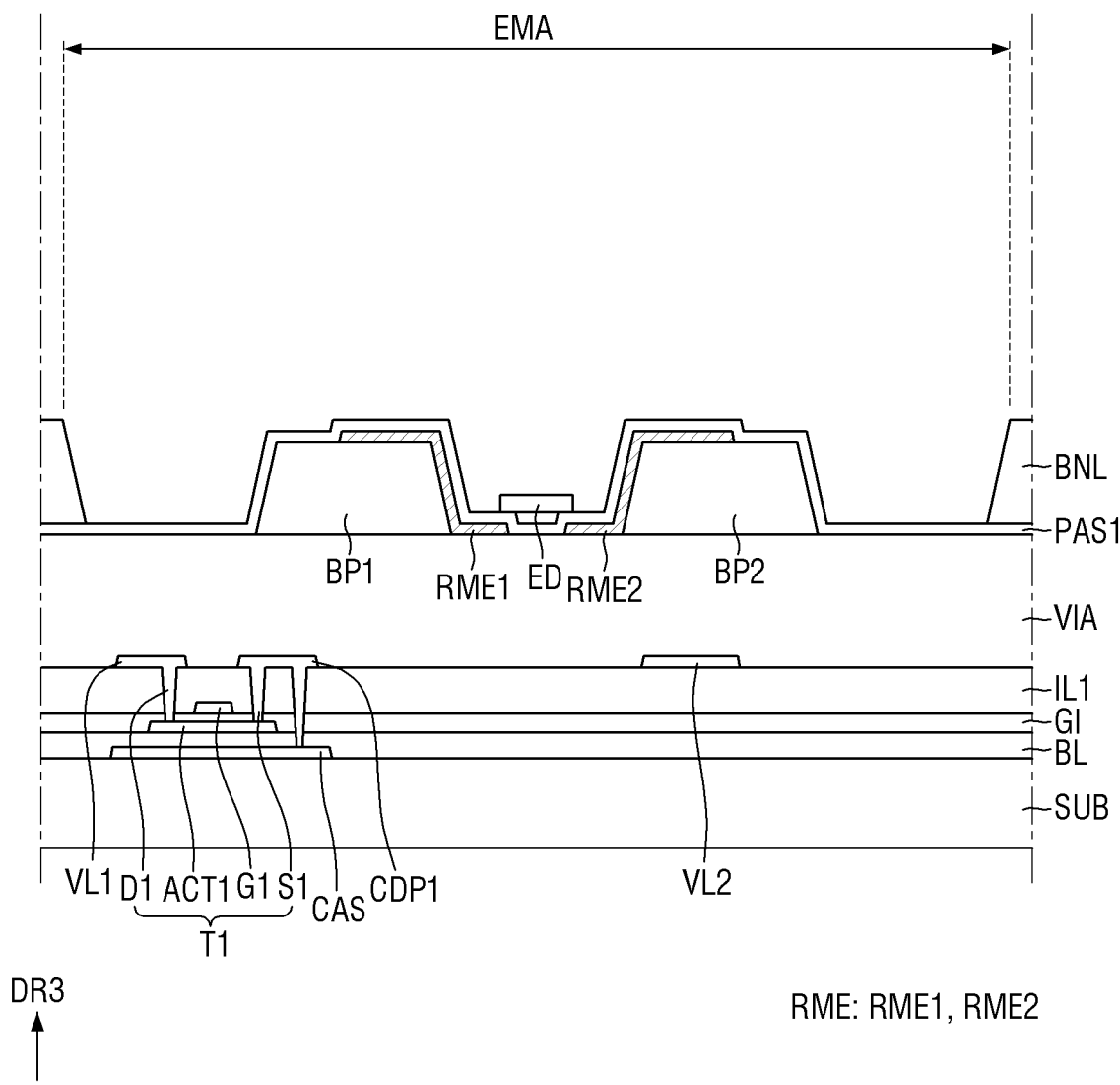
Figure 17:
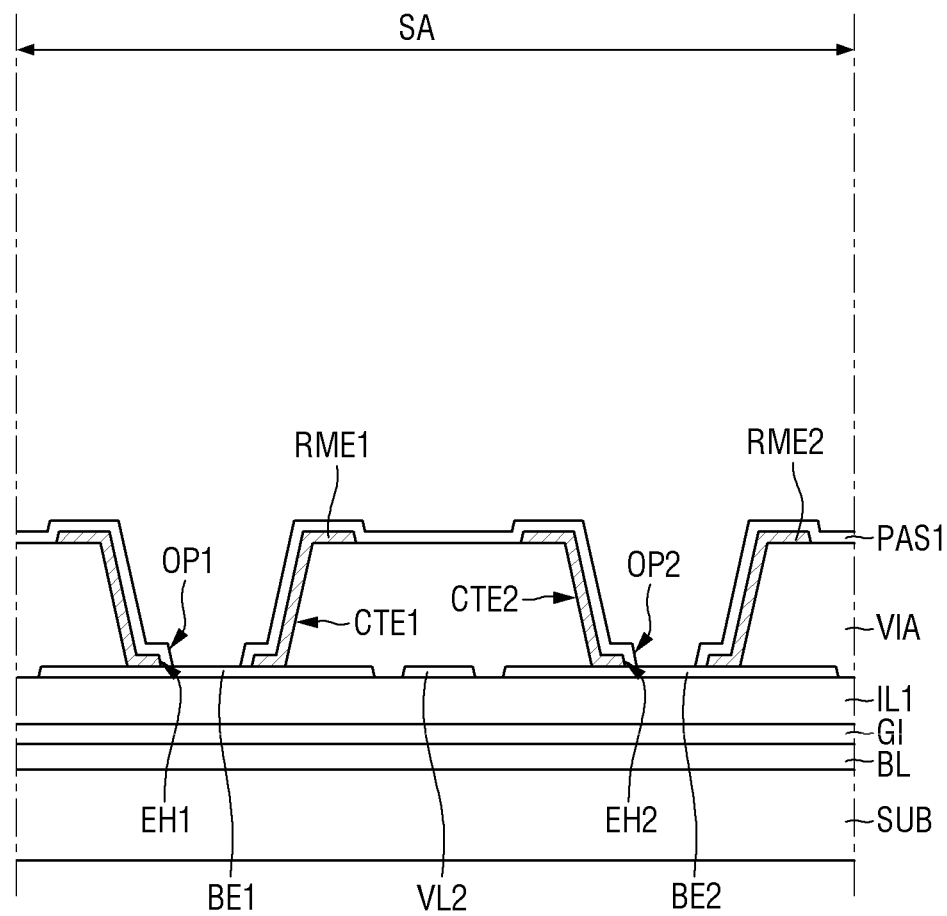

Next, referring to FIGS. 16 and 17, a first insulating layer PAS1 partially covering the electrodes RME and a bank layer BNL located on the first insulating layer PAS1 are formed, and the light emitting elements ED are placed on the first electrode RME1 and the second electrode RME2.

The first insulating layer PAS1 may be entirely located on the display area DPA to cover the electrodes RME, but may define openings OP1 and OP2 partially exposing the upper surfaces of the electrodes RME in the sub-area SA. A first opening OP1 may be located in the first electrode contact hole CTE1 and the first electrode hole EH1, and may expose a part of the upper surface of the first bridge electrode BE1. A second opening OP2 may be located in the second electrode contact hole CTE2 and the second electrode hole EH2, and may expose a part of the upper surface of the second bridge electrode BE2. The openings OP1 and OP2 may be smaller than the electrode holes EH1 and EH2, respectively, and the first insulating layer PAS1 may completely cover parts of the electrodes RME that are located in the electrode contact holes CTE1 and CTE2.

In some embodiments, a plurality of light emitting elements ED may be placed on the electrodes RME through an inkjet printing process. When an electrical signal is transmitted to the electrodes RME, after ink in which the light emitting elements ED are dispersed is sprayed into an area surrounded by the bank layer BNL, the light emitting elements ED may be mounted on the electrodes RME as the position and orientation direction of the light emitting elements ED in the ink change.

Figure 18:
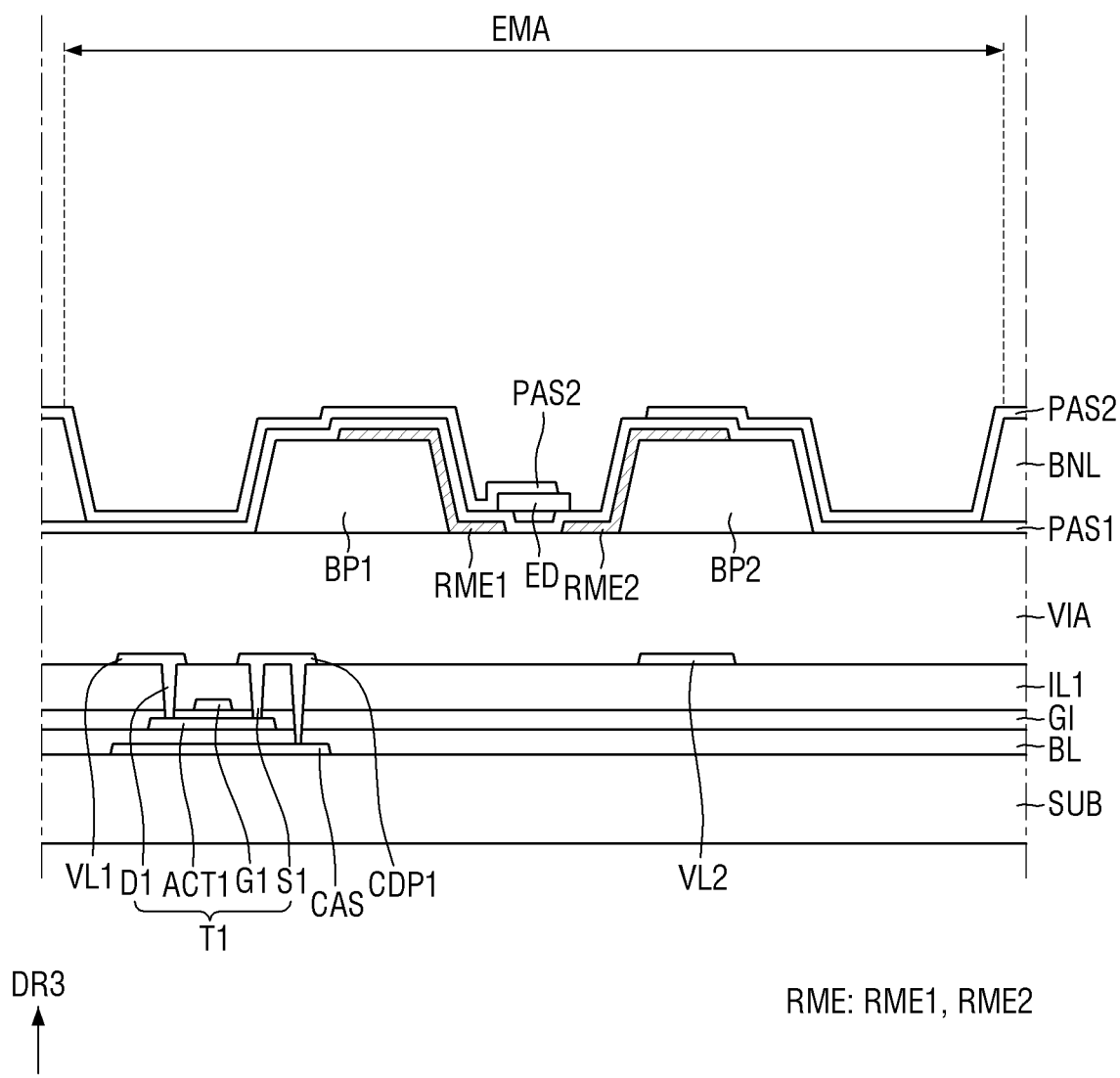
Figure 19:
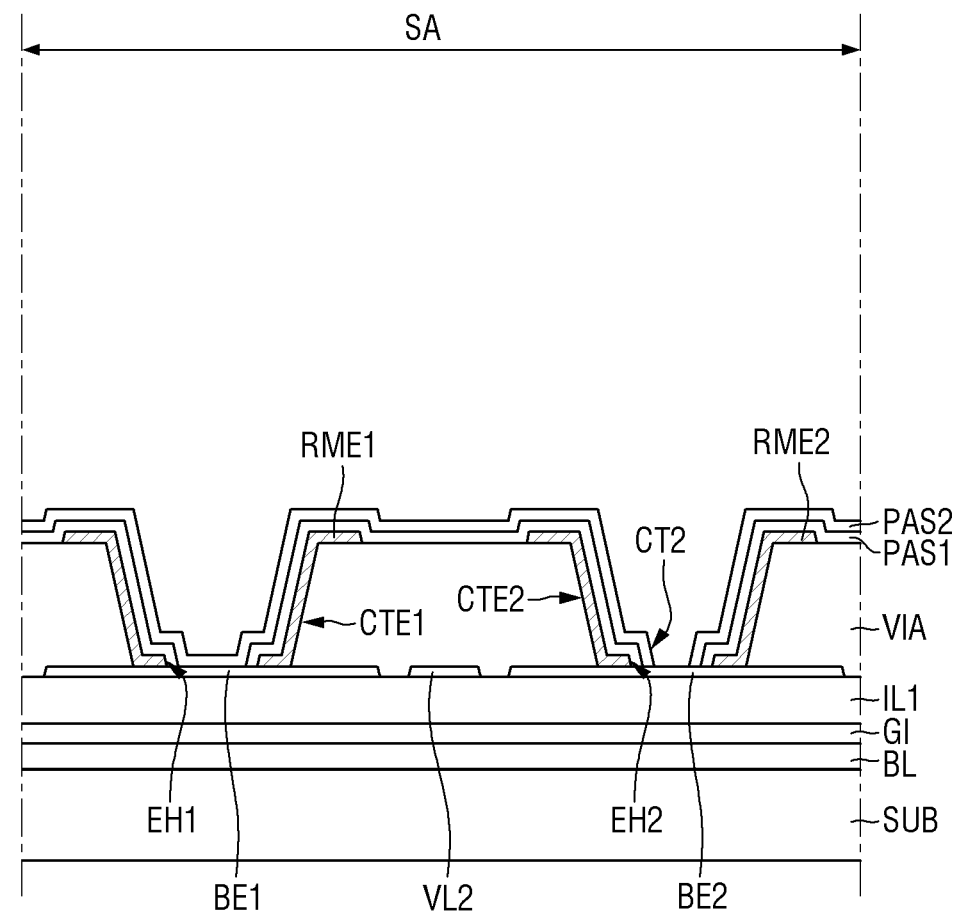

Next, referring to FIGS. 18 and 19, a second insulating layer PAS2 is formed on the light emitting elements ED and the first insulating layer PAS1. The second insulating layer PAS2 may cover and fix (e.g., affix) the light emitting elements ED. The second insulating layer PAS2 may be entirely formed on the first insulating layer PAS1 in the display area DPA, and then may be patterned not to cover the second opening OP2 and one side of each light emitting element ED. A second contact part CT2 may be formed in a part of the second insulating layer PAS2 that overlaps the second opening OP2, and the upper surface of the second bridge electrode BE2 may be exposed by the second contact part CT2. A part where the second insulating layer PAS2 is patterned may be a part where a second connection electrode CNE2 is located.

Figure 20:
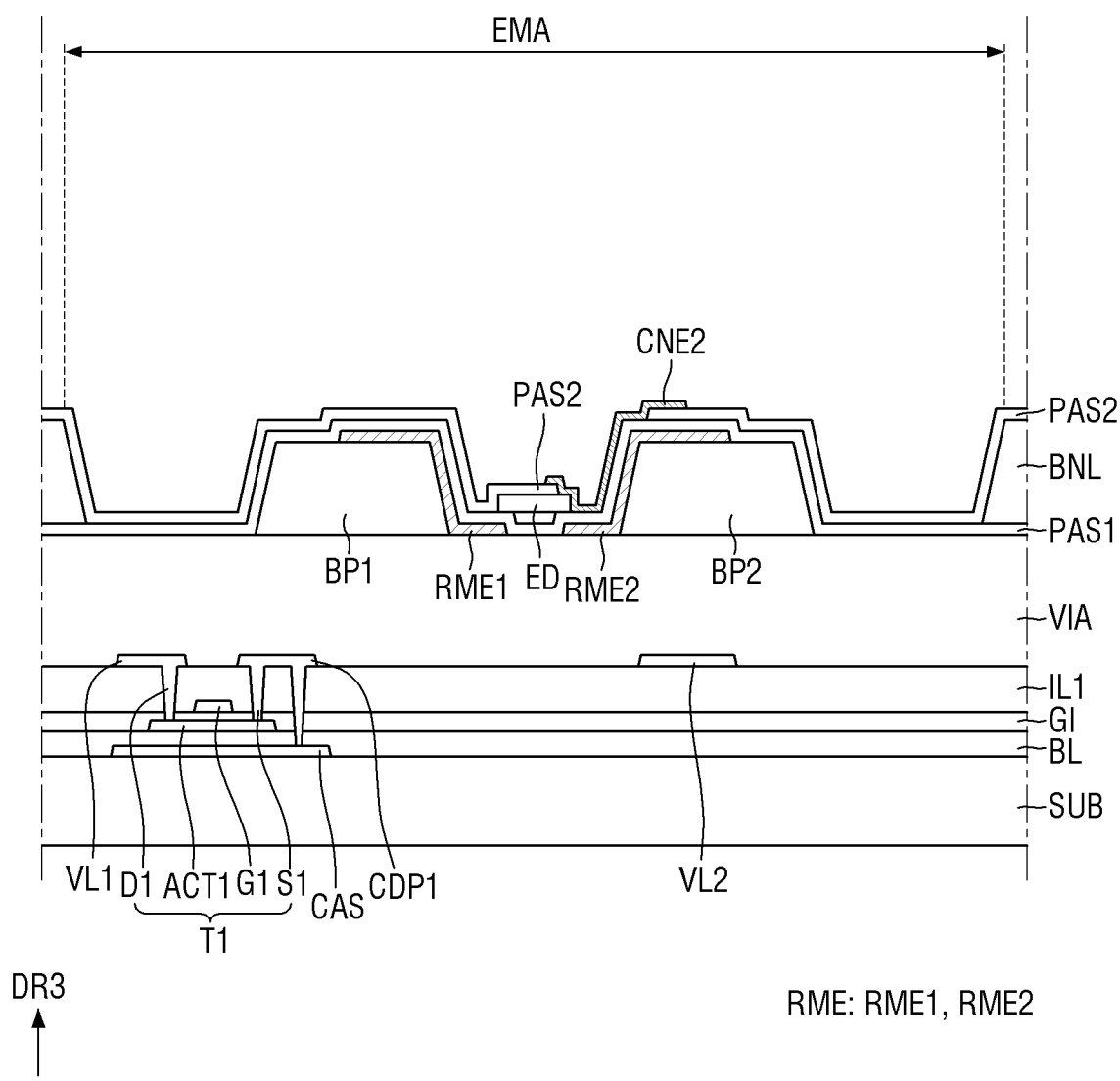
Figure 21:
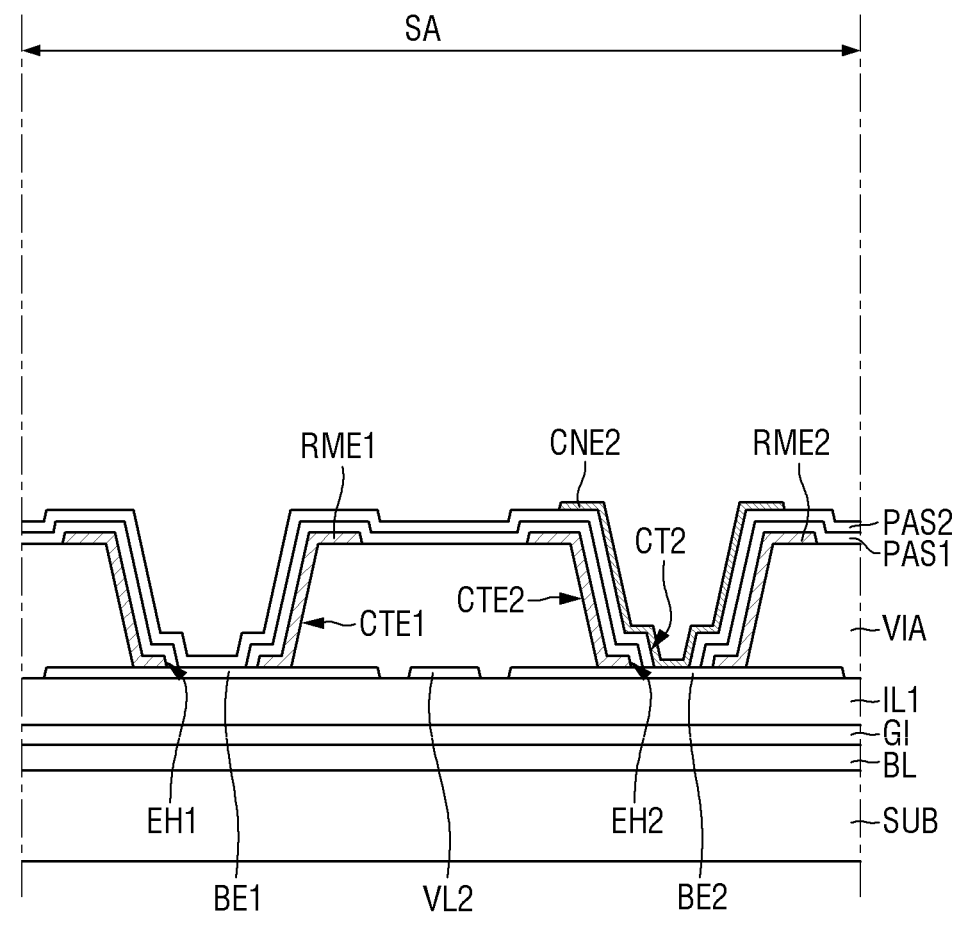

Next, referring to FIGS. 20 and 21, the second connection electrode CNE2 is formed in an area exposed by the second insulating layer PAS2. The second connection electrode CNE2 may be located on the second electrode RME2, and may contact one end of each light emitting element ED exposed by the second insulating layer PAS2 and may contact the second bridge electrode BE2 exposed by the second contact part CT2.

Figure 22:
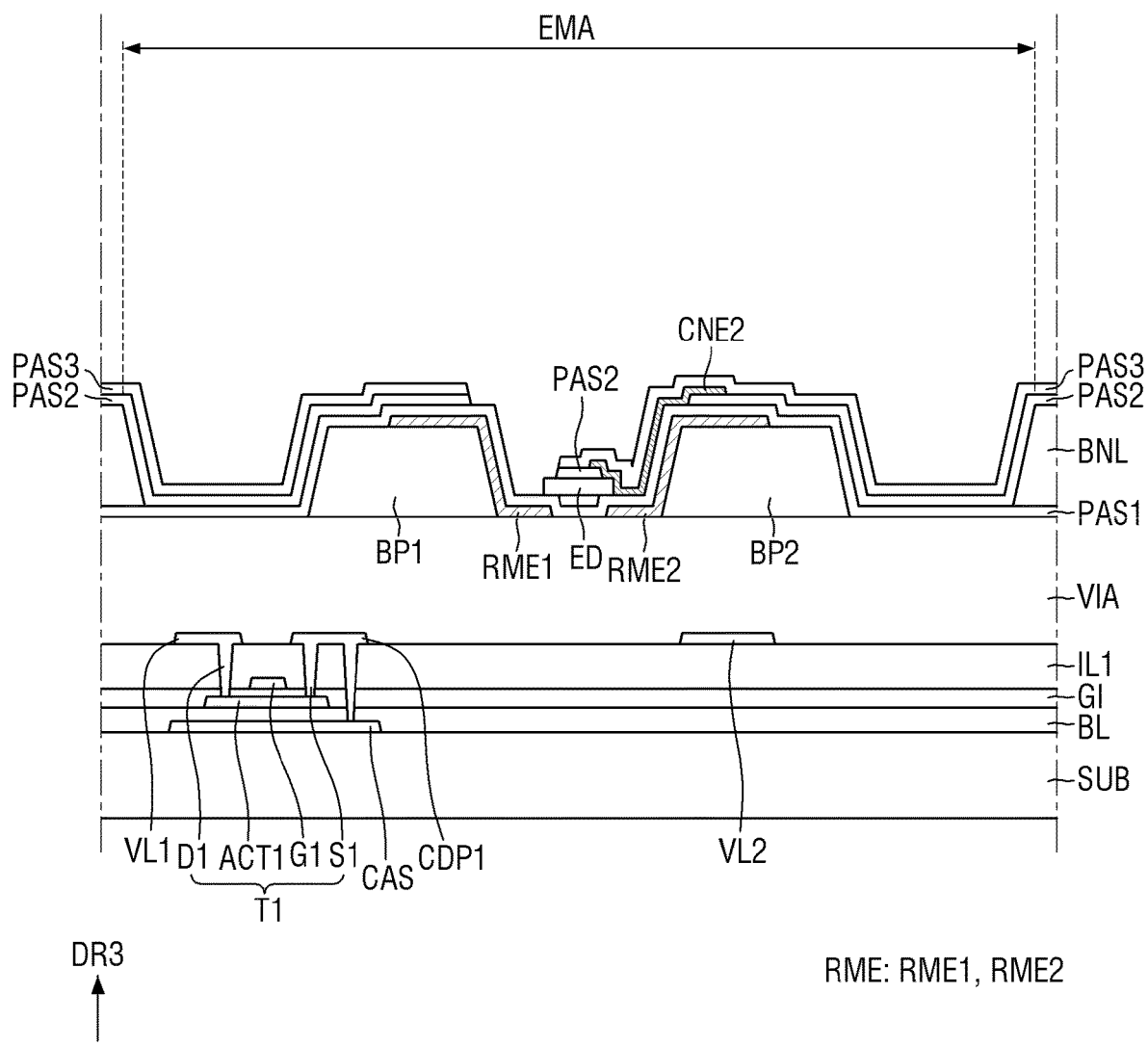
Figure 23:
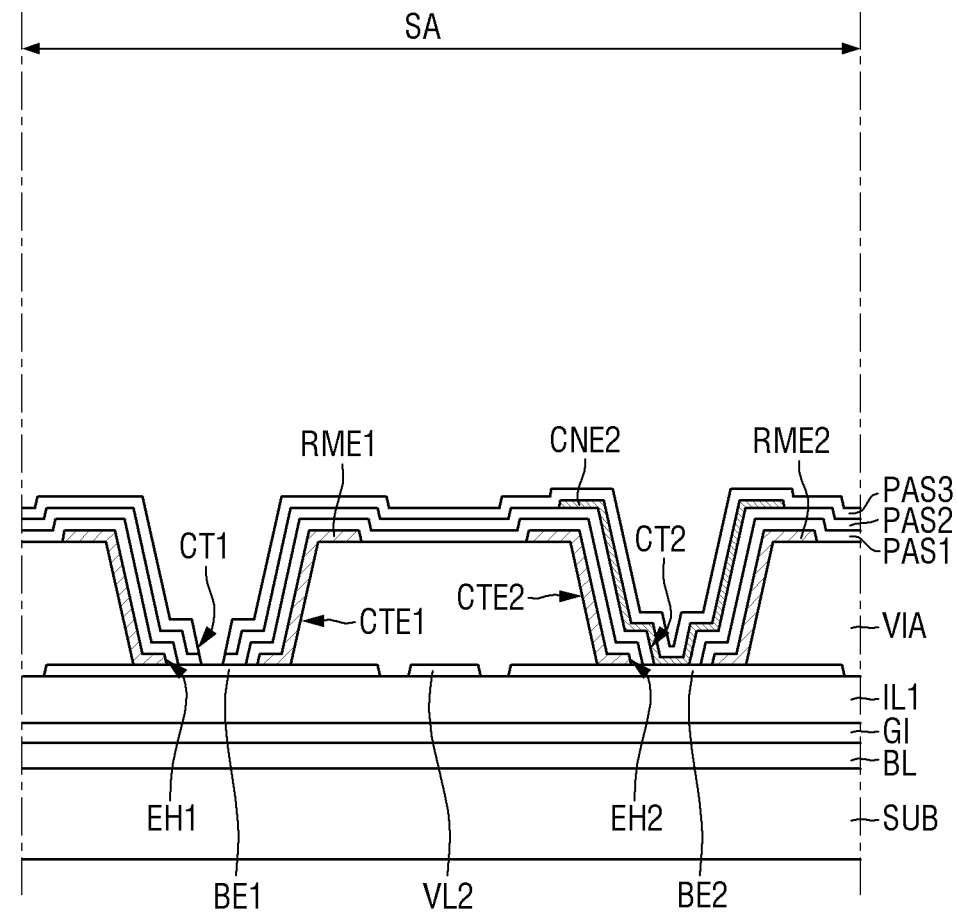

Next, referring to FIGS. 22 and 23, a third insulating layer PAS3 is formed on the second insulating layer PAS2 and the second connection electrode CNE2. The third insulating layer PAS3 may be formed to cover the second insulating layer PAS2 and the second connection electrode CNE2 in the display area DPA, and then may be patterned not to cover the first opening OP1 and the other side of each light emitting element ED. The third insulating layer PAS3 and the second insulating layer PAS2 may be concurrently or substantially simultaneously removed in a process in which they are patterned to expose the other side of each light emitting element ED. Similarly, the second insulating layer PAS2 and the third insulating layer PAS3 may be concurrently or substantially simultaneously patterned in a part overlapping the first opening OP1 to form a first contact part CT1 exposing the upper surface of the first bridge electrode BE1. A part where the third insulating layer PAS3 is patterned may be a part where a first connection electrode CNE1 is located.

Next, in some embodiments, the first connection electrode CNE1 is formed in an area exposed by the third insulating layer PAS3. The first connection electrode CNE1 may be located on the first electrode RME1 and may contact one end of each light emitting element ED exposed by the second insulating layer PAS2, and may contact the third insulating layer PAS3 and the first bridge electrode BE1 exposed by the first contact part CT1. Through the above process, the display device 10 in which the electrodes RME and the connection electrodes CNE are electrically connected through the bridge electrodes BE can be manufactured.

Various embodiments of the display device 10 will now be described with further reference to other drawings.

Figure 24:
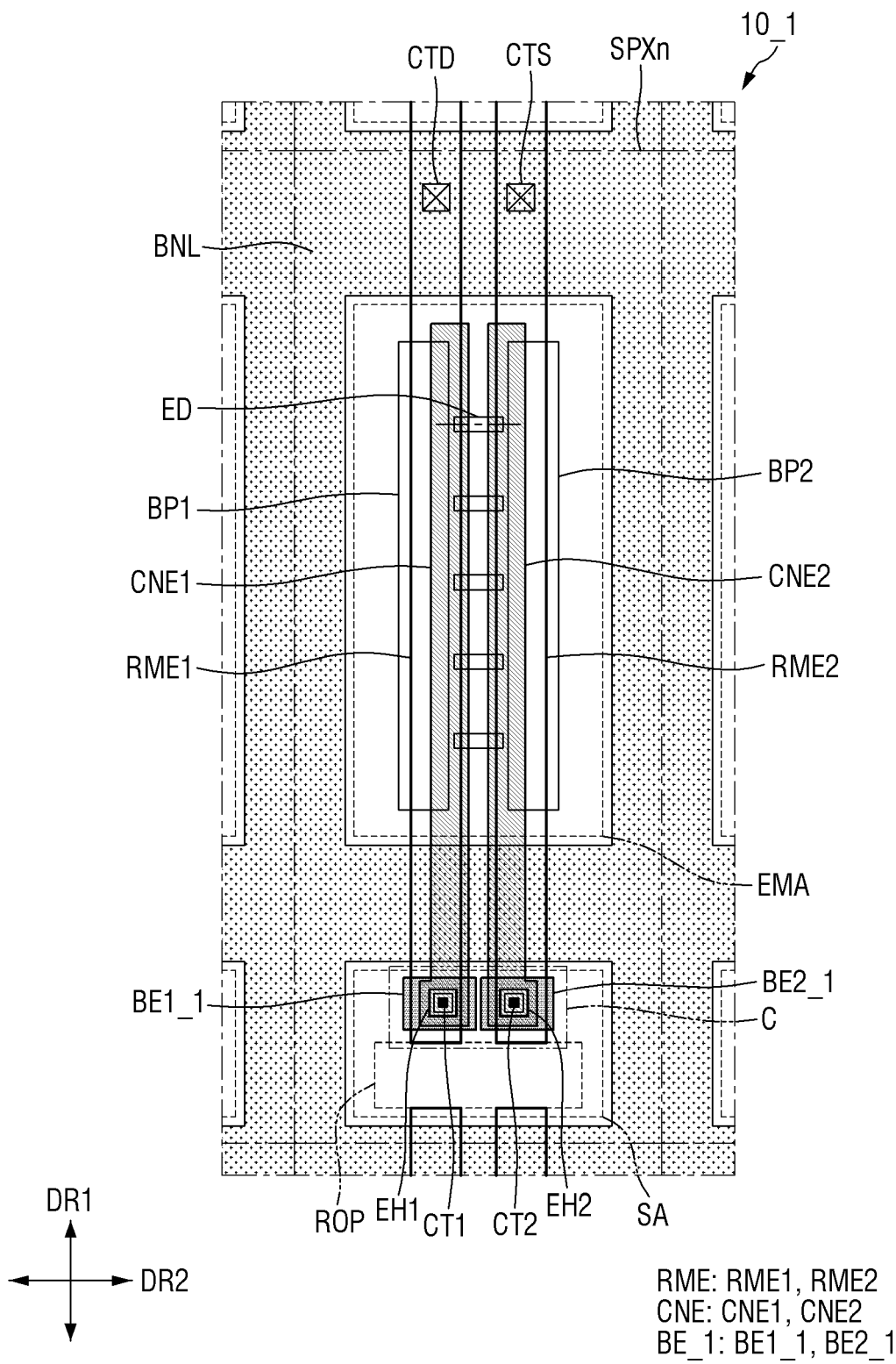
FIG. 24 is a plan view of a subpixel of a display device according to some embodiments.
Figure 25:
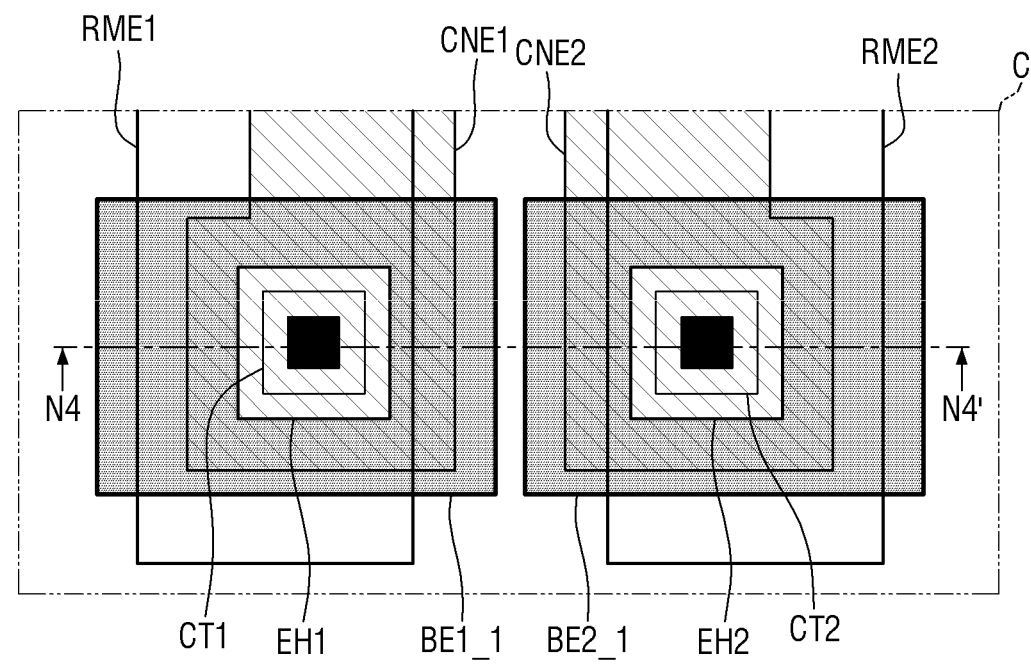
FIG. 25 is an enlarged view of part C of FIG. 24.
Figure 26:
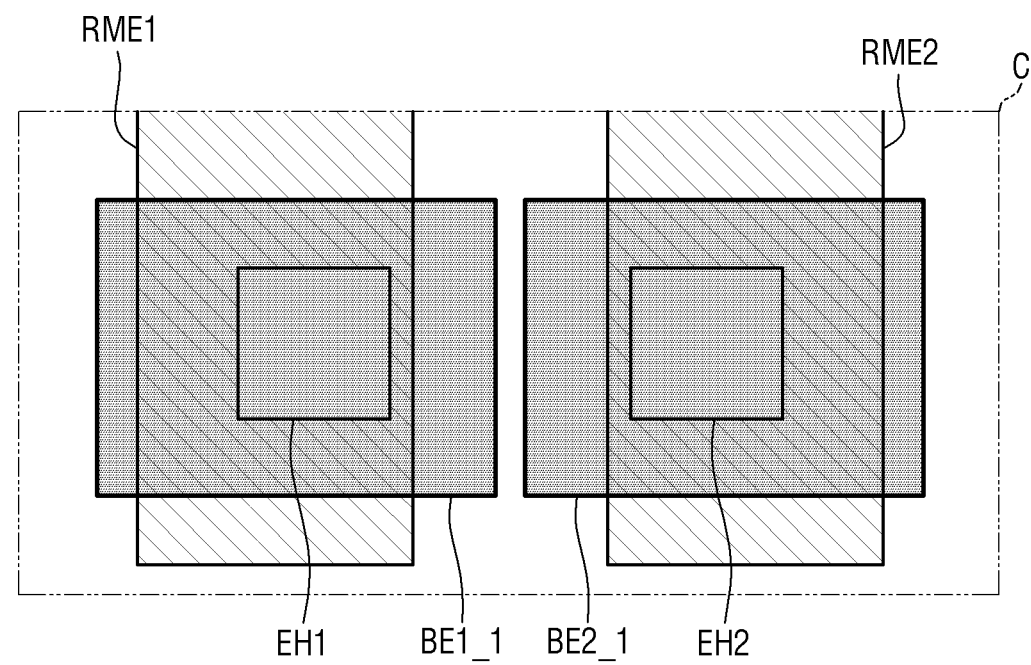
FIG. 26 is a plan view of electrodes and bridge electrodes illustrated in FIG. 25.
Figure 26:
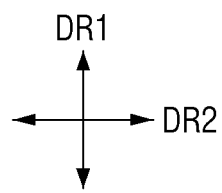
Figure 27:
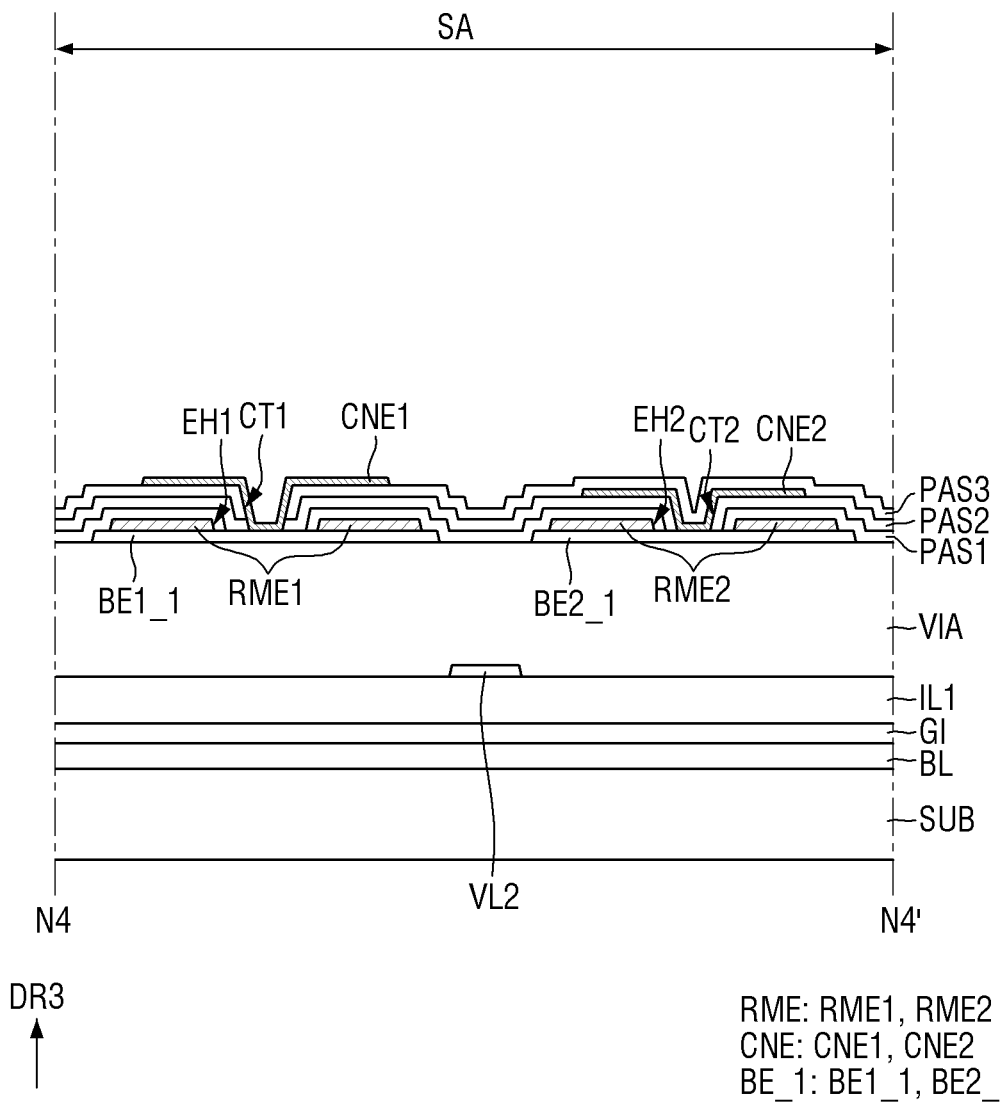
FIG. 27 is a cross-sectional view taken along the line N4-N4' of FIG. 25.

FIG. 24 is a plan view of a subpixel SPXn of a display device 10_1 according to some embodiments. FIG. 25 is an enlarged view of part C of FIG. 24. FIG. 26 is a plan view of electrodes RME and bridge electrodes BE_1 illustrated in FIG. 25. FIG. 27 is a cross-sectional view taken along the line N4-N4' of FIG. 25. FIG. 25 is an enlarged view of an area in which the bridge electrodes BE_1 are located in a sub-area SA of a subpixel SPXn, and FIG. 27 illustrates a cross section across a first bridge electrode BE1_1 and a second bridge electrode BE2_1.

Referring to FIGS. 24 through 27, in the display device 10_1 according to some embodiments, the bridge electrodes BE_1 (BE1_1 and BE2_1) may be directly located on a via layer VIA. A part of each of the electrodes RME may be directly located on a bridge electrode BE_1 located on the via layer VIA, and electrode contact holes CTE1 and CTE2 may not be formed in the via layer VIA. The current embodiments are different from embodiments of FIGS. 3 through 8 in that the bridge electrodes BE_1 are formed on the via layer VIA as a conductive layer different from a third conductive layer.

The first bridge electrode BE1_1 may be directly located on the via layer VIA in the sub-area SA, and a part of a first electrode RME1 that is located in the sub-area SA may be located on the first bridge electrode BE1_1. The second bridge electrode BE2_1 may be directly located on the via layer VIA in the sub-area SA, and a part of a second electrode RME2 that is located in the sub-area SA may be located on the second bridge electrode BE2_1. A process of forming the electrodes RME may be performed after a process of forming the bridge electrodes BE_1, and the first electrode RME1 and the second electrode RME2 may be located on the first bridge electrode BE1_1 and the second bridge electrode BE2_1, respectively.

Although the electrode contact holes CTE1 and CTE2 are omitted from the via layer VIA, each of the electrodes RME may include an electrode hole EH1 or EH2 partially exposing an upper surface of a bridge electrode BE_1. The electrodes RME may include the electrode holes EH1 and EH2 located in the sub-area SA, and the electrode holes EH1 and EH2 may be located on the bridge electrodes BE_1, respectively. In addition, similar to embodiments of FIG. 8, openings of a first insulating layer PAS1 may be located in the electrode holes EH1 and EH2, respectively, and a first contact part CT1 and a second contact part CT2 may be located in a first electrode hole EH1 and a second electrode hole EH2, respectively. A first connection electrode CNE1 may directly contact the first bridge electrode BE1_1 exposed through the first contact part CT1 and the first electrode hole EH1. A second connection electrode CNE2 may directly contact the second bridge electrode BE2_1 exposed through the second contact part CT2 and the second electrode hole EH2. The electrodes RME located on the bridge electrodes BE_1 may not directly contact the connection electrodes CNE due to the first insulating layer PAS1 covering the inside of the electrode holes EH1 and EH2, and due to a second insulating layer PAS2 and a third insulating layer PAS3 located on the first insulating layer PAS1.

In the display device 10_1 according to the current embodiments, because the bridge electrodes BE_1 are located as a layer that is different from the third conductive layer, the arrangement of voltage lines VL1 and VL2 and conductive patterns CDP1 and CDP2 of the third conductive layer can be designed relatively freely. In addition, the position of the bridge electrodes BE_1 can be designed in consideration of only the arrangement of the electrodes RME and the connection electrodes CNE regardless of wirings and patterns of the third conductive layer.

Figure 28:
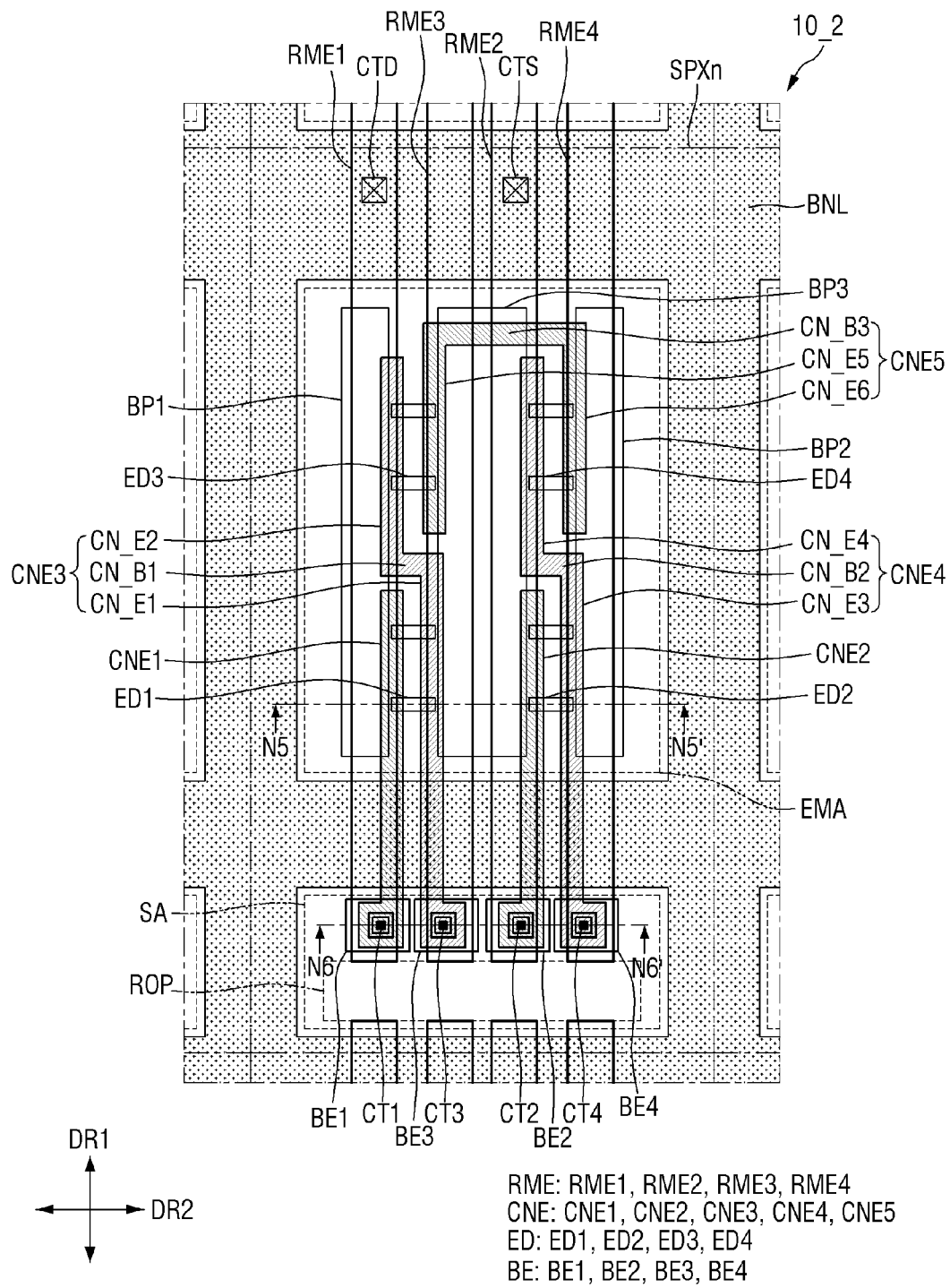
FIG. 28 is a plan view of a subpixel of a display device according to some embodiments.
Figure 29:
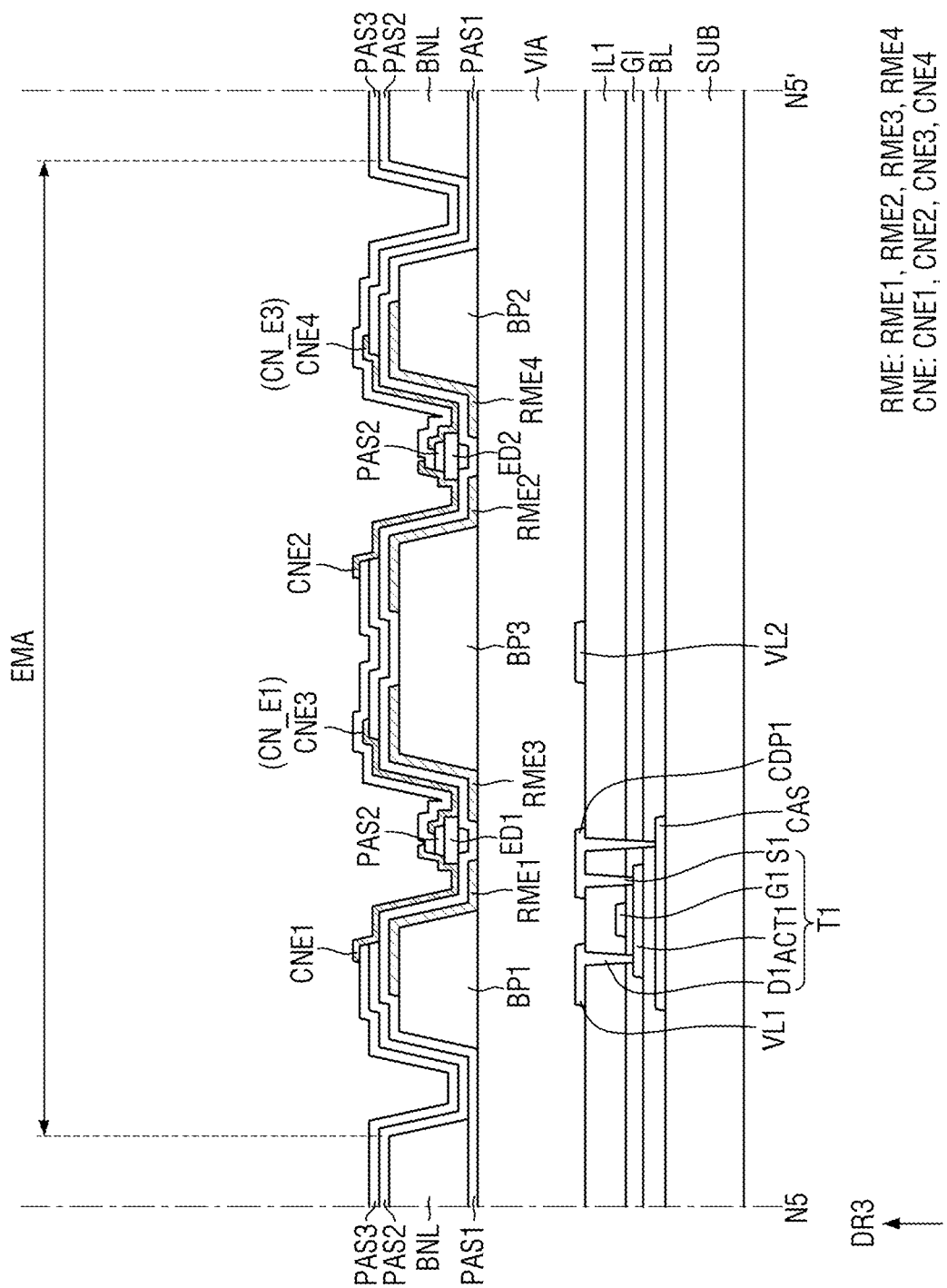
FIG. 29 is a cross-sectional view taken along the line N5-N5' of FIG. 28.
Figure 30:
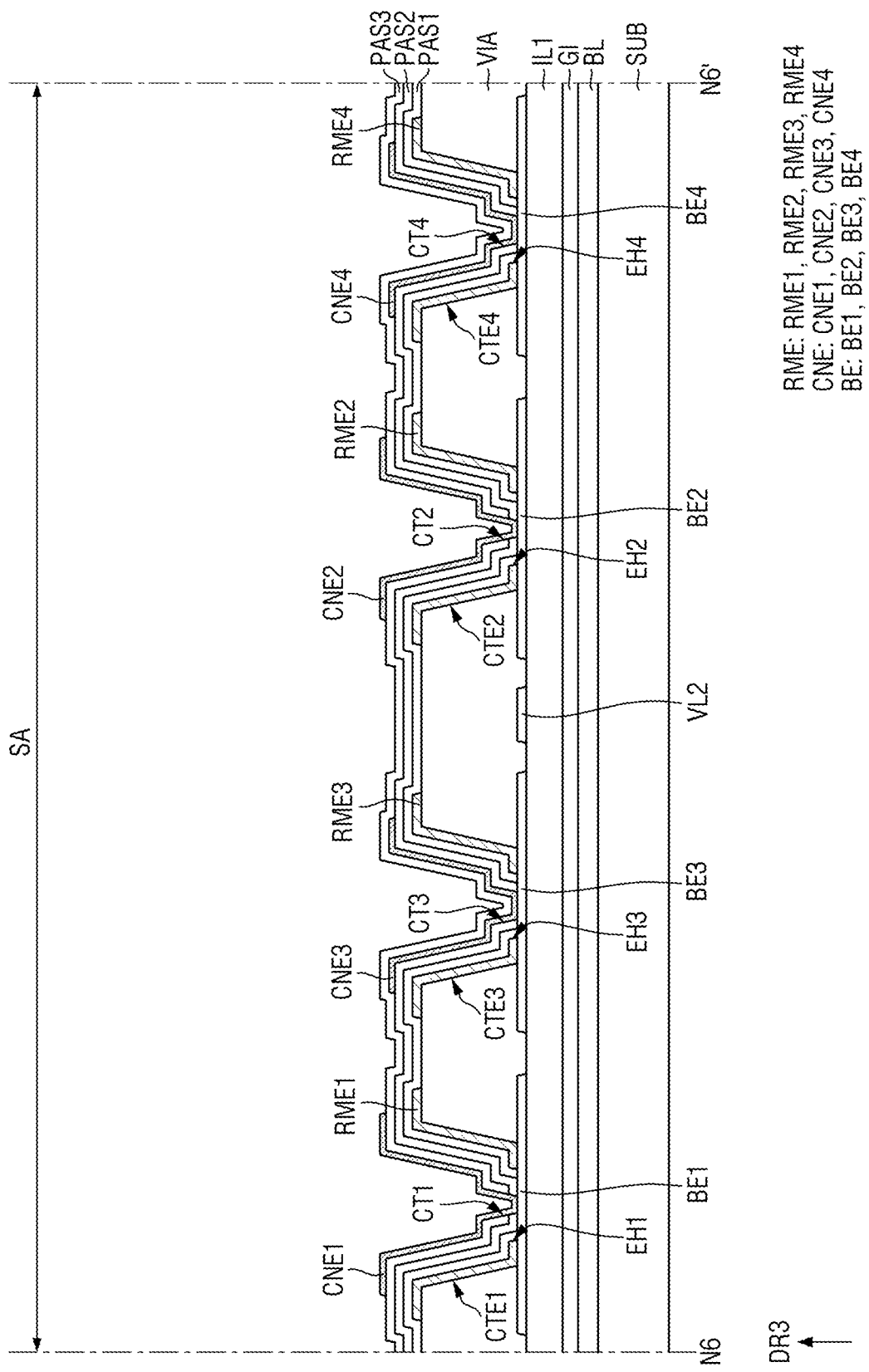
FIG. 30 is a cross-sectional view taken along the line N6-N6' of FIG. 28.

FIG. 28 is a plan view of a subpixel SPXn of a display device 10_2 according to some embodiments. FIG. 29 is a cross-sectional view taken along the line N5-N5' of FIG. 28. FIG. 30 is a cross-sectional view taken along the line N6-N6' of FIG. 28. FIG. 29 illustrates a cross section across both ends of a first light emitting element ED1 and a second light emitting element ED2, and FIG. 30 illustrates a cross section across a plurality of contact parts CT1 through CT4 of FIG. 28.

Referring to FIGS. 28 through 30, the display device 10_2 according to some embodiments may include a greater number of electrodes RME and a greater number of connection electrodes CNE, and an increased number of light emitting elements ED may be located in each subpixel SPXn. The current embodiments are different from embodiments of FIGS. 3 through 8 in the arrangement of bridge electrodes BE, the electrodes RME and the connection electrodes CNE of each subpixel SPXn and bank patterns BP1 through BP3. Any redundant description will be omitted, and differences will be mainly described below.

The bridge electrodes BE may include a third bridge electrode BE3 and a fourth bridge electrode BE4 in addition to a first bridge electrode BE1 and a second bridge electrode BE2. The third bridge electrode BE3 may be located between the first bridge electrode BE1 and the second bridge electrode BE2 in a sub-area SA, and the fourth bridge electrode BE4 may be located on a right side of the second bridge electrode BE2, which is one side in the second direction DR2. The bridge electrodes BE1 through BE4 may be spaced apart from each other in the second direction DR2 and may respectively overlap the electrodes RME (RME1 through RME4), which will be described later. In the current embodiments, the bridge electrodes BE may be located on a third conductive layer as in the embodiments of FIG. 8. A second voltage line VL2 may be located between the third bridge electrode BE3 and the second bridge electrode BE2, and a first voltage line VL1 may be located on a left side of the first bridge electrode BE1.

A plurality of electrode contact holes CTE1 through CTE4 exposing upper surfaces of the bridge electrodes BE may be located in a via layer VIA. A first electrode contact hole CTE1 may be located on the first bridge electrode BE1, a second electrode contact hole CTE2 may be located on the second bridge electrode BE2, a third electrode contact hole CTE3 may be located on the third bridge electrode BE3, and a fourth electrode contact hole CTE4 may be located on the fourth bridge electrode BE4. The upper surfaces of the bridge electrodes BE may be partially exposed by the electrode contact holes CTE1 through CTE4, respectively, and may directly contact the electrodes RME and the connection electrodes CNE, which will be described later.

The bank patterns BP1 through BP3 may further include a third bank pattern BP3 located between a first bank pattern BP1 and a second bank pattern BP2. The first bank pattern BP1 may be located on a left side of the center of an emission area EMA, the second bank pattern BP2 may be located on a right side of the center of the emission area EMA, and the third bank pattern BP3 may be located in the center of the emission area EMA. A width of the third bank pattern BP3 measured in the second direction DR2 may be greater than those of the first bank pattern BP1 and the second bank pattern BP2. A distance between the bank patterns BP1 through BP3 in the second direction DR2 may be greater than a distance between the electrodes RME. Accordingly, at least a part of each electrode RME may not overlap a bank pattern BP1, BP2, or BP3.

A plurality of electrodes RME located in each subpixel SPXn may include a third electrode RME3 and a fourth electrode RME4 in addition to a first electrode RME1 and a second electrode RME2.

The third electrode RME3 may be located between the first electrode RME1 and the second electrode RME2, and the fourth electrode RME4 may be spaced apart from the third electrode RME3 in the second direction DR2 with the second electrode RME2 interposed between them. The electrodes RME may be sequentially located in the order of the first electrode RME1, the third electrode RME3, the second electrode RME2, and the fourth electrode RME4 from the left to the right of each subpixel SPXn.

The first electrode RME1 and the second electrode RME2 among the electrodes RME may contact a second conductive pattern CDP2 and the second voltage line VL2 thereunder through contact holes CTD and CTS located under a bank layer BNL, but the third electrode RME3 and the fourth electrode RME4 may not. However, the first through fourth electrodes RME1 through RME4 may directly contact the bridge electrodes BE through the electrode contact holes CTE1 through CTE4 in the sub-area SA, respectively.

The first electrode RME1 may contact the first bridge electrode BE1 through the first electrode contact hole CTE1, and the second electrode RME2 may contact the second bridge electrode BE2 through the second electrode contact hole CTE2. The third electrode RME3 may contact the third bridge electrode BE3 through the third electrode contact hole CTE3, and the fourth electrode RME4 may contact the fourth bridge electrode BE4 through the fourth electrode contact hole CTE4. In addition, the electrodes RME may include electrode holes EH1 through EH4 located in the electrode contact holes CTE1 through CTE4 and exposing the upper surfaces of the bridge electrodes BE. The first through fourth electrodes RME1 through RME4 include a first electrode hole EH1, a second electrode hole EH2, a third electrode hole EH3, and a fourth electrode hole EH4, respectively.

In some embodiments in which the bridge electrodes BE are formed of the third conductive layer, each of the electrodes RME may directly contact the third conductive layer. However, the first electrode RME1 and the second electrode RME2 may be first type electrodes to which a respective voltage is directly applied through the contact holes CTD and CTS, respectively, and the third electrode RME3 and the fourth electrode RME4 may be second type electrodes to which a voltage is not directly applied. The second type electrodes may provide an electrical connection path between the light emitting elements ED together with the connection electrodes CNE.

A plurality of light emitting elements ED may be located between the bank patterns BP1 through BP3 or on different electrodes RME. Some of the light emitting elements ED may be located between the first bank pattern BP1 and the third bank pattern BP3, and the others may be located between the third bank pattern BP3 and the second bank pattern BP2. According to some embodiments, the light emitting elements ED may include first light emitting elements ED1 and third light emitting elements ED3 located between the first bank pattern BP1 and the third bank pattern BP3, and second light emitting elements ED2 and fourth light emitting elements ED4 located between the third bank pattern BP3 and the second bank pattern BP2. Each of the first light emitting elements ED1 and the third light emitting elements ED3 may be located on the first electrode RME1 and the third electrode RME3, and each of the second light emitting elements ED2 and the fourth light emitting elements ED4 may be located on the second electrode RME2 and the fourth electrode RME4. The first light emitting elements ED1 and the second light emitting elements ED2 may be located adjacent to a lower side or the sub-area SA in the emission area EMA of a corresponding subpixel SPXn, and the third light emitting elements ED3 and the fourth light emitting elements ED4 may be located adjacent to an upper side in the emission area EMA of the corresponding subpixel SPXn. However, the light emitting elements ED are not classified according to their position in the emission area EMA, but may be classified according to their connection relationship with the connection electrodes CNE, which will be described later. Both ends of each light emitting element ED may contact different respective connection electrodes CNE according to the arrangement structure of the connection electrodes CNE, and the light emitting elements ED may be classified into different light emitting elements ED according to types of the connection electrodes CNE that they contact.

A first insulating layer PAS1 may be located in substantially the same manner as described above with reference to embodiments of FIGS. 3 through 8. The first insulating layer PAS1 may be entirely located in the emission area EMA and the subpixel SPXn to cover the electrodes RME, but may include, or define, a plurality of openings located in the electrode holes EH1 through EH4 of the electrodes RME. The openings may respectively be smaller than the electrode holes EH1 through EH4 and may expose the upper surfaces of the bridge electrodes BE, and the first insulating layer PAS1 may cover a part of each electrode RME, which is located in the electrode contact hole CTE1, CTE2, CTE3, or CTE4.

A plurality of connection electrodes CNE may include a third connection electrode CNE3, a fourth connection electrode CNE4, and a fifth connection electrode CNE5 located across a plurality of electrodes RME in addition to a first connection electrode CNE1 located on the first electrode RME1 and a second connection electrode CNE2 located on the second electrode RME2.

Unlike in embodiments of FIGS. 3 through 8, each of the first connection electrode CNE1 and the second connection electrode CNE2 may have a relatively short length in the first direction DR1. The first connection electrode CNE1 and the second connection electrode CNE2 may be located below the center of the emission area EMA. The first connection electrode CNE1 and the second connection electrode CNE2 may be located over the emission area EMA and the sub-area SA of a corresponding subpixel SPXn, and may contact the first bridge electrode BE1 and the second bridge electrode BE2 through a first contact part CT1 and a second contact part CT2 formed in the sub-area SA, respectively. The first contact part CT1 and the second contact part CT2 may penetrate a second insulating layer PAS2 and a third insulating layer PAS3, and may be located in the first electrode hole EH1 and the second electrode hole EH2, respectively.

The third connection electrode CNE3 may include a first extension part CN_E1 located on the third electrode RME3, a second extension part CN_E2 located on the first electrode RME1, and a first connection part CN_B1 connecting the first extension part CN_E1 and the second extension part CN_E2. The first extension part CN_E1 may be spaced apart from the first connection electrode CNE1 in the second direction DR2 to face the first connection electrode CNE1, and the second extension part CN_E2 may be spaced apart from the first connection electrode CNE1 in the first direction DR1. The first extension part CN_E1 may be located on the lower side of the emission area EMA of a corresponding subpixel SPXn, and the second extension part CN_E2 may be located on the upper side of the emission area EMA. The first extension part CN_E1 may be located over the emission area EMA and the sub-area SA to contact the third bridge electrode BE3 through a third contact part CT3 formed in the sub-area SA. The third contact part CT3 may penetrate the second insulating layer PAS2 and may be located in the third electrode hole EH3. Because the third connection electrode CNE3 is located under the third insulating layer PAS3, the third insulating layer PAS3 may be located on the third contact part CT3. The first connection part CN_B1 may be located across the first electrode RME1 and the third electrode RME3 in the center of the emission area EMA. The third connection electrode CNE3 may generally extend in the first direction DR1, but may be bent in the second direction DR2 and then may extend again in the first direction DR1.

The fourth connection electrode CNE4 may include a third extension part CN_E3 located on the fourth electrode RME4, a fourth extension part CN_E4 located on the second electrode RME2, and a second connection part CN_B2 connecting the third extension part CN_E3 and the fourth extension part CN_E4. The third extension part CN_E3 may be spaced apart from the second connection electrode CNE2 in the second direction DR2 to face the second connection electrode CNE2, and the fourth extension part CN_E4 may be spaced apart from the second connection electrode CNE2 in the first direction DR1. The third extension part CN_E3 may be located on the lower side of the emission area EMA of a corresponding subpixel SPXn, and the fourth extension part CN_E4 may be located on the upper side of the emission area EMA. The third extension part CN_E3 may be located over the emission area EMA and the sub-area SA to contact the fourth bridge electrode BE4 through a fourth contact part CT4. The fourth contact part CT4 may penetrate the second insulating layer PAS2, and may be located in the fourth electrode hole EH4. Because the fourth connection electrode CNE4 is located under the third insulating layer PAS3, the third insulating layer PAS3 may be located on the fourth contact part CT4. The second connection part CN_B2 may be located across the second electrode RME2 and the fourth electrode RME4 in an area adjacent to the center of the emission area EMA. The fourth connection electrode CNE4 may generally extend in the first direction DR1, but may be bent in the second direction DR2 and then may extend again in the first direction DR1.

The fifth connection electrode CNE5 may include a fifth extension part CN_E5 located on the third electrode RME3, a sixth extension part CN_E6 located on the fourth electrode RME4, and a third connection part CN_B3 connecting the fifth extension part CN_E5 and the sixth extension part CN_E6. The fifth extension part CN_E5 may be spaced apart from the second extension part CN_E2 of the third connection electrode CNE3 in the second direction DR2 to face the second extension part CN_E2, and the sixth extension part CN_E6 may be spaced apart from the fourth extension part CN_E4 of the fourth connection electrode CNE4 in the second direction DR2 to face the fourth extension part CN_E4. Each of the fifth extension part CN_E5 and the sixth extension part CN_E6 may be located on the upper side of the emission area EMA, and the third connection part CN_B3 may be located across the third electrode RME3, the second electrode RME2 and the fourth electrode RME4. The fifth connection electrode CNE5 may surround the fourth extension part CN_E4 of the fourth connection electrode CNE4 in plan view.

The first connection electrode CNE1 and the second connection electrode CNE2 may be first type connection electrodes electrically connected to the first electrode RME1 and the second electrode RME2, respectively, the third connection electrode CNE3 and the fourth connection electrode CNE4 may be second type connection electrodes electrically connected to the third electrode RME3 and the fourth electrode RME4, respectively, and the fifth connection electrode CNE5 may be a third type connection electrode not directly connected to the electrodes RME.

As described above, the light emitting elements ED may be classified into different light emitting elements ED according to the connection electrodes CNE that both ends thereof respectively contact in the above arrangement structure of the connection electrodes CNE.

The first light emitting elements ED1 and the second light emitting elements ED2 may have a first end contacting a first type connection electrode, and a second end contacting a second type connection electrode. The first light emitting elements ED1 may contact the first connection electrode CNE1 and the third connection electrode CNE3, and the second light emitting elements ED2 may contact the second connection electrode CNE2 and the fourth connection electrode CNE4. The third light emitting elements ED3 and the fourth light emitting elements ED4 may have a first end contacting a second type connection electrode, and a second end contacting a third type connection electrode. The third light emitting elements ED3 may contact the third connection electrode CNE3 and the fifth connection electrode CNE5, and the fourth light emitting elements ED4 may contact the fourth connection electrode CNE4 and the fifth connection electrode CNE5.

The light emitting elements ED may be connected to each other in series through the connection electrodes CNE. Because the display device 10_2 according to the current embodiments include a greater number of light emitting elements ED in each subpixel SPXn and the light emitting elements ED are connected in series, the amount of light emitted per unit area can be increased.

Figure 31:
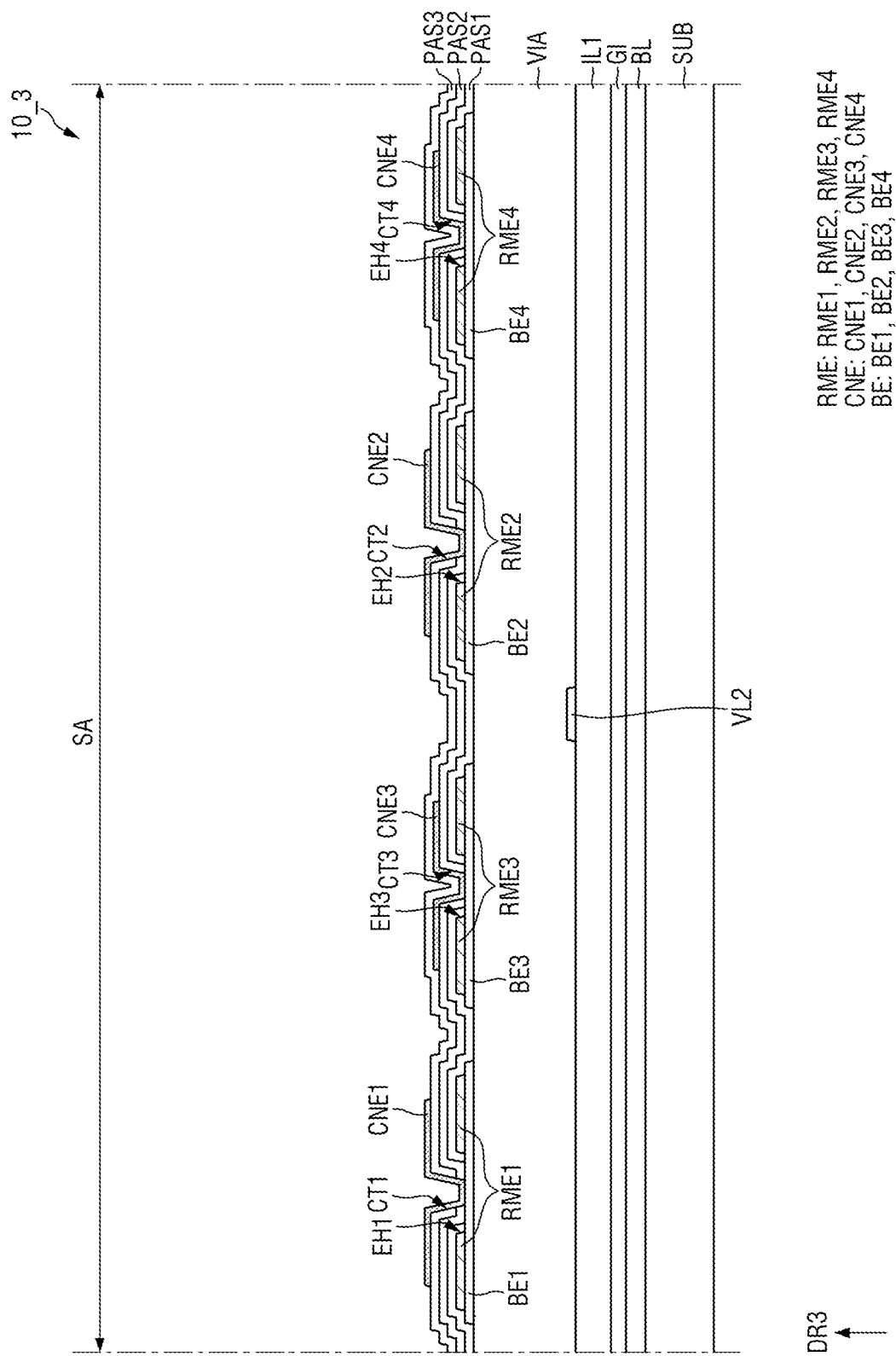
FIG. 31 illustrates a cross section across bridge electrodes of a display device according to some embodiments.

FIG. 31 illustrates a cross section across bridge electrodes BE of a display device 10_3 according to some embodiments.

Referring to FIG. 31, the display device 10_3 according to some embodiments may include four electrodes in each subpixel SPXn, and the bridge electrodes BE may be located on a via layer VIA. A plurality of electrode contact holes CTE1 through CTE4 may not be formed in the via layer VIA, and a part of each electrode RME (RME1, RME2, RME3, or RME4) may be directly located on a respective bridge electrode BE in a sub-area SA. The current embodiments are different from embodiments of FIG. 30 in that the bridge electrodes BE are not formed of a third conductive layer, but are directly located on the via layer VIA as in embodiments of FIG. 27. This is the same as described above in the above embodiments, and thus a detailed description thereof will be omitted.

Figure 32:
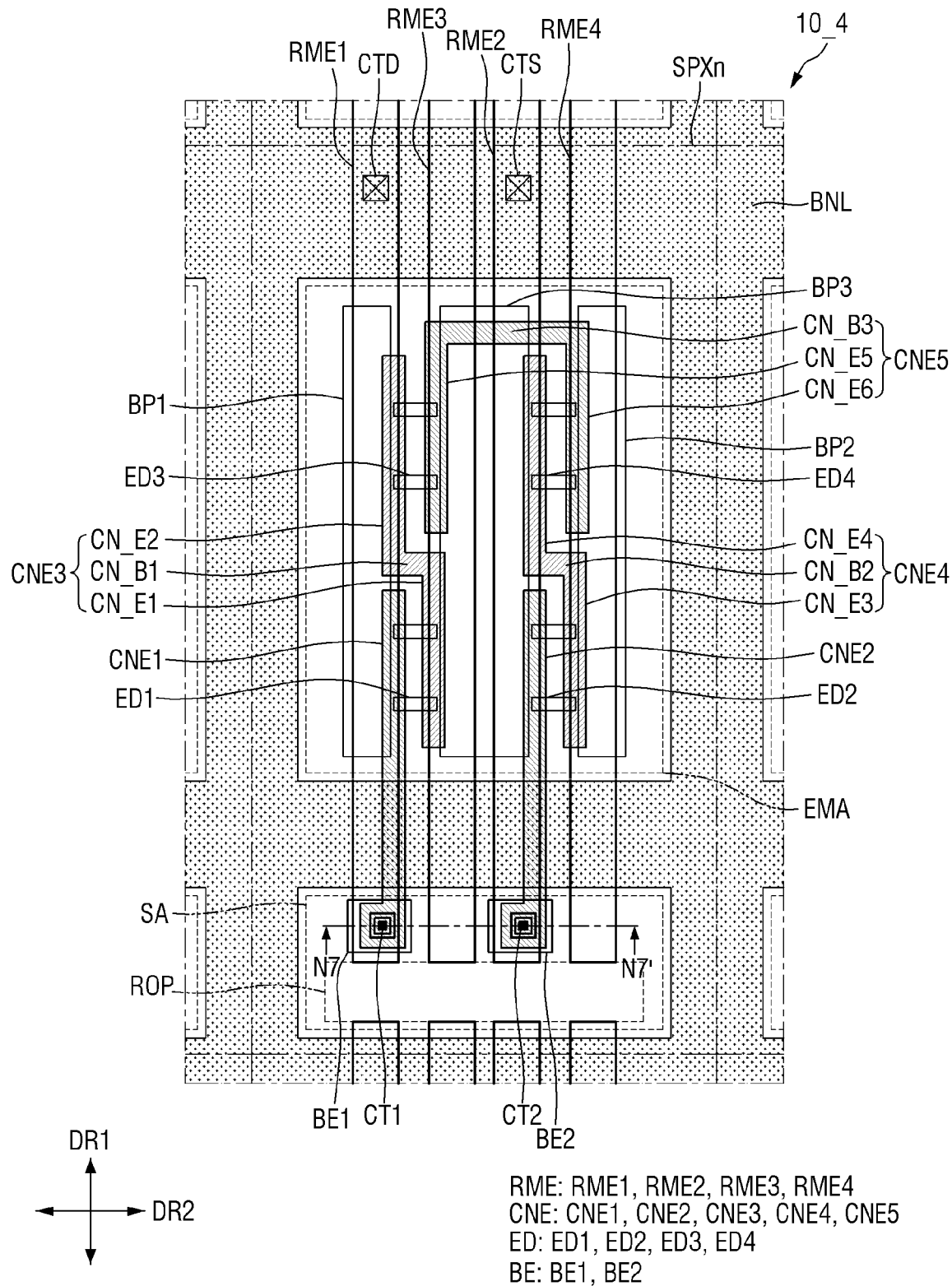
FIG. 32 is a plan view of a subpixel of a display device according to some embodiments.
Figure 33:
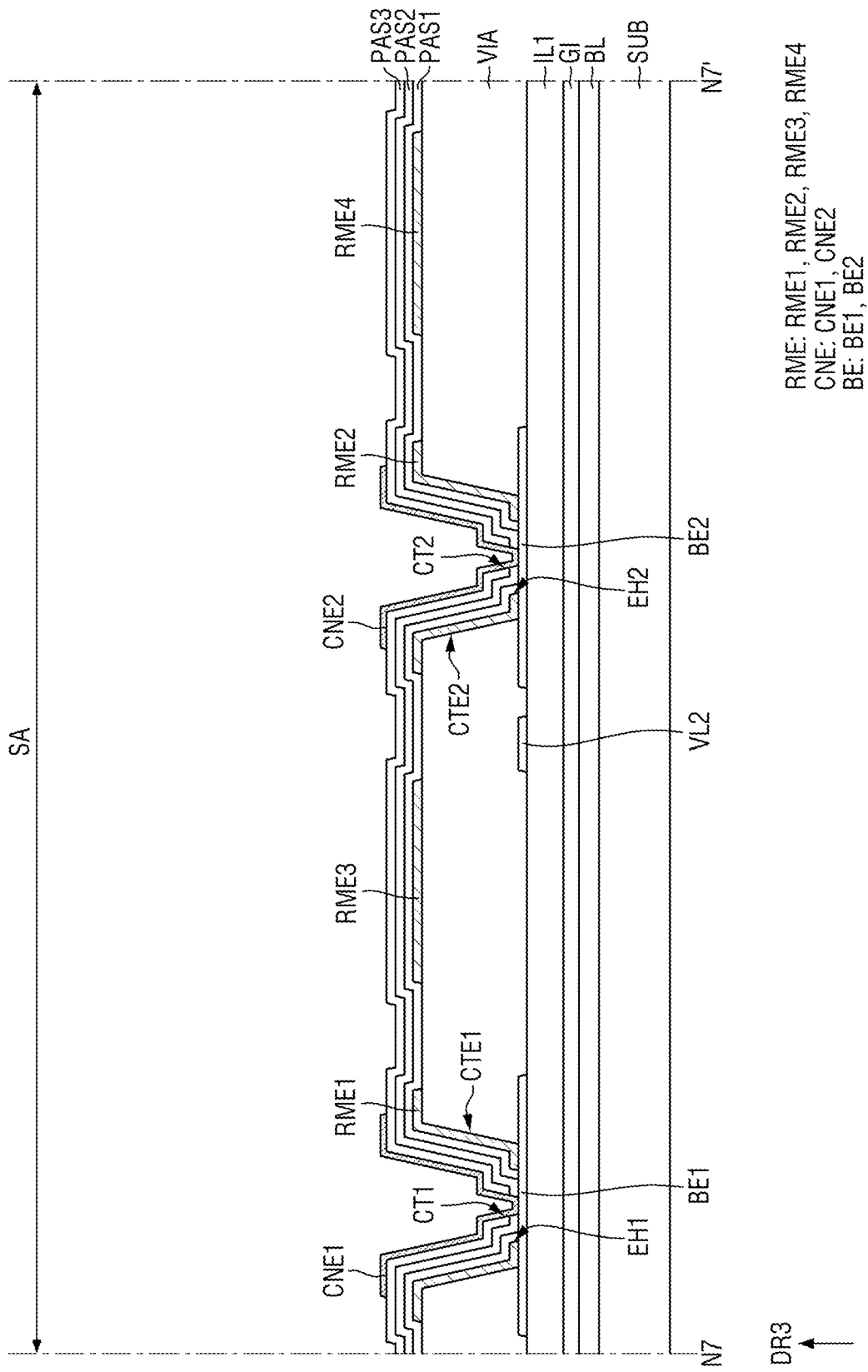
FIG. 33 is a cross-sectional view taken along the line N7-N7' of FIG. 32.

FIG. 32 is a plan view of a subpixel SPXn of a display device 10_4 according to some embodiments. FIG. 33 is a cross-sectional view taken along the line N7-N7' of FIG. 32. FIG. 33 illustrates a cross section taken in the second direction DR2 across an area in which bridge electrodes BE are located in a sub-area SA of a subpixel SPXn.

Referring to FIGS. 32 and 33, the display device 10_4 according to some embodiments may include four electrodes in each subpixel SPXn, and the bridge electrodes BE may include a first bridge electrode BE1 and a second bridge electrode BE2. A first electrode RME1 and a second electrode RME2 may be electrically connected to a first connection electrode CNE1 and a second connection electrode CNE2 through the first bridge electrode BE1 and the second bridge electrode BE2, respectively, but a third electrode RME3 and a fourth electrode RME4 may not be connected to a third connection electrode CNE3 and a fourth connection electrode CNE4.

As described above in embodiments of FIG. 30, the first connection electrode CNE1 and the second connection electrode CNE2 are first type connection electrodes electrically connected to the first electrode RME1 and the second electrode RME2, respectively. They are connection electrodes to which a respective voltage applied from each voltage line VL1 or VL2 is directly transmitted through the electrodes RME. On the other hand, the third connection electrode CNE3, the fourth connection electrode CNE4, and a fifth connection electrode CNE5 are connection electrodes contacting different light emitting elements ED1 through ED4. Although they are not necessarily directly electrically connected to the electrodes RME, they may form a connection path between the light emitting elements ED. Accordingly, the first connection electrode CNE1 and the second connection electrode CNE2 may be respectively electrically connected to the electrodes RME through the respective bridge electrodes BE, but other connection electrodes (e.g., CNE3, CNE4, and CNE5) may contact and may be connected to only the light emitting elements ED.

Lengths of a first extension part CN_E1 of the third connection electrode CNE3 and a third extension part CN_E3 of the fourth connection electrode CNE4 in the first direction DR1 may be less than those of embodiments of FIG. 30, and the third through fifth connection electrodes CNE3 through CNE5 may be located only in an emission area EMA. Because only the first bridge electrode BE1 and the second bridge electrode BE2 are located in the sub-area SA, only the first connection electrode CNE1 and the second connection electrode CNE2, a first electrode hole EH1 and a second electrode hole EH2, and a first electrode contact hole CTE1 and a second electrode contact hole CTE2 may be located.

Figure 34:
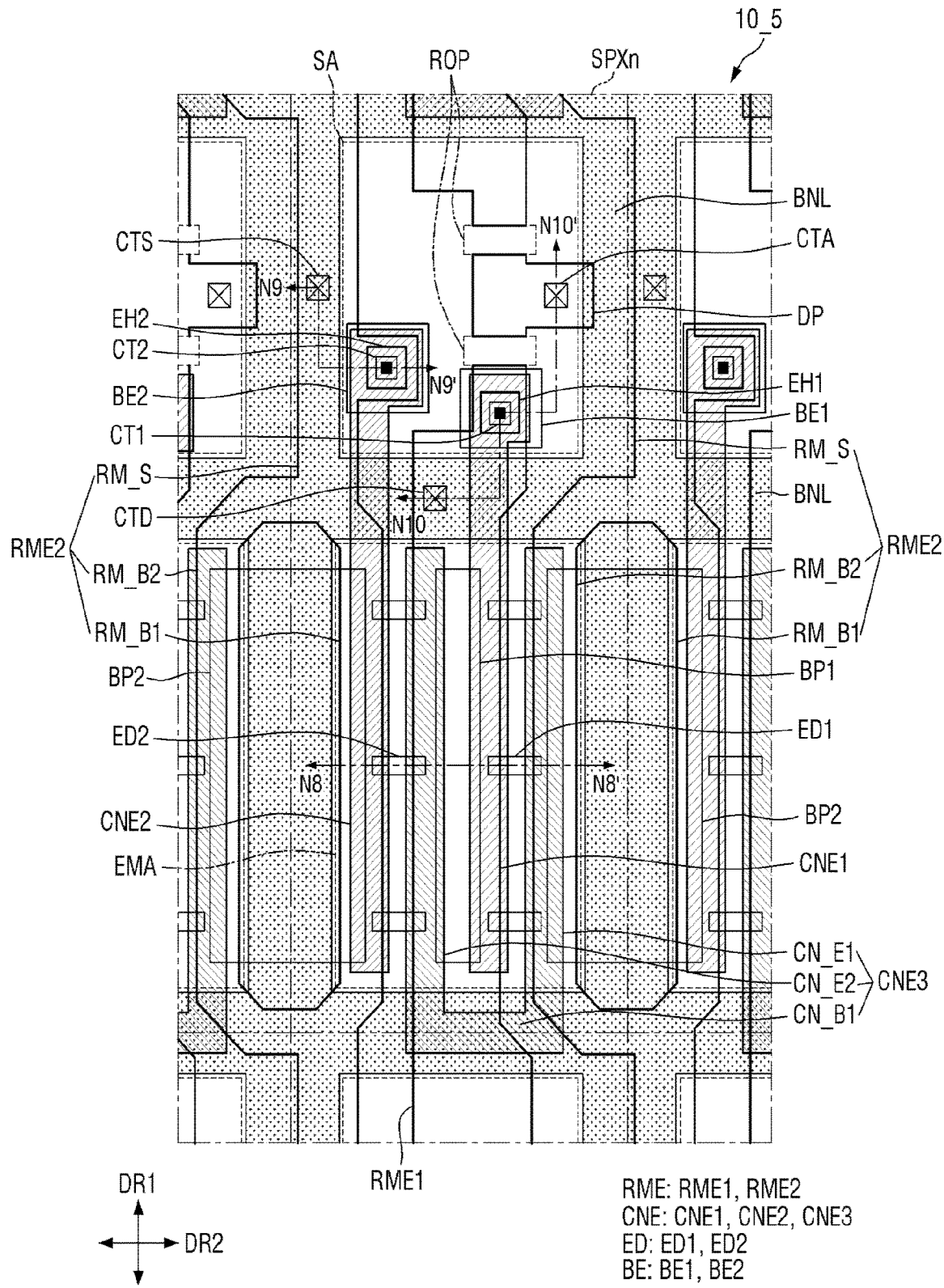
FIG. 34 is a plan view of a subpixel of a display device according to some embodiments.
Figure 35:
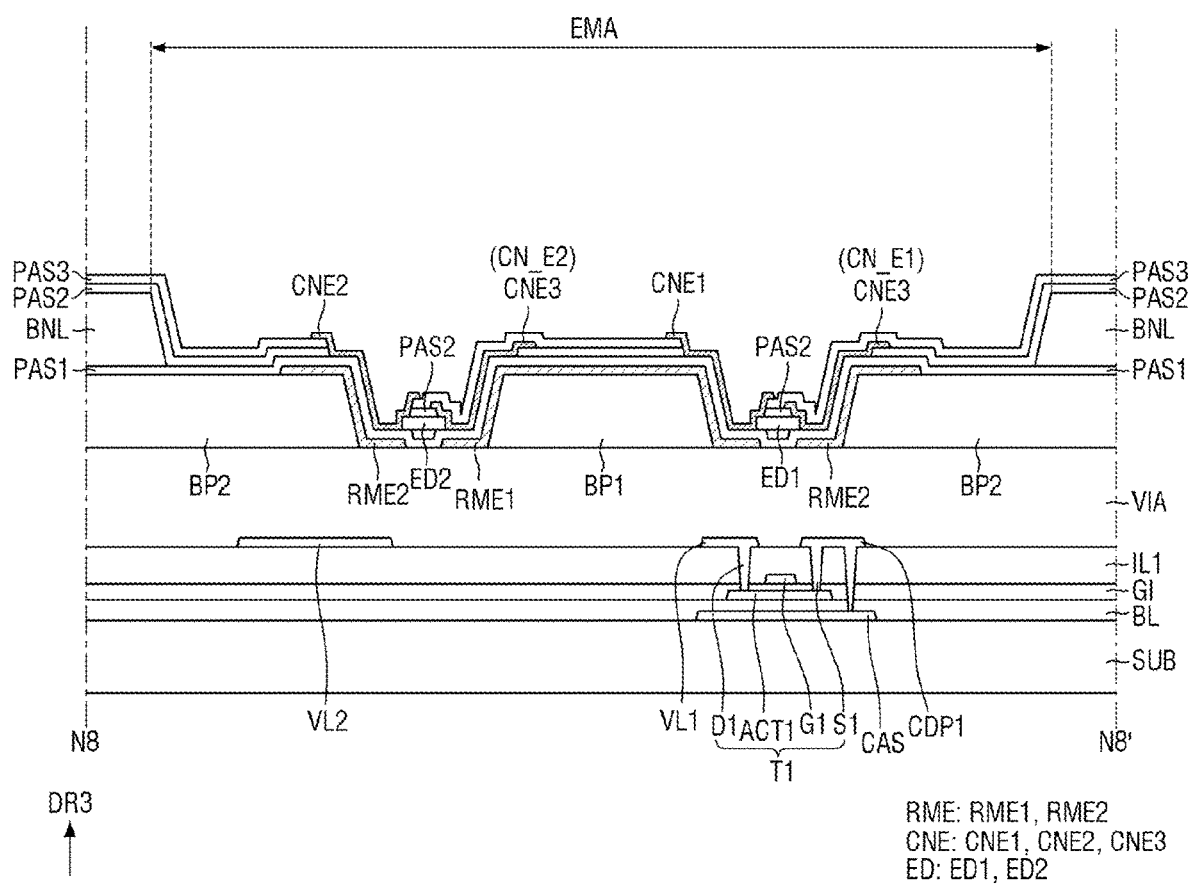
FIG. 35 is a cross-sectional view taken along the line N8-N8' of FIG. 34.
Figure 36:
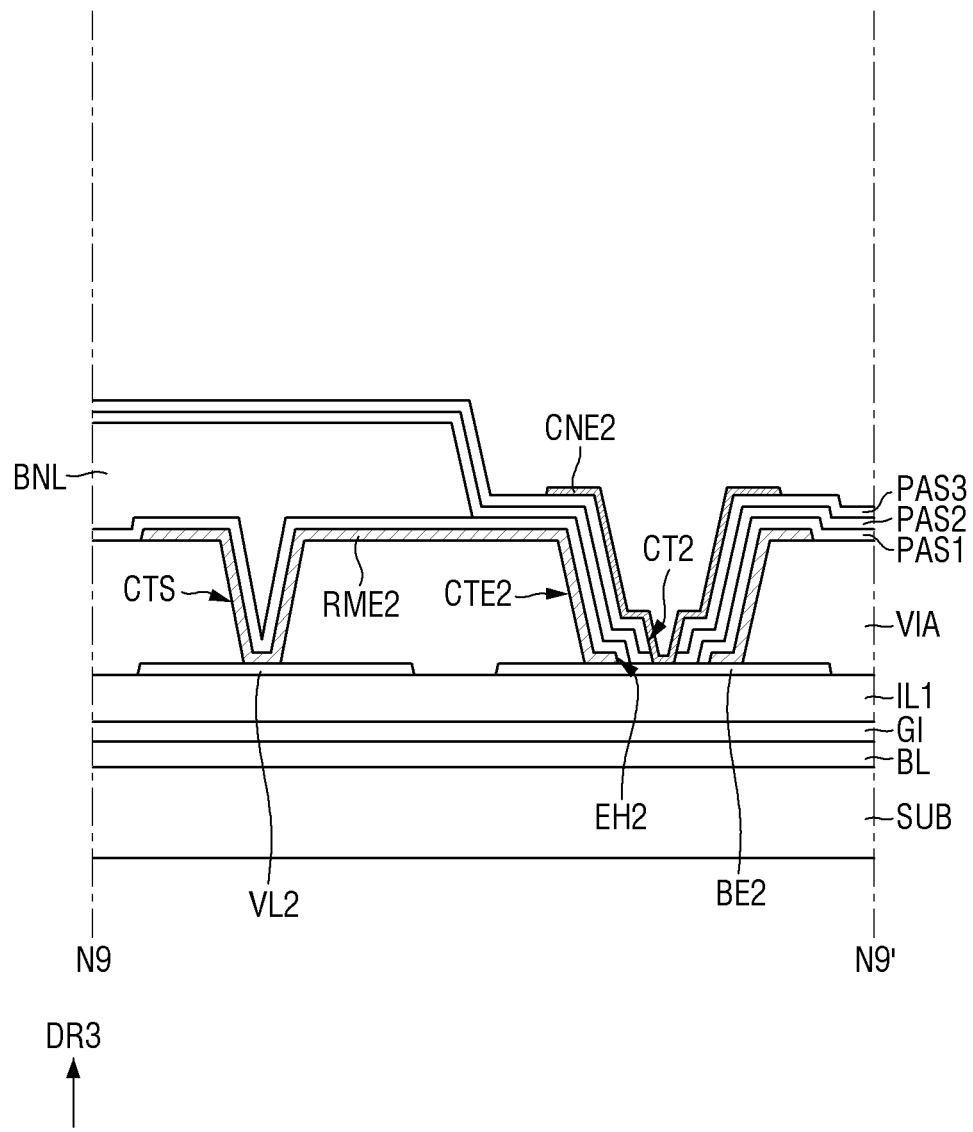
FIG. 36 is a cross-sectional view taken along the line N9-N9' of FIG. 34.
Figure 37:
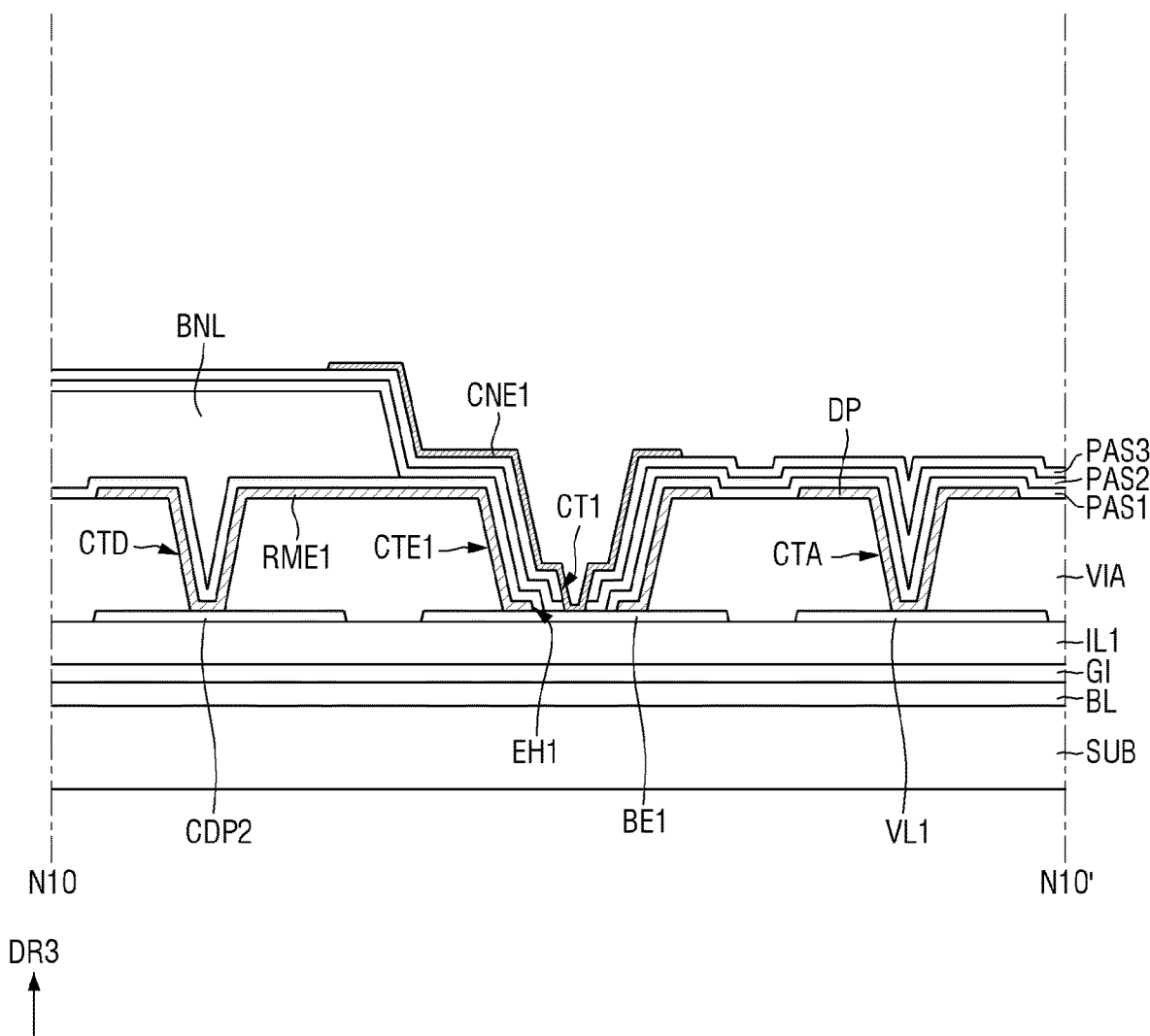
FIG. 37 is a cross-sectional view taken along the line N10-N10' of FIG. 34.

FIG. 34 is a plan view of a subpixel SPXn of a display device 10_5 according to some embodiments. FIG. 35 is a cross-sectional view taken along the line N8-N8' of FIG. 34. FIG. 36 is a cross-sectional view taken along the line N9-N9' of FIG. 34. FIG. 37 is a cross-sectional view taken along the line N10-N10' of FIG. 34.

FIG. 34 illustrates a subpixel SPXn of the display device 10_5 and a part of other subpixels SPXn adjacent to the subpixel SPXn in the second direction DR2. FIG. 35 illustrates a cross section across both ends of a first light emitting element ED1 and a second light emitting element ED2 in a first subpixel SPX1 of FIG. 34. FIGS. 36 and 37 illustrate cross sections across a plurality of contact holes CTD, CTS, and CTA and a plurality of contact parts CT1 and CT2.

Referring to FIGS. 34 through 37, the display device 10_5 according to some embodiments may be different from the above-described embodiments in the structure of electrodes RME, connection electrodes CNE, and bank patterns BP1 and BP2. Any redundant description already provided in the above embodiments will be omitted, and differences will be mainly described below.

Bridge electrodes BE may include a first bridge electrode BE1 and a second bridge electrode BE2. The first bridge electrode BE1 may be located on a lower side in a sub-area SA to overlap a first electrode RME1, and the second bridge electrode BE2 may be located on a left side in the sub-area SA to overlap a second electrode RME2. The positions of the bridge electrodes BE1 and BE2 may vary according to the arrangement of the electrodes RME and the connection electrodes CNE. In addition, the positions of electrode contact holes CTE1 and CTE2 formed in a via layer VIA may vary according to the arrangement of the bridge electrodes BE. A first electrode contact hole CTE1 may also be located adjacent to the lower side in the sub-area SA, and a second electrode contact hole CTE2 may be located adjacent to the left side in the sub-area SA. Upper surfaces of the bridge electrodes BE may be partially exposed by the electrode contact holes CTE1 and CTE2, respectively, and may directly contact the electrodes RME and the connection electrodes CNE to be described later, respectively.

A plurality of bank patterns BP1 and BP2 may extend in the first direction DR1, but may have different widths measured in the second direction DR2. Any one of the bank patterns BP1 and BP2 may be located over subpixels SPXn neighboring each other in the second direction DR2. For example, the bank patterns BP1 and BP2 may include a first bank pattern BP1 located in an emission area EMA of each subpixel SPXn, and a second bank pattern BP2 located over the emission areas EMA of different subpixels SPXn.

The first bank pattern BP1 is located in the center of the emission area EMA, and the second banks BP2 are spaced apart from each other with the first bank pattern BP1 interposed between them. The first bank pattern BP1 and the second bank pattern BP2 may be alternately located along the second direction DR2. Light emitting elements ED may be located between the first bank pattern BP1 and the second bank pattern BP2 spaced apart from each other.

The first bank pattern BP1 and the second bank pattern BP2 may have the same length in the first direction DR1, but may have different widths measured in the second direction DR2. A part of a bank layer BNL that extends in the first direction DR1 may overlap the second bank pattern BP2 in the thickness direction. The bank patterns BP1 and BP2 may be located in an island-shaped pattern in the entire display area DPA.

A plurality of electrodes RME may include a first electrode RME1 located in the center of each subpixel SPXn, and a second electrode RME2 located over different subpixels SPXn. The first electrode RME1 and the second electrode RME2 may generally extend in the first direction DR1, but parts of the first electrode RME1 and the second electrode RME2 that are located in the emission area EMA may have different shapes.

The first electrode RME1 may be located in the center of each subpixel SPXn, and a part located in the emission area EMA may be located on the first bank pattern BP1. As in embodiments of FIG. 3, the first electrode RME1 may extend from the sub-area SA in the first direction DR1 to the sub-area SA of another sub-pixel SPXn. The width of the first electrode RME1 measured in the second direction DR2 may vary according to position, and a part located on the first bank pattern BP1 at least in the emission area EMA may have a greater width than the first bank pattern BP1. The first electrode RME1 may cover both side surfaces of the first bank pattern BP1.

The second electrode RME2 may include a part extending in the first direction DR1 and parts branching in the vicinity of the emission area EMA. In some embodiments, the second electrode RME2 may include an electrode stem part RM_S extending in the first direction DR1, and a plurality of electrode branch parts RM_B1 and RM_B2 branching from the electrode stem part RM_S, bending in the second direction DR2, and then extending again in the first direction DR1. The electrode stem part RM_S may overlap a part of the bank layer BNL that extends in the first direction DR1, and may be located on a side of the sub-area SA in the second direction DR2. The electrode branch parts RM_B1 and RM_B2 may branch from the electrode stem part RM_S located in a part of the bank layer BNL that extends in the first direction DR1 and in a part of the bank layer BNL that extends in the second direction DR2, and may be bent to respective sides in the second direction DR2. The electrode branch parts RM_B1 and RM_B2 may extend across the emission area EMA in the first direction DR1, and then may be bent again to be integrally connected to the electrode stem part RM_S. That is, the electrode branch parts RM_B1 and RM_B2 of the second electrode RME2 may branch on an upper side of the emission area EMA of any one subpixel SPXn, and then may be connected to each other again on a lower side of the emission area EMA.

The second electrode RME2 may include a first electrode branch part RM_B1 located on a left side of the first electrode RME1 and a second electrode branch part RM_B2 located on a right side of the first electrode RME1. The electrode branch parts RM_B1 and RM_B2 included in one second electrode RME2 may be respectively located in the emission areas EMA of subpixels SPXn neighboring each other in the second direction DR2, and the electrode branch parts RM_B1 and RM_B2 of different second electrodes RME2 may be located in one subpixel SPXn. The first electrode branch part RM_B1 of the second electrode RME2 may be located on, or adjacent to, the left side of the first electrode RME1, and the second electrode branch part RM_B2 of another second electrode RME2 may be located on, or adjacent to, the right side of the first electrode RME1.

Each of the electrode branch parts RM_B1 and RM_B2 of the second electrode RME2 may be located on a side of the second bank pattern BP2. The first electrode branch part RM_B1 may be located on the second bank pattern BP2 located on a left side of the first bank pattern BP1, and the second electrode branch part RM_B2 may be located on the second bank pattern BP2 located on a right side of the first bank pattern BP1. Both sides of the first electrode RME1 may be spaced apart from different electrode branch parts RM_B1 and RM_B2 of different second electrodes RME2 to face them, and a distance between the first electrode RME1 and each of the electrode branch parts RM_B1 and RM_B2 may be less than a distance between the bank patterns BP1 and BP2.

In addition, a width of the first electrode RME1 measured in the second direction DR2 may be greater than widths of the electrode stem part RM_S and the electrode branch parts RM_B1 and RM_B2 of the second electrode RME2. The first electrode RME1 may cover both sides of the first bank pattern BP1, but the second electrode RME2 may have a relatively small width so that each of the electrode branch parts RM_B1 and RM_B2 covers only a side of the second bank pattern BP2.

The first electrode RME1 may contact a second conductive pattern CDP2 of a third conductive layer through a first contact hole CTD in a part overlapping a part of the bank layer BNL that extends in the second direction DR2. The second electrode RME2 may contact a second voltage line VL2 of the third conductive layer through a second contact hole CTS in the electrode stem part RM_S. In addition, a part of the first electrode RME1 that is located in the sub-area SA may overlap the first bridge electrode BE1 and may contact the first bridge electrode BE1 through the first electrode contact hole CTE1. The second electrode RME2 may include a part protruding from the electrode stem part RM_S in the second direction DR2 to lie in the sub-area SA, may overlap the second bridge electrode BE2 in the protruding part, and may contact the second bridge electrode BE2 through the second electrode contact hole CTE2.

The first electrode RME1 among the first electrode RME1 and the second electrode RME2 may be located up to a separation part ROP of the sub-area SA, but the second electrode RME2 may not be separated in the sub-area SA. One second electrode RME2 may include a plurality of electrode stem parts RM_S and a plurality of electrode branch parts RM_B1 and RM_B2 to extend in the first direction DR1 and may branch in the vicinity of the emission area EMA of each subpixel SPXn. The first electrode RME1 may be located between the separation parts ROP located in the sub-areas SA of different subpixels SPXn and may be located across the emission area EMA.

According to some embodiments, the display device 10_5 may include a dummy pattern DP located in the sub-area SA and located between the first electrodes RME1 of different subpixels SPXn. The dummy pattern DP may be spaced apart from the first electrodes RME1 with the separation parts ROP interposed between them in the sub-area SA. Two separation parts ROP may be located in one sub-area SA. The dummy pattern DP may be spaced apart from the first electrode RME1 located in a corresponding subpixel SPXn with a lower separation part ROP interposed between them and may be spaced apart from the first electrode RME1 located in another subpixel SPXn with an upper separation part ROP interposed between them.

In some embodiments, the dummy pattern DP may be connected to a first voltage line VL1 of the third conductive layer through a third contact hole CTA penetrating the via layer VIA. The first electrode RME1 may be formed to be connected to the dummy pattern DP, and an electrical signal transmitted to place the light emitting elements ED may be transmitted from the first voltage line VL1 to the first electrode RME1 through the dummy pattern DP. In a process of placing the light emitting elements ED, a signal may be transmitted to each of the first voltage line VL1 and the second voltage line VL2, and these signals may be transmitted to the first electrode RME1 and RME2, respectively.

A plurality of light emitting elements ED may be located on different electrodes RME between different bank patterns BP1 and BP2. The light emitting elements ED may include first light emitting elements ED1 having respective ends located on the first electrode RME1 and the second electrode branch part RM_B2 of the second electrode RME2, and second light emitting elements ED2 having respective ends located on the first electrode RME1 and the first electrode branch part RM_B1 of another second electrode RME2. The first light emitting elements ED1 may be located on the right side of the first electrode RME1, and the second light emitting elements ED2 may be located on the left side of the first electrode RME1. The first light emitting elements ED1 may be located on the first electrode RME1 and the second electrode RME2, and the second light emitting elements ED2 may be located on the first electrode RME1 and the second electrode RME2.

A plurality of connection electrodes CNE (CNE1 through CNE3) may include a first connection electrode CNE1 and a second connection electrode CNE2, which are first type connection electrodes, and a third connection electrode CNE3, which is a second type connection electrode.

The first connection electrode CNE1 may extend in the first direction DR1 and may be located on the first electrode RME1. A part of the first connection electrode CNE1, which is located on the first bank pattern BP1, may overlap the first electrode RME1, and may extend in the first direction DR1 from this to the sub-area SA located above the emission area EMA beyond the bank layer BNL. The first connection electrode CNE1 may contact the first bridge electrode BE1 through a first contact part CT1 in the sub-area SA. The first contact part CT1 may be formed on the first bridge electrode BE1 in a first electrode hole EH1.

The second connection electrode CNE2 may extend in the first direction DR1 and may be located on the second electrode RME2. A part of the second connection electrode CNE2, which is located on the second bank pattern BP2, may overlap the second electrode RME2, and may extend in the first direction DR1 from this to the sub-area SA located above the emission area EMA beyond the bank layer BNL. The second connection electrode CNE2 may contact the second bridge electrode BE2 through a second contact part CT2 in the sub-area SA. The second contact part CT2 may be formed on the second bridge electrode BE2 in a second electrode hole EH2.

The third connection electrode CNE3 may include extension parts CN_E1 and CN_E2 extending in the first direction DR1, and a first connection part CN_B1 connecting the extension parts CN_E1 and CN_E2. A first extension part CN_E1 faces the first connection electrode CNE1 in the emission area EMA, and is located on the second electrode branch part RM_B2 of the second electrode RME2. The second extension part CN_E2 faces the second connection electrode CNE2 in the emission area EMA and is located on the first electrode RME1. The first connection part CN_B1 may extend in the second direction DR2 on the bank layer BNL located below the emission area EMA to connect the first extension part CN_E1 and the second extension part CN_E2. The third connection electrode CNE3 may be located in the emission area EMA and on the bank layer BNL, and may not be directly connected to the electrodes RME. The second electrode branch part RM_B2 located under the first extension part CN_E1 may be electrically connected to the second voltage line VL2, but a second power supply voltage applied to the second electrode branch part RM_B2 may not be transmitted to the third connection electrode CNE3. The first connection electrode CNE1 and the second connection electrode CNE2 may be first type connection electrodes directly connected to the electrodes RME, and the third connection electrode CNE3 may be a second type connection electrode not directly connected to the electrodes RME.

A display device according to some embodiments includes a bridge electrode located under an electrode. Accordingly, the electrode and a connection electrode may be electrically connected to each other through the bridge electrode. The display device may reduce contact resistance in electrical connection between the electrode and the connection electrode, and may reduce or prevent pixel dark spots that may occur due to the contact resistance when the electrodes contact each other.

In concluding the detailed description, those skilled in the art will appreciate that many variations and modifications can be made to the embodiments without substantially departing from aspects of the present disclosure. Therefore, the disclosed embodiments of the present disclosure are used in a generic and descriptive sense only and not for purposes of limitation.

What is claimed is:

1. A display device comprising:
    a substrate;
    a first bridge electrode and a second bridge electrode on the substrate and spaced apart from each other;
    a first electrode on the first bridge electrode;
    a second electrode on the second bridge electrode and spaced apart from the first electrode;
    a first insulating layer on the first electrode and the second electrode;
    a light emitting element on the first insulating layer, and on the first electrode and the second electrode;
    a first connection electrode on the first electrode, and electrically connected to the light emitting element and the first bridge electrode; and
    a second connection electrode on the second electrode, and electrically connected to the light emitting element and the second bridge electrode,
    wherein the first electrode directly contacts the first bridge electrode, and is separated from the first connection electrode, and
    wherein the second electrode directly contacts the second bridge electrode, and is separated from the second connection electrode.

2. The display device of claim 1, wherein the first electrode defines a first electrode hole exposing an upper surface of the first bridge electrode,
    wherein the second electrode defines a second electrode hole exposing an upper surface of the second bridge electrode, and
    wherein the first insulating layer defines a first opening in the first electrode hole to expose the upper surface of the first bridge electrode, and a second opening in the second electrode hole to expose the upper surface of the second bridge electrode.

3. The display device of claim 2, further comprising a via layer between the substrate and the first and second electrodes.

4. The display device of claim 3, further comprising a voltage line and a conductive pattern on a same layer as the first bridge electrode and the second bridge electrode,
wherein the first bridge electrode and the second bridge electrode are between the via layer and the substrate.

5. The display device of claim 4, wherein the via layer defines a first electrode contact hole exposing the upper surface of the first bridge electrode, and a second electrode contact hole exposing the upper surface of the second bridge electrode,
wherein the first electrode hole is in the first electrode contact hole, and
wherein the second electrode hole is in the second electrode contact hole.

6. The display device of claim 5, wherein the first insulating layer covers a part of the first electrode in the first electrode contact hole, and a part of the second electrode in the second electrode contact hole.

7. The display device of claim 4, wherein the via layer defines a first contact hole exposing an upper surface of the conductive pattern, and a second contact hole exposing an upper surface of the voltage line,
wherein the first electrode directly contacts the conductive pattern through the first contact hole, and
wherein the second electrode directly contacts the voltage line through the second contact hole.

8. The display device of claim 3, wherein the first bridge electrode and the second bridge electrode are directly on the via layer,
wherein the first electrode contacts the first bridge electrode, and
wherein the second electrode contacts the second bridge electrode.

9. The display device of claim 8, further comprising a conductive pattern and a voltage line between the substrate and the via layer,
wherein the first electrode directly contacts the conductive pattern through a first contact hole exposing an upper surface of the conductive pattern, and
wherein the second electrode directly contacts the voltage line through a second contact hole exposing an upper surface of the voltage line.

10. The display device of claim 3, wherein the light emitting element is spaced apart from the first bridge electrode and the second bridge electrode in a plan view.

11. The display device of claim 1, wherein the first electrode and the second electrode comprise a main electrode layer comprising aluminum (Al), and an electrode upper layer on the main electrode layer and comprising aluminum oxide ($AlO_x$).

12. The display device of claim 1, wherein the first connection electrode directly contacts the light emitting element.

13. A display device comprising:
a substrate;
a first bridge electrode and a second bridge electrode on the substrate and spaced apart from each other:
a first electrode on the first bridge electrode;
a second electrode on the second bridge electrode and spaced apart from the first electrode;
a first insulating layer on the first electrode and the second electrode;
a light emitting element on the first insulating layer, and on the first electrode and the second electrode;
a first connection electrode on the first electrode, and contacting the light emitting element and the first bridge electrode;
a second connection electrode on the second electrode, and contacting the light emitting element and the second bridge electrode;
a second insulating layer on the first insulating layer and the light emitting element and exposing both ends of the light emitting element; and
a third insulating layer on the second insulating layer and the second connection electrode,
wherein the first connection electrode is on the third insulating layer,
wherein the first electrode directly contacts the first bridge electrode, and is separated from the first connection electrode,
wherein the second electrode directly contacts the second bridge electrode, and is separated from the second connection electrode,
wherein the first electrode defines a first electrode hole exposing an upper surface of the first bridge electrode,
wherein the second electrode defines a second electrode hole exposing an upper surface of the second bridge electrode, and
wherein the first insulating layer defines a first opening in the first electrode hole to expose the upper surface of the first bridge electrode, and a second opening in the second electrode hole to expose the upper surface of the second bridge electrode.

14. The display device of claim 13, wherein the first connection electrode directly contacts the first bridge electrode exposed through a first contact part within the first opening in a plan view and penetrating the second insulating layer and the third insulating layer, and
wherein the second connection electrode directly contacts the second bridge electrode exposed through a second contact part in the second opening and penetrating the second insulating layer.

15. The display device of claim 13, wherein widths of the first bridge electrode and the second bridge electrode are greater than widths of the first electrode hole and the second electrode hole, respectively.

16. A display device comprising:
an emission area;
a sub-area at a side of the emission area in a first direction;
a first electrode and a second electrode extending in the first direction, spaced apart from each other in a second direction, and in the emission area and the sub-area;
a first bridge electrode in the sub-area and partially overlapping the first electrode;
a second bridge electrode in the sub-area and partially overlapping the second electrode;
a first insulating layer on the first electrode and the second electrode in the emission area and the sub-area;
light emitting elements on the first electrode and the second electrode in the emission area;
a first connection electrode on the first electrode, extending in the first direction, and directly contacting the light emitting elements and the first bridge electrode; and
a second connection electrode on the second electrode, extending in the first direction, and directly contacting the light emitting elements and the second bridge electrode,
wherein the first electrode directly contacts the first bridge electrode and is spaced apart from the first connection electrode, and wherein the second electrode directly contacts the second bridge electrode and is spaced apart from the second connection electrode.

17. The display device of claim 16, wherein the first electrode defines a first electrode hole exposing an upper surface of the first bridge electrode, wherein the second electrode defines a second electrode hole exposing an upper surface of the second bridge electrode, and wherein the first insulating layer defines openings respectively within the first electrode hole and the second electrode hole in a plan view.

18. The display device of claim 17, further comprising:

a second insulating layer on the first insulating layer and the light emitting elements and exposing both ends of each of the light emitting elements; and a third insulating layer on the second insulating layer and the second connection electrode, wherein the second insulating layer and the third insulating layer define a first contact part exposing the upper surface of the first bridge electrode, and wherein the second insulating layer defines a second contact part exposing the upper surface of the second bridge electrode.

19. The display device of claim 18, wherein the first connection electrode contacts the first bridge electrode through the first contact part, and wherein the second connection electrode contacts the second bridge electrode through the second contact part.

20. The display device of claim 18, wherein the first contact part is in the first electrode hole, and wherein the second contact part is in the second electrode hole.

21. The display device of claim 17, further comprising a bank layer surrounding the emission area and the sub-area, wherein a first contact hole is in an area where the first electrode and the bank layer overlap, and wherein a second contact hole is in an area where the second electrode and the bank layer overlap.

* * * * *